(12) United States Patent
Hu et al.

(10) Patent No.: US 12,381,533 B2
(45) Date of Patent: Aug. 5, 2025

(54) BULK ACOUSTIC WAVE RESONATOR AND METHOD FOR MANUFACTURING THE SAME

(71) Applicant: Shenzhen Newsonic Technologies Co., Ltd., Shenzhen (CN)

(72) Inventors: Weiwei Hu, Shenzhen (CN); Jie Zou, Shenzhen (CN); Gongbin Tang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/961,847

(22) Filed: Nov. 27, 2024

(65) Prior Publication Data
US 2025/0096767 A1   Mar. 20, 2025

(30) Foreign Application Priority Data
Nov. 29, 2023   (CN) .......................... 202311604926.7

(51) Int. Cl.
| H03H 9/02 | (2006.01) |
| H03H 3/02 | (2006.01) |
| H03H 9/05 | (2006.01) |
| H03H 9/10 | (2006.01) |
| H03H 9/17 | (2006.01) |

(52) U.S. Cl.
CPC .............. *H03H 9/105* (2013.01); *H03H 3/02* (2013.01); *H03H 9/02102* (2013.01); *H03H 9/02133* (2013.01); *H03H 9/0523* (2013.01); *H03H 9/173* (2013.01); *H03H 2003/021* (2013.01)

(58) Field of Classification Search
CPC ........... H03H 9/02133; H03H 9/02102; H03H 9/105; H03H 9/173
See application file for complete search history.

(56) References Cited

U.S. PATENT DOCUMENTS

| 2015/0349747 | A1* | 12/2015 | Burak | H03H 9/54 333/187 |
| 2016/0353221 | A1* | 12/2016 | Okamura | H04R 31/006 |
| 2018/0062609 | A1* | 3/2018 | Yagami | H03H 9/02015 |
| 2018/0109237 | A1* | 4/2018 | Wasilik | H03H 9/0514 |
| 2018/0309428 | A1* | 10/2018 | Lim | H03H 9/173 |

* cited by examiner

Primary Examiner — Bryan P Gordon
(74) Attorney, Agent, or Firm — Finnegan, Henderson, Farabow, Garrett & Dunner, LLP.

(57) ABSTRACT

A bulk acoustic wave (BAW) resonator includes a piezoelectric layer, a first electrode layer disposed on a first side of the piezoelectric layer and including a first electrode and an additional electrode electrically isolated from each other, a second electrode layer disposed on a second side of the piezoelectric layer and including a second electrode, one or more conductive pads disposed on the second side of the piezoelectric layer and at least including an interconnection pad electrically connected to the second electrode and the additional electrode, a carrier structure disposed on the first side of the piezoelectric layer, a cover structure disposed on the second side of the piezoelectric layer and including a cover bonding layer and a cover substrate. A first cavity is disposed between the carrier structure and the piezoelectric layer. A second cavity is disposed between the cover structure and the piezoelectric layer.

20 Claims, 32 Drawing Sheets

BULK ACOUSTIC WAVE RESONATOR AND METHOD FOR MANUFACTURING THE SAME

CROSS-REFERENCE TO RELATED APPLICATIONS

The application is based upon and claims priority to Chinese patent application No. 202311604926.7, filed on Nov. 29, 2023, the entire contents of which are incorporated herein by reference as part of the present application.

TECHNICAL FIELD

Embodiments of the present disclosure relate to a bulk acoustic wave resonator and a method for manufacturing the same.

BACKGROUND

With the rapid development of mobile communication technology, filters based on resonators are more and more widely used in communication devices such as smart phones and the like. A film bulk acoustic wave resonator (FBAR) generally includes an upper electrode, a piezoelectric layer and a lower electrode; a conductive pad and a cover structure are disposed on a side of the piezoelectric layer and the upper electrode away from the lower electrode; and the cover structure and the piezoelectric layer surround and delimit an upper cavity. For a traditional bulk acoustic wave resonator, in general, the cover structure is bonded with the piezoelectric layer, the conductive pad and other components by using a dry film as a bonding layer; and conductive bumps are disposed at a side where the cover structure is located, and is electrically connected to a corresponding electrode through the conductive pad. However, an adhesion between the bonding layer of the cover structure and part of the components (for example, the conductive pad) bonded to the bonding layer may be poor. For example, in a subsequent process, the dry film may undergo a deformation such as expansion or contraction, and delamination may be occurred between the dry film and the conductive pad that is bonded to the dry film, which may lead to reliability problems of the resonator, such as frequency deviation, bump fracture, or the like.

SUMMARY

At least one embodiment of the present disclosure provides a bulk acoustic wave resonator, including: a piezoelectric layer, having a first side and a second side opposite to each other in a first direction; a first electrode layer, disposed on the first side of the piezoelectric layer and including a first electrode and an additional electrode electrically isolated from each other; a second electrode layer, disposed on the second side of the piezoelectric layer and including a second electrode; one or more conductive pads, disposed on the second side of the piezoelectric layer and at least including an interconnection pad, wherein the interconnection pad is electrically connected to the second electrode and extends through the second electrode and the piezoelectric layer to be electrically connected to the additional electrode; a carrier structure, disposed on a side of the piezoelectric layer and the first electrode layer away from the second electrode layer, wherein a first cavity is disposed between the carrier structure and the piezoelectric layer, and a portion of the first electrode is located in the first cavity; a cover structure, disposed on the second side of the piezoelectric layer and including a cover bonding layer and a cover substrate, wherein the cover bonding layer is disposed between the cover substrate and the piezoelectric layer in the first direction, wherein a second cavity is disposed between the cover structure and the piezoelectric layer, and a portion of the second electrode layer is located in the second cavity; and a first conductive connector and a second conductive connector, disposed on the first side of the piezoelectric layer away from the cover structure, wherein the first conductive connector extends through the carrier structure to be electrically connected to the first electrode, wherein the second conductive connector extends through the carrier structure to be electrically connected to the additional electrode, and further electrically connected to the second electrode through the additional electrode and the interconnection pad.

In the bulk acoustic wave resonator provided by at least one embodiment of the present disclosure, the one or more conductive pads include a bonding pad, and the cover substrate is bonded with the piezoelectric layer by the bonding pad and the cover bonding layer.

In the bulk acoustic wave resonator provided by at least one embodiment of the present disclosure, the cover bonding layer and the one or more conductive pads include a same material.

In the bulk acoustic wave resonator provided by at least one embodiment of the present disclosure, the cover bonding layer and the one or more conductive pads include gold (Au).

In the bulk acoustic wave resonator provided by at least one embodiment of the present disclosure, the cover bonding layer includes organic materials, and the one or more conductive pads include conductive materials.

In the bulk acoustic wave resonator provided by at least one embodiment of the present disclosure, the cover bonding layer includes dry film, and the one or more conductive pads include metal.

In the bulk acoustic wave resonator provided by at least one embodiment of the present disclosure, the cover substrate includes silicon (Si).

In the bulk acoustic wave resonator provided by at least one embodiment of the present disclosure, the carrier structure includes a carrier substrate, a supporting dielectric layer disposed between the carrier substrate and the piezoelectric layer, and a carrier bonding layer disposed between the carrier substrate and the supporting dielectric layer.

In the bulk acoustic wave resonator provided by at least one embodiment of the present disclosure, the first cavity is formed in the supporting dielectric layer.

In the bulk acoustic wave resonator provided by at least one embodiment of the present disclosure, the carrier bonding layer comprises a bonding protrusion protruding towards the piezoelectric layer and surrounding the first cavity, and the bulk acoustic wave resonator further comprises a cavity boundary layer overlying at least the bonding protrusion.

In the bulk acoustic wave resonator provided by at least one embodiment of the present disclosure, the cavity boundary layer overlays the bonding protrusion and a portion of the carrier bonding layer surrounded by the bonding protrusion.

In the bulk acoustic wave resonator provided by at least one embodiment of the present disclosure, the cavity boundary layer overlays the entire carrier bonding layer.

In the bulk acoustic wave resonator provided by at least one embodiment of the present disclosure, the cavity boundary layer contacts at least one of the piezoelectric layer or the first electrode.

In the bulk acoustic wave resonator provided by at least one embodiment of the present disclosure, an edge of the first electrode is located inside the first cavity.

In the bulk acoustic wave resonator provided by at least one embodiment of the present disclosure, the first conductive connector includes a first conductive bump disposed below a bottom surface of the carrier structure, and electrically connected to, the first electrode, and the second conductive connector includes a second conductive bump disposed below the bottom surface of the carrier structure, and electrically connected to, the second electrode.

In the bulk acoustic wave resonator provided by at least one embodiment of the present disclosure, the bulk acoustic wave resonator further includes a first connection via hole extending through the carrier structure, and exposing a portion of the first electrode, and a second connection via hole extending through the carrier structure, and exposing the additional electrode.

In the bulk acoustic wave resonator provided by at least one embodiment of the present disclosure, the first conductive connector includes a first redistribution layer portion disposed below the bottom surface of the carrier structure and within the first connection via hole and contacting the exposed portion of the first electrode, and the first conductive connector includes a second redistribution layer portion disposed below the bottom surface of the carrier structure and within the second connection via hole and contacting the exposed portion of the additional electrode.

In the bulk acoustic wave resonator provided by at least one embodiment of the present disclosure, the first conductive bump is electrically connected to the first redistribution layer portion, and the second conductive bump is electrically connected to the second redistribution layer portion.

In the bulk acoustic wave resonator provided by at least one embodiment of the present disclosure, the piezoelectric layer includes an additional piezoelectric via hole exposing a portion of the additional electrode, and the interconnection pad is disposed in the additional piezoelectric via hole and electrically connecting the second electrode and the additional electrode.

In the bulk acoustic wave resonator provided by at least one embodiment of the present disclosure, the second cavity is surrounded by the cover bonding layer and the bonding pad.

At least one embodiment of the present disclosure provides a method for manufacturing a bulk acoustic wave resonator, including: sequentially forming a second electrode layer, a piezoelectric layer and a first electrode layer, wherein the first electrode layer and the second electrode layer are respectively located on a first side and a second side of the piezoelectric layer opposite to each other in a first direction; performing a patterning process on the first electrode layer to form a first electrode and an additional electrode, and forming a gap between the first electrode and the additional electrode, so that the first electrode and the additional electrode are spaced apart from each other and electrically isolated from each other; forming a carrier structure on a side of the piezoelectric layer and the first electrode layer away from the second electrode layer, with a portion of the carrier structure being filled in the gap, and forming a first cavity between the piezoelectric layer and the carrier structure, with a portion of the first electrode being located in the first cavity; performing a patterning process on the second electrode layer to form a second electrode; forming one or more conductive pads on the second side of the piezoelectric layer, wherein the one or more conductive pads at least include an interconnection pad, the interconnection pad is electrically connected to the second electrode, and extends through the second electrode and the piezoelectric layer to be electrically connected to the additional electrode; bonding a cover structure to the second side of the piezoelectric layer, and forming a second cavity between the cover structure and the piezoelectric layer, wherein the cover structure includes a cover bonding layer and a cover substrate, the cover bonding layer is disposed between the cover substrate and the piezoelectric layer in the first direction, and a portion of the second electrode layer is located in the second cavity; forming a first connection via hole and a second connection via hole extending through the carrier structure; and forming a first conductive connector and a second conductive connector on a side of the piezoelectric layer away from the cover structure, wherein the first conductive connector is electrically connected to the first electrode through the first connection via hole, the second conductive connector is electrically connected to the additional electrode through the second connection via hole, and the further electrically connected to the second electrode through the additional electrode and the interconnection pad.

In the method for manufacturing the bulk acoustic wave resonator provided by at least one embodiment of the present disclosure, the one or more conductive pads include a bonding pad, and the bonding the cover structure to the second side of the piezoelectric layer includes bonding the cover structure to the second side of the piezoelectric layer via the bonding pad and the cover bonding layer.

In the method for manufacturing the bulk acoustic wave resonator provided by at least one embodiment of the present disclosure, the cover bonding layer and the one or more conductive pads include the same material.

In the method for manufacturing the bulk acoustic wave resonator provided by at least one embodiment of the present disclosure, the cover bonding layer and the one or more conductive pads include gold (Au).

In the method for manufacturing the bulk acoustic wave resonator provided by at least one embodiment of the present disclosure, the cover bonding layer includes organic materials, and the one or more conductive pads include conductive materials.

In the method for manufacturing the bulk acoustic wave resonator provided by at least one embodiment of the present disclosure, the cover bonding layer includes dry film, and the one or more conductive pads include metal.

In the method for manufacturing the bulk acoustic wave resonator provided by at least one embodiment of the present disclosure, the cover structure includes silicon (Si).

In the method for manufacturing the bulk acoustic wave resonator provided by at least one embodiment of the present disclosure, the sequentially forming the second electrode layer, the piezoelectric layer, and the first electrode layer includes sequentially forming the second electrode layer, the piezoelectric layer, and the first electrode layer on a temporary substrate. The method further comprises removing the temporary substrate after forming the carrier structure.

In the method for manufacturing the bulk acoustic wave resonator provided by at least one embodiment of the present disclosure, the forming the carrier structure includes: forming a dielectric layer on the side of the piezoelectric layer and the first electrode layer away from the second electrode layer; and bonding a carrier substrate onto the dielectric layer. The method further includes, after performing the patterning process on the second electrode layer to form the second electrode, removing a portion of the dielectric layer to form the first cavity in the dielectric layer.

In the method for manufacturing the bulk acoustic wave resonator provided by at least one embodiment of the present disclosure, the method further includes, before bonding the carrier substrate onto the dielectric layer, forming a trench in the dielectric layer, the trench surrounding the portion of the dielectric layer to be removed; and forming a cavity boundary layer on the dielectric layer.

In the method for manufacturing the bulk acoustic wave resonator provided by at least one embodiment of the present disclosure, the cavity boundary layer overlays the trench and a portion of the dielectric layer surrounded by the trench.

In the method for manufacturing the bulk acoustic wave resonator provided by at least one embodiment of the present disclosure, the cavity boundary layer overlays the entire dielectric layer.

In the method for manufacturing the bulk acoustic wave resonator provided by at least one embodiment of the present disclosure, the cavity boundary layer contacts at least one of the piezoelectric layer or the first electrode.

In the method for manufacturing the bulk acoustic wave resonator provided by at least one embodiment of the present disclosure, after forming the cavity boundary layer, forming a carrier bonding layer on the cavity boundary layer and filling in the trench.

In the method for manufacturing the bulk acoustic wave resonator provided by at least one embodiment of the present disclosure, an edge of the first electrode is located inside the first cavity.

In the method for manufacturing the bulk acoustic wave resonator provided by at least one embodiment of the present disclosure, the first connection via hole extends through the carrier structure and exposes a portion of the first electrode, and the second connection via hole extends through the carrier substrate and exposes a portion of the additional electrode.

In the method for manufacturing the bulk acoustic wave resonator provided by at least one embodiment of the present disclosure, the forming the first conductive connector and the second conductive connector includes forming a redistribution layer on a bottom surface of the carrier structure, and patterning the redistribution layer to form a first redistribution layer portion in the first connection via hole and a second redistribution layer portion in the second connection via hole.

In the method for manufacturing the bulk acoustic wave resonator provided by at least one embodiment of the present disclosure, the method further includes, after patterning the redistribution layer, forming a bottom passivation layer on the redistribution layer, and patterning the bottom passivation layer to expose a portion of the first redistribution layer portion and a portion of second redistribution layer portion.

In the method for manufacturing the bulk acoustic wave resonator provided by at least one embodiment of the present disclosure, the method further includes forming a first conductive bump on the exposed portion of the first redistribution layer portion, and a second conductive bump on the exposed portion of the second redistribution layer portion.

In the method for manufacturing the bulk acoustic wave resonator provided by at least one embodiment of the present disclosure, the method further includes before forming the one or more conductive pads, forming an additional piezoelectric via hole in the piezoelectric layer and exposing a portion of the first electrode. The forming the one or more conductive pads includes forming the interconnection pad in the additional piezoelectric via hole, the portion of the bonding pad electrically connecting the second electrode and the portion of the first electrode exposed by the additional piezoelectric via hole.

BRIEF DESCRIPTION OF DRAWINGS

The accompanying drawings of the present disclosure will be briefly introduced below. The drawings in the following description are only example embodiments of the present disclosure, and do not limit the present disclosure.

DETAILED DESCRIPTION

Figure 1:
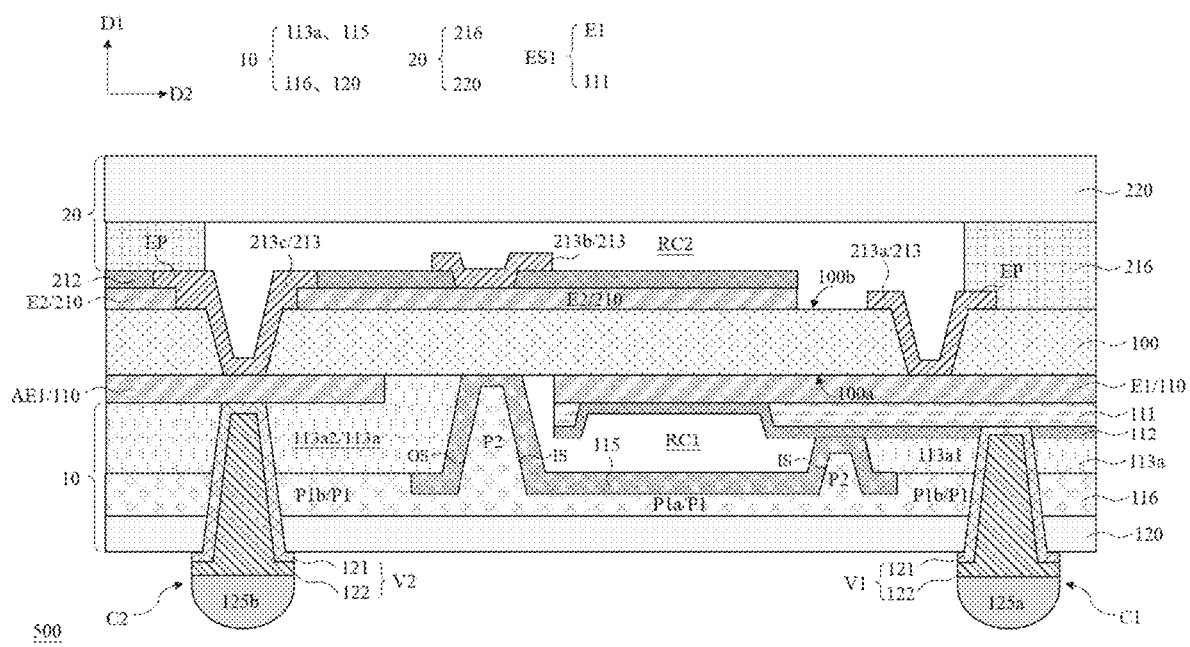
FIG. 1 illustrates a schematic cross-sectional view of a bulk acoustic wave resonator according to some embodiments of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection" "connected", and the like are not limited to physical or mechanical connection but may include electrical connection, either directly or indirectly.

The embodiments of the disclosure provide a bulk acoustic wave resonator and a method for manufacturing the same. The bulk acoustic wave resonator includes a piezoelectric layer, a first electrode layer, a second electrode layer, one or more conductive pads, a carrier structure, a cover structure, a first conductive connector and a second conductive connector. The piezoelectric layer has a first side and a second side opposite to each other in a first direction; the first electrode layer is disposed on the first side of the piezoelectric layer and includes a first electrode and an additional electrode which are electrically isolated from each other; the second electrode layer is disposed on the second side of the piezoelectric layer and includes a second electrode; the one or more conductive pads are disposed on the second side of the piezoelectric layer and at least include an interconnection pad, the interconnection pad is electrically connected to the second electrode and extends through the second electrode and the piezoelectric layer so as to be electrically connected to the additional electrode; the carrier structure is disposed on a side of the piezoelectric layer and the first electrode layer away from the second electrode layer, wherein a first cavity is disposed between the carrier structure and the piezoelectric layer, and a portion of the first electrode is located in the first cavity; the cover structure is disposed on the second side of the piezoelectric layer and includes a cover bonding layer and a cover substrate, wherein the cover bonding layer is disposed between the cover substrate and the piezoelectric layer in the first direction, wherein a second cavity is disposed between the cover structure and the piezoelectric layer, and a portion of the second electrode layer is located in the second cavity; the first conductive connector and the second conductive connector are disposed on the first side of the piezoelectric layer away from the cover structure and the one or more conductive pads, the first conductive connector extends through the carrier structure to be electrically connected to the first electrode, the second conductive connector extends through the carrier structure to be electrically connected to the additional electrode, and the second conductive connector is electrically connected to the second electrode through the additional electrode and the interconnection pad.

In the bulk acoustic wave resonator and the method for manufacturing the same provided by the embodiments of the present disclosure, at least the following technical effects are achieved: through disposing the first conductive connector and the second conductive connector on the first side of the piezoelectric layer away from the cover structure, and through disposing the additional electrode and the interconnection pad to realize the electrical connection between the second conductive connector and the second electrode located on the second side of the piezoelectric layer, adverse influences on the conductive connectors due to possible problems such as deformation and delamination of the cover bonding layer can be minimized, and an effective electrical connection between the conductive connector and the electrode can be ensured, thereby improving the reliability of the device.

For example, in some traditional bulk acoustic wave resonators, the conductive connector and the cover structure are disposed on the same side of the piezoelectric layer, and the conductive connector is electrically connected to the conductive pad through a via hole located in the cover bonding layer and the cover substrate, and further electrically connected to the corresponding electrode through the conductive pad. In these bulk acoustic wave resonators, a portion of the conductive connector is embedded in the cover bonding layer, thus if the cover bonding layer undergoes a deformation such as expansion or contraction, and if problems such as delamination are occurred between the cover bonding layer and the conductive pad, it will further adversely affect the conductive connector embedded in the cover bonding layer, for example, it may result in problems such as frequency deviation and fracture of the conductive connector, which may affect the electrical connection between the conductive connector and the conductive pad, thereby reducing the reliability of the device. Compared with the traditional bulk acoustic wave resonators, in the bulk acoustic wave resonator provided by the embodiments of the present disclosure, the conductive connectors and the cover structure are disposed on different sides of the piezoelectric layer, so that the conductive connectors are not in direct contact with the cover bonding layer. Therefore, even if issues such as deformation and delamination are occurred to the cover bonding layer, the conductive connectors will substantially not be adversely affected, and effective electrical connection between the conductive connectors and the corresponding electrodes can be ensured, and the reliability of the device is improved.

FIG. 1 illustrates a schematic cross-sectional view of a bulk acoustic wave resonator according to some embodiments of the present disclosure.

Referring to FIG. 1, in some embodiments, a bulk acoustic wave resonator 500 includes a piezoelectric layer 100, a first electrode layer 110, a second electrode layer 210, one or more conductive pads 213, a carrier structure 10, a cover structure 20, a first conductive connector C1 and a second conductive connector C2. The piezoelectric layer 100 has a first side 100a and a second side 100b opposite to each other in a first direction D1. The first electrode layer 110 and the carrier structure 10 are disposed on the first side 100a of the piezoelectric layer 100; the second electrode layer 210, the one or more conductive pads 213 and the cover structure 20 are disposed on the second side 100b of the piezoelectric layer 100. The first conductive connector C1 and the second conductive connector C2 are located on the first side 100a of the piezoelectric layer 100 and away from the cover structure 20.

In some embodiments, the first electrode layer 110 includes a first electrode E1 and an additional electrode AE1, and the first electrode E1 and the additional electrode AE1 are electrically isolated from each other. For example, a portion of the carrier structure 10 may be located between the first electrode E1 and the additional electrode AE1 in a direction parallel to a main surface of the piezoelectric layer (for example, a horizontal direction including the second direction D2), and the first electrode E1 and the additional electrode AE1 are spaced apart and electrically isolated from each other by this portion of the carrier structure 10. The second electrode layer 210 may at least include a second electrode E2, and the second electrode E2 is electrically connected to the additional electrode AE1 located in the first electrode layer 110. In some embodiments, the first conductive connector C1 extends through the carrier structure 10 to be electrically connected to the first electrode E1. The second conductive connector C2 extends through the carrier structure 10 to be electrically connected to the additional electrode AE1.

In some embodiments, the carrier structure 10 is located on a side of the piezoelectric layer 100 and the first electrode layer 110 away from the second electrode layer 210, and covers a sidewall of the additional electrode AE1 and a surface of the additional electrode AE1 at a side away from the piezoelectric layer 100, and covers a portion of a surface of a first electrode structure including the first electrode E1 at a side away from the piezoelectric layer. A first cavity RC1 is disposed between the carrier structure 10 and the piezoelectric layer 100, and at least a portion of the first electrode E1 is located in the first cavity RC1; for example, the first electrode E1 is located in the first cavity RC1 and extends beyond an edge of the first cavity RC1; the first electrode E1 may have a sidewall exposed in the first cavity RC1.

In some embodiments, the cover structure 20 includes a cover bonding layer 216 and a cover substrate 220; the cover bonding layer 216 is disposed between the cover substrate 220 and the piezoelectric layer 100 in a first direction D1, and the cover bonding layer 216 is bonded to a portion of the surface of the piezoelectric layer 100 and portion(s) of surfaces of the one or more conductive pads 213. A second cavity RC2 is disposed between the cover structure 20 and the piezoelectric layer 100, and at least a portion of the second electrode layer 210 (for example, at least a portion of the second electrode E2) may be located in the second cavity RC2. For example, the second electrode layer 210 has a portion located in the second cavity RC2, and laterally extends beyond an edge of the second cavity in a direction parallel to the main surface of the piezoelectric layer. In some embodiments, the piezoelectric layer 100, the first electrode E1, the second electrode E2, the first cavity RC1 and the second cavity RC2 at least partially overlap each other in a direction perpendicular to the main surface of the piezoelectric layer 100. Herein, multiple components overlapping/being overlapped in a certain direction represents that orthographic projections of the multiple components on a reference plane perpendicular to the certain direction are overlapped with each other. In other words, orthographic projections of the piezoelectric layer 100, the first electrode E1, the second electrode E2, the first cavity RC1 and the second cavity RC2 on the main surface of the piezoelectric layer are at least partially overlapped with each other. The main surface of the piezoelectric layer refers to a surface thereof which is in contact with the first electrode or the second electrode.

In some embodiments, the one or more conductive pads are located on the second side of the piezoelectric layer 100, and may extend through the piezoelectric layer 100 so as to be electrically connected to the corresponding electrode(s) in the first electrode layer 110. For example, the one or more conductive pads may at least include an interconnection pad 213c; the interconnection pad 213c is electrically connected to the second electrode E2, and extends through the second electrode E2 and the piezoelectric layer 100 so as to be electrically connected to the additional electrode AE1. The one or more conductive pads include a metallic material, such as gold (Au). For example, the second electrode E2 may be provided with an electrode via hole, and the piezoelectric layer 100 may be provided with an additional piezoelectric via hole, and the electrode via hole and the additional piezoelectric via hole are in spatial communication with each other, so as to expose a portion of the surface of the additional electrode AE1 at a side close to the piezoelectric layer. The interconnection pad 213c is in contact with and electrically connected to the second electrode E2, and is electrically connected to the additional electrode AE1 through the electrode via hole in the second electrode E2 and the additional piezoelectric via hole in the piezoelectric layer 100, and further electrically connected to the second conductive connector C2 through the additional electrode AE1. That is to say, the second conductive connector C2 is electrically connected to the second electrode E2 through the additional electrode AE1 and the interconnection pad 213c.

In some embodiments, a passivation layer 212 is further disposed on a side of the second electrode layer 210 away from the piezoelectric layer 100, and the passivation layer 212 is provided with a passivation opening to expose a portion of the surface of the second electrode E2; the passivation opening may be in spatial communication with the electrode via hole in the second electrode E2 and with the additional piezoelectric via hole. The interconnection pad 213c may be disposed on a side of the second electrode E2 away from the piezoelectric layer, and pass through the passivation opening, the electrode via hole and the additional piezoelectric via hole so as to be electrically connected to the additional electrode AE1. A sidewall of a part of the second electrode E2 defining the electrode via hole and a surface of the part of the second electrode E2 at a side away from the piezoelectric layer 100 may be covered by and in contact with the interconnection pad 213c. In some examples, a portion of the interconnection pad 213c located on a side of the second electrode E2 away from the piezoelectric layer may be located in the passivation opening; and a surface of the interconnection pad 213c at a side away from the piezoelectric layer may be substantially level with a surface of the passivation layer 212 at a side away from the piezoelectric layer in a direction (e.g., the second direction D2) parallel to the main surface of the piezoelectric layer, but the present disclosure is not limited thereto. In some other examples, the interconnection pad 213c may further extend to cover a portion of the surface of the passivation layer 212 at the side away from the piezoelectric layer; that is to say, with respect to the same main surface of the piezoelectric layer, the surface of the interconnection pad 213c at the side away from the piezoelectric layer may be higher than the surface of the passivation layer 212 at the side away from the piezoelectric layer. Herein, the first direction D1 and the second direction D2 intersect with each other, such as are perpendicular to each other; for example, in the illustrated example, the first direction D1 is a vertical direction, and the second direction D2 is a horizontal direction.

In some embodiments, the one or more conductive pads may further include a first conductive pad 213a electrically connected to the first electrode E1 and a second conductive pad 213b electrically connected to the second electrode E2. The piezoelectric layer 100 may be further provided with a piezoelectric via hole which exposes a portion of the surface of the first electrode E1; the first conductive pad 213a is disposed on the second side of the piezoelectric layer, and may be electrically connected to the first electrode E1 through the piezoelectric via hole. The second conductive pad 213b may be disposed on a side of the second electrode E2 and the passivation layer 212 away from the piezoelectric layer, and may extend to pass through the passivation layer 212 so as to be electrically connected to the second electrode E2. The first conductive pad 213a and the second conductive pad 213b may be used as test pads, for example, to test the related performances of the resonator during the manufacturing process of the resonator.

In some embodiments, the cover bonding layer 216 may be in contact with part of the one or more conductive pads, and the part of conductive pads has an embedded portion EP covered by the cover bonding layer 216; a contact area between the embedded portion EP and the cover bonding layer 216 may be greater than or equal to an area of a surface of the embedded portion EP at a side away from the piezoelectric layer 100. For example, the cover bonding layer 216 may be in contact with a portion of the surface of the first conductive pad 213a and a portion of the surface of the interconnection pad 213c, and each of the first conductive pad 213a and the interconnection pad 213c has an embedded portion EP covered by the cover bonding layer 216. In some embodiments, the cover bonding layer 216 is not provided with any via hole for electrical connection between other conductive components and the conductive pads; that is, there is free of conductive component embedded in the cover bonding layer 216 and electrically connected to the conductive pad. That is to say, a conductive component electrically connected with the conductive pad may not be disposed on a side of the embedded portion EP of the conductive pad away from the piezoelectric layer 100, and at least a surface of the embedded portion EP of the conductive pad at a side away from the piezoelectric layer is completely covered by the cover bonding layer 216; a sidewall of the embedded portion EP of part of the conductive pads (for example, the first conductive pad 213a) may also be covered by the cover bonding layer, and a sidewall of the embedded portion EP of part of the conductive pads (for example, the interconnection pad 213c) may be covered by the passivation layer 212. Therefore, a contact area between the embedded portion EP of the first conductive pad 213a and the cover bonding layer 216 is substantially equal to a sum of a surface area of a sidewall of the embedded portion EP and an area of a surface of the embedded portion EP at a side away from the piezoelectric layer; a contact area between the embedded portion EP of the interconnection pad 213c and the cover bonding layer 216 may be substantially equal to an area of the surface of the embedded portion EP at the side away from the piezoelectric layer.

In the embodiment of the present disclosure, because the first conductive connector and the second conductive connector are disposed on a side of the piezoelectric layer away from the cover structure, instead of being disposed at a side where the cover structure is located, a conductive component electrically connected with the embedded portion of the conductive pad may not be disposed in the cover bonding layer. In this way, on the one hand, the stability of the conductive connector can be improved, and the effective electrical connection between the conductive connector and conductive component such as the electrode can be ensured, thereby improving the reliability of the device; and on the other hand, the contact area between the cover bonding layer and the conductive pad bonded thereto can be increased, thereby avoiding or reducing the possibility of delamination between the cover bonding layer and the conductive pad caused by a deformation of the cover bonding layer, and further improving the reliability of the device to a certain extent.

In some embodiments, the bulk acoustic wave resonator 500 may further include an edge protruding layer 111, which is disposed on a side of the first electrode E1 away from the piezoelectric layer 100, and may cover a surface of an edge region of a portion of the first electrode E1 located in the first cavity RC1 at a side away from the piezoelectric layer and a surface of a portion of the first electrode E1 located outside the first cavity RC1 at the side away from the piezoelectric layer. A surface of a central region of the portion of the first electrode E1 located in the first cavity RC1 at the side away from the piezoelectric layer is not covered by the edge protruding layer 111. The edge protruding layer 111 includes a conductive material, and is electrically connected to the first electrode E1. In some embodiments, the first electrode E1 and the edge protruding layer 111 together constitute the first electrode structure ES1; and in some other examples, the edge protruding layer 111 may also be omitted, that is, the first electrode structure ES1 may only include the first electrode E1. In some embodiments, a passivation layer 112 is further provided on a side of the first electrode E1 and the edge protruding layer 111 away from the piezoelectric layer 100. The passivation layer 112 may cover a sidewall of the edge protruding layer 111 and a surface of the edge protruding layer 111 at a side away from the piezoelectric layer, and cover a portion of the surface of the first electrode E1 at a side away from the piezoelectric layer. In some embodiments, the edge protruding layer 111 and the passivation layer 112 are only disposed on the first electrode E1 of the first electrode layer 110, and are not disposed on the additional electrode AE1. That is, the additional electrode AE1 is spaced apart from the edge protruding layer 111 and the passivation layer 112.

In some embodiments, the first conductive connector C1 extends to pass through the carrier structure 10 and the passivation layer 112 and is electrically connected to the edge protruding layer 111, and further electrically connected to the first electrode E1 through the edge protruding layer 111. The second conductive connector C2 extends to pass through the carrier structure 10, and is directly and electrically connected to the additional electrode AE1. In some embodiments, the first conductive connector C1 includes a first conductive via V1 and a first conductive bump 125a connected with each other; the second conductive connector C2 includes a second conductive via V2 and a second conductive bump 125b connected with each other. At least a portion of the first conductive via V1 and at least a portion of the second conductive via V2 are embedded in the carrier structure 10, and the first conductive bump 125a is electrically connected to the first electrode E1 through the first conductive via V1, and the second conductive bump 125b is electrically connected to the additional electrode AE1 through the second conductive via V2.

In some embodiments, each conductive via of the first conductive via V1 and the second conductive via V2 includes a seed layer 121 and a conductive layer 122, and the conductive layer 122 is located on a side of the seed layer 121 away from the carrier structure 10 and the first electrode layer 110. For example, in the first conductive via V1, the seed layer 121 is located between the conductive layer 122 and the carrier structure 10, and between the conductive layer 122 and the first electrode structure; in the second conductive via V2, the seed layer 121 is located between the conductive layer 122 and the carrier structure 10, and between the conductive layer 122 and the additional electrode AE1.

Still referring to FIG. 1, in some embodiments, a portion of the carrier structure 10 is located between the first electrode E1 and the additional electrode AE1 in a direction (e.g., a horizontal direction including the second direction D2) parallel with the main surface of the piezoelectric layer, and the additional electrode AE1 is located on a side of this portion of the carrier structure 10 away from the first cavity RC1 in this direction; and the additional electrode AE1 is spaced apart from the first cavity RC1 by this portion of the carrier structure 10. This portion of the carrier structure 10 may be referred to as a spacer portion. In some embodiments, a portion of the first cavity RC1 may be located between the spacer portion of the carrier structure 10 and the first electrode E1 in a direction parallel to the main surface of the piezoelectric layer. That is to say, a portion of the carrier structure 10 and a portion of the first cavity RC1 may be located between the first electrode E1 and the additional electrode AE1.

In some embodiments, the additional electrode AE1 is spaced apart from the first cavity RC1 by the carrier structure 10, which represents that the additional electrode AE1 is not located in the first cavity RC1 and has no surface exposed to the first cavity RC1.

In some embodiments, the carrier structure 10 may include a supporting dielectric layer 113a, a cavity boundary layer 115, a carrier bonding layer 116 and a carrier substrate 120. For example, the supporting dielectric layer 113a is disposed on a side of the first electrode layer 110 and the first electrode structure ES1 away from the piezoelectric layer 100, and a portion of the supporting dielectric layer 113a is located between the first electrode E1 and the additional electrode AE1 in the direction (e.g., the second direction D2) parallel to the main surface of the piezoelectric layer. The carrier bonding layer 116 is located on a side of the supporting dielectric layer 113a away from the piezoelectric layer 100. The cavity boundary layer 115 is located between the supporting dielectric layer 113a and the carrier bonding layer 116, and is located on sides of the supporting dielectric layer 113a and the carrier bonding layer 116 close to the first cavity RC1; the cavity boundary layer 115 defines a portion of a boundary of the first cavity RC1. The carrier substrate 120 is located on a side of the carrier bonding layer 116 away from the piezoelectric layer 100.

For example, the supporting dielectric layer 113a may cover a sidewall of the additional electrode AE1 and a surface of the additional electrode AE1 at a side away from the piezoelectric layer, and may cover a surface of the passivation layer 112 at a side away from the piezoelectric layer. The supporting dielectric layer 113a is located at an outer side of the cavity boundary layer 115 away from the first cavity RC1 in the direction parallel to the main surface of the piezoelectric layer. For example, the supporting dielectric layer 113a may include a first dielectric part 113a1 and a second dielectric part 113a2. The first dielectric part 113a1 covers a portion of the surface of the passivation layer 112 at a side away from the piezoelectric layer, and an orthographic projection of the first dielectric part 113a1 on the main surface of the piezoelectric layer 100 overlaps with an orthographic projection of the first electrode E1 on the main surface of the piezoelectric layer. The second dielectric part 113a2 is located on a side of the additional electrode AE1 away from the piezoelectric layer, covers and contacts a surface of the additional electrode AE1 at a side away from the piezoelectric layer; and the second dielectric part 113a2 may further extend to be between the additional electrode AE1 and the cavity boundary layer 115, so as to cover and contact a sidewall of the additional electrode AE1 and a portion of a surface of the piezoelectric layer 100 at a side away from the second electrode layer. In some embodiments, an orthographic projection of the additional electrode AE1 on the main surface of the piezoelectric layer may be located within a range of an orthographic projection of the second dielectric part 113a2 on the main surface of the piezoelectric layer. In some embodiments, because the first electrode E1 is provided with the edge protruding layer 111 and/or the passivation layer 112 thereon, while the additional electrode AE1 is not provided with the edge protruding layer 111 and/or the passivation layer 112 thereon, a thickness of the second dielectric part 113a2 overlapped with the additional electrode AE1 in the first direction D1 may be greater than a thickness of the first dielectric part 113a1 overlapped with the first electrode E1 in the first direction D1. Herein, the thickness of the dielectric part refers to a thickness thereof in the first direction D1 perpendicular to the main surface of the piezoelectric layer. A portion of the passivation layer 112 is located between the first electrode (or the first electrode structure including the first electrode) and the first dielectric part 113a1, and separates the first electrode E1 from the first dielectric part 113a1. Since there is no passivation layer disposed on the side of the additional electrode AE1 away from the piezoelectric layer, the additional electrode AE1 can be in direct contact with the second dielectric part 113a2.

In some embodiments, the carrier structure 10 is provided with a first connection via hole and a second connection via hole, and the first conductive connector C1 is electrically connected to the first electrode E1 through the first connection via hole, and the second conductive connector C2 is electrically connected to the additional electrode AE1 through the second connection via hole. For example, the passivation layer 112 is provided with a passivation opening in spatial communication with the first connection via hole, so that the first connection via hole and the passivation opening expose a portion of the surface of the first electrode structure ES1, and hence the first conductive connector C1 can pass through the first connection via hole and the passivation opening to be electrically connected to the first electrode structure. For example, the second connection via hole may expose a portion of the surface of the additional electrode AE1, and the second conductive connector C2 may pass through the second connection via hole to be electrically connected to the additional electrode AE1.

In some embodiments, the first connection via hole and the second connection via hole may be at least located in the supporting dielectric layer 113a, the carrier bonding layer 116 and the carrier substrate 120. For example, a portion of the supporting dielectric layer 113a is spaced apart from a portion of the carrier bonding layer 116 by the cavity boundary layer 115; and the supporting dielectric layer 113a and the carrier bonding layer 116 have portions which are in contact with each other. For example, the first connection via hole and the second connection via hole are disposed in the carrier substrate and in the portions of the supporting dielectric layer 113a and the carrier bonding layer 116 that are in contact with each other. In this example, the first connection via hole and the second connection via hole are spaced apart from the cavity boundary layer 115. For example, an orthographic projection of the first conductive connector C1 and an orthographic projection of the second conductive component C2 on the main surface of the piezoelectric layer may be offset from an orthographic projection of the cavity boundary layer 115 on the main surface of the piezoelectric layer. However, the present disclosure is not limited thereto. In an alternative embodiment, the supporting dielectric layer 113a may be completely spaced apart from the carrier bonding layer 116 by the cavity boundary layer 115; and the first connection via hole and the second connection via hole may be located in the supporting dielectric layer 113a, the cavity boundary layer 115, the carrier bonding layer 116 and the carrier substrate 120.

Still referring to FIG. 1, in some embodiments, the carrier bonding layer 116 includes a bonding body P1 and a bonding protrusion P2. The bonding body P1 is located on a side of the supporting dielectric layer 113a away from the piezoelectric layer 100 in the first direction D1 perpendicular to the main surface of the piezoelectric layer, and may extend in a direction parallel to the main surface of the piezoelectric layer. The bonding protrusion P2 is located on a side of the bonding body P1 close to the piezoelectric layer 100 and is protruded, in the first direction D1, from a surface of the bonding body P1 at a side close to the piezoelectric layer 100 towards the piezoelectric layer 100. In some embodiments, the first cavity RC1 is located between the piezoelectric layer 100 and the bonding body P1 in the first direction D1, and is surrounded by the bonding protrusion P2 in the direction parallel to the main surface of the piezoelectric layer (e.g., a horizontal direction including the second direction D2).

For example, the bonding body P1 may include a first body part P1a and a second body part P1b. An orthographic projection of the first body part P1a on the piezoelectric layer 100 is overlapped with an orthographic projection of the first cavity RC1 on the piezoelectric layer 100, and is overlapped with an orthographic projection of the bonding protrusion P2 on the piezoelectric layer 100. The orthographic projection of the first cavity RC1 on the piezoelectric layer 100 may be located within a range of the orthographic projection of the first body part P1a on the piezoelectric layer 100. A portion of the first body part P1a is located between inner sidewalls of the bonding protrusion P2 at a side close to the first cavity RC1 in the direction parallel to the main surface of the piezoelectric layer. The second body part P1b is located on a side of the bonding protrusion P2 away from the first cavity RC1 in the direction parallel to the main surface of the piezoelectric layer, and is located on a side of the first body part P1a close to an edge of the resonator; the second body part P1b may surround the first body part P1a.

Still referring to FIG. 1, in some embodiments, the cavity boundary layer 115 may at least cover surfaces of the bonding protrusion P2 and the first body part P1a of the bonding body at a side close to piezoelectric layer, and the bonding protrusion P2 is spaced apart from the supporting dielectric layer 113a by the cavity boundary layer 115. For example, the cavity boundary layer 115 may extend along sidewalls of the bonding protrusion P2 and a surface of the bonding protrusion P2 at a side close to piezoelectric layer, as well as a surface of the first body part P1a of the bonding body P1 at a side close to piezoelectric layer. A first part of the cavity boundary layer 115 covers a sidewall IS of the bonding protrusion P2 at a side close to first cavity RC1, and a surface of the first body part P1a between the bonding protrusion P2 at a side close to piezoelectric layer; and the first part of the cavity boundary layer 115 and a portion of the surface of the piezoelectric layer 100 together define the first cavity RC1. A second part of the cavity boundary layer 115 is located on a side of the bonding protrusion P2 away from the carrier substrate 120, and is located between the bonding protrusion P2 and the piezoelectric layer 100 and/or between the bonding protrusion P2 and the passivation layer 112. A third part of the cavity boundary layer 115 is located between a sidewall OS of the bonding protrusion P2 at a side away from the first cavity RC1 and a sidewall of the supporting dielectric layer 113a, so that the supporting dielectric layer 113a is spaced apart from the bonding protrusion P2 by the cavity boundary layer 115 in the direction parallel to the main surface of the piezoelectric layer. In some embodiments, the cavity boundary layer 115 may further include a portion located between at least a portion of the bonding body P1 and the supporting dielectric layer 113a in the first direction D1, so that the at least portion of the bonding body P1 is spaced apart from the supporting dielectric layer 113a by the cavity boundary layer 115 in the first direction D1.

In some embodiments, the supporting dielectric layer 113a may be in direct contact with at least a portion of the second body part P1b of the bonding body P1, that is, the cavity boundary layer 115 may not be disposed between the supporting dielectric layer 113a and the at least portion of the second body part P1b.

In other words, the supporting dielectric layer 113a is located on a side of the bonding body P1 of the carrier bonding layer 116 close to piezoelectric layer 100 in the first direction D1 perpendicular to the main surface of the piezoelectric layer, and is located on a side of the bonding protrusion P2 and a portion of the cavity boundary layer 115 covering the bonding protrusion away from the first cavity RC1 in the direction parallel to the main surface of the piezoelectric layer. In some embodiments, the bonding protrusion P2 and the portion of the cavity boundary layer 115 covering the bonding protrusion P2 surround the first cavity RC1 in the direction parallel to the main surface of the piezoelectric layer, and may be surrounded by the supporting dielectric layer 113a.

Still referring to FIG. 1, in some embodiments, the second cavity RC2 may be surrounded and delimited by the cover bonding layer 216, the cover substrate 220, the piezoelectric layer 100 and/or part of components located on the piezoelectric layer 100; and part of components on the second side 100b of the piezoelectric layer 100 are located in the second cavity RC2. For example, a portion of the second electrode layer 210, a portion of the passivation layer 212, and part or all of one or more conductive pads among the plurality of conductive pads may be located in the second cavity RC2.

In some embodiments, the cover bonding layer 216 may be in an ring shape, and have a sidewall delimiting the second cavity RC2; that is, the cover bonding layer 216 surrounds the second cavity RC2 in a direction parallel to the main surface of the piezoelectric layer. The cover bonding layer 216 may be bonded to a portion of the surface of the piezoelectric layer 100 at a side away from the first electrode layer 110 (for example, a portion of the surface of an edge of the piezoelectric layer 100), a portion of the surface of one or more conductive pads (for example, the first conductive pad 213a and the interconnection pad 213c) among the plurality of conductive pads, and a portion of the surface of an edge portion of the passivation layer 212 at a side away from the piezoelectric layer.

In some embodiments, a material of the cover bonding layer 216 and a material of the carrier bonding layer 116 may be different from each other. For example, the cover bonding layer 216 may include an organic material, and the carrier bonding layer 116 may include an inorganic material. For example, the cover bonding layer 216 may include a dry film, and the carrier bonding layer 116 may include silicon oxide or the like.

The embodiment of the present disclosure provides a method for manufacturing a bulk acoustic wave resonator, including: sequentially forming a second electrode layer, a piezoelectric layer and a first electrode layer, wherein the first electrode layer and the second electrode layer are respectively located on a first side and a second side of the piezoelectric layer opposite to each other in a first direction; performing a patterning process on the first electrode layer to form a first electrode and an additional electrode, and form a gap between the first electrode and the additional electrode, so that the first electrode and the additional electrode are spaced apart from each other and electrically isolated from each other; forming a carrier structure on a side of the piezoelectric layer and the first electrode layer away from the second electrode layer, wherein a portion of the carrier structure is filled in the gap; and forming a first cavity between the piezoelectric layer and the carrier structure, wherein a portion of the first electrode is located in the first cavity; performing a patterning process on the second electrode layer to form a second electrode; forming one or more conductive pads on the second side of the piezoelectric layer, wherein the one or more conductive pads at least include an interconnection pad, and the interconnection pad is electrically connected to the second electrode and extends to pass through the second electrode and the piezoelectric layer so as to be electrically connected to the additional electrode; bonding the cover structure to the second side of the piezoelectric layer and forming a second cavity between the cover structure and the piezoelectric layer, wherein the cover structure includes a cover bonding layer and a cover substrate, the cover bonding layer is disposed between the cover substrate and the piezoelectric layer in the first direction, and a portion of the second electrode layer is located in the second cavity; forming a first connection via hole and a second connection via hole extending through the carrier structure; and forming a first conductive connector and a second conductive connector on a side of the piezoelectric layer away from the cover structure, wherein the first conductive connector is electrically connected to the first electrode through the first connection via hole, the second conductive connector is electrically connected to the additional electrode through the second connection via hole, and further electrically connected to the second electrode through the additional electrode and the interconnection pad.

FIG. 2 to FIG. 23 are schematic cross-sectional views illustrating structures of various steps in the manufacturing method for a bulk acoustic wave resonator according to some embodiments of the present disclosure. In some embodiments, the manufacturing method adopts a wafer level packaging (WLP) process.

Figure 2:
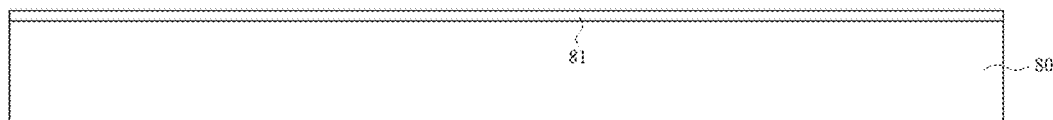
FIGS. 2 to 23 are schematic cross-sectional views illustrating structures in various steps of a method for manufacturing a bulk acoustic wave resonator according to some embodiments of the present disclosure.

Referring to FIG. 2, a substrate 80 is provided. The substrate 80 may be a semiconductor substrate, such as a silicon substrate, but the present disclosure is not limited thereto. The substrate 80 may also adopt other suitable materials, such as glass substrate, as long as it can provide a structural support for the subsequently formed overlying layer(s). The substrate 80 will be removed in a subsequent process, and may also be referred to as a sacrificial substrate. In some embodiments, the substrate 80 is a wafer-level substrate.

In some embodiments, a dielectric layer 81 is formed on the substrate 80. The dielectric layer 81 may be an oxide layer, including silicon oxide ($SiO_2$), for example. The dielectric layer 81 may be formed by a deposition process such as chemical vapor deposition or a thermal oxidation process.

Figure 3:
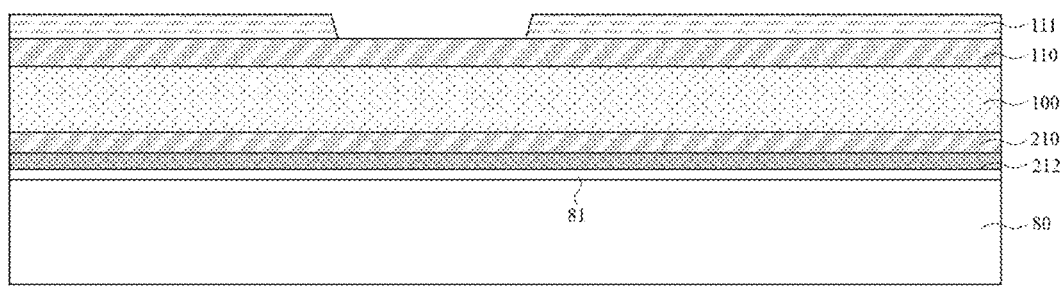

Referring to FIG. 2 and FIG. 3, a passivation layer 212, a second electrode layer 210, a piezoelectric layer 100 and a first electrode layer 110 are sequentially formed on the dielectric layer 81. The passivation layer 212 may include an insulating material such as aluminum nitride, silicon nitride, the like or combinations thereof. For example, a layer of the above-mentioned material may be formed by a suitable deposition process such as a chemical vapor deposition process and a physical vapor deposition process. The first electrode layer 110 and the second electrode layer 210 may each include a suitable electrode material, for example, include a metallic material, such as molybdenum (Mo), aluminum (Al), copper (Cu), platinum (Pt), tantalum (Ta), tungsten (W), palladium (Pd), ruthenium (Ru), the like, alloys thereof or combinations thereof. The piezoelectric layer 100 may include a suitable piezoelectric material, such as aluminum nitride (AlN), scandium-doped aluminum nitride (ScAlN), zinc oxide, lithium niobate, lithium tantalate and other materials with piezoelectric properties. It should be understood that the above materials are only for illustration, and the present disclosure is not limited thereto.

Referring to FIG. 3, in some embodiments, an edge protruding layer is formed on a side of the first electrode layer 110 away from the substrate 80, and a patterning process including an etching process is performed on the edge protruding layer to remove a portion of the edge protruding layer, so as to form an edge protruding layer 111 having an opening. The opening exposes a portion of the surface of the first electrode layer 110 at a side away from the substrate 80.

Figure 4:
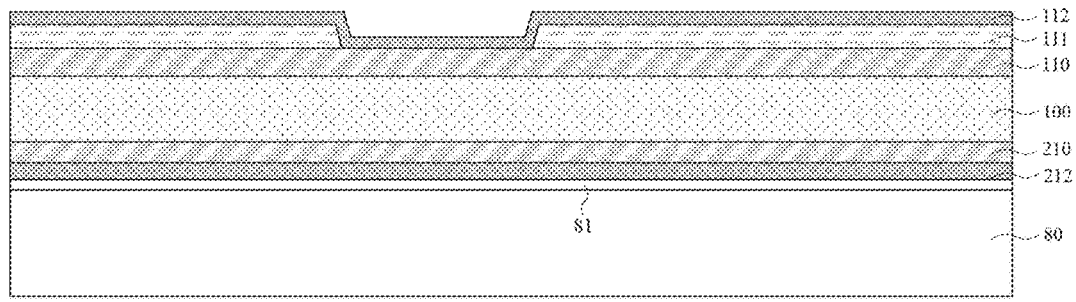

Referring to FIG. 4, a passivation layer 112 is formed on a side of the first electrode layer 110 and the edge protruding layer 111 away from the piezoelectric layer 100. The passivation layer 112 covers a surface of the edge protruding layer 111 at a side away from the piezoelectric layer, fills into the opening of the edge protruding layer 111, and covers a sidewall of the edge protruding layer 111 and the surface of the first electrode layer 110 exposed by the opening. The passivation layer 112 may include an insulating material such as aluminum nitride, silicon nitride, the like or combinations thereof, and the material of the passivation layer 112 may be as same as or different from that of the passivation layer 212.

Figure 5:
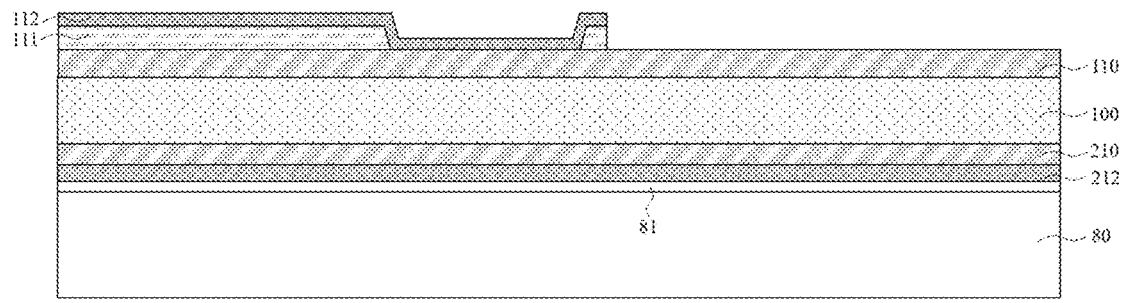
Figure 6:
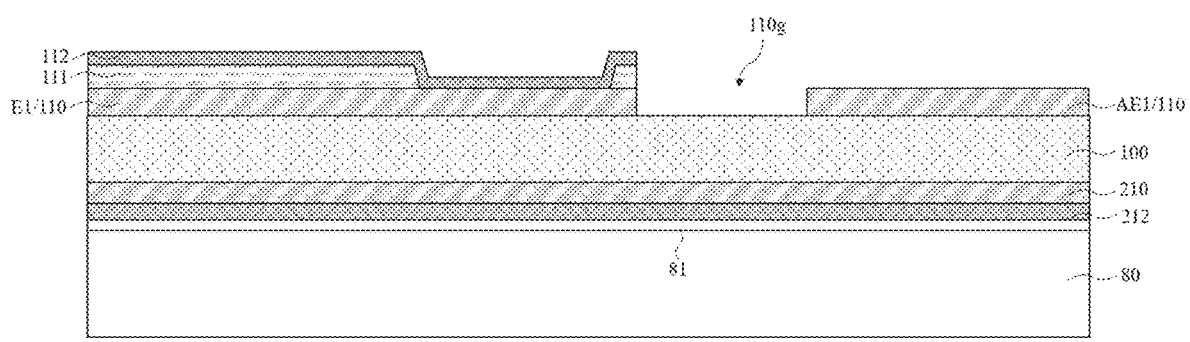

Referring to FIG. 4 to FIG. 6, a patterning process is performed on the passivation layer 112, the edge protruding layer 111 and the first electrode layer 110, so as to form a first electrode E1 and an additional electrode AE1 electrically isolated from each other, and to form the edge protruding layer 111 and the passivation layer 112 which cover the first electrode E1.

For example, referring to FIG. 4 and FIG. 5, a first patterning process is performed on the passivation layer 112 and the edge protruding layer 111. The first patterning process may include removing a portion of the passivation layer 112 and a portion of the edge protruding layer 111 through an etching process, thereby exposing a portion of the surface of the first electrode layer 110 at a side away from the piezoelectric layer 100. After the first patterning process, the remaining passivation layer 112 and the remaining edge protruding layer 111 may be located at a position corresponding to a position where the first electrode is to be formed later.

Referring to FIG. 5 and FIG. 6, a second patterning process is then performed on the first electrode layer 110. The second patterning process may include removing a portion of the first electrode layer 110 through an etching process, so as to form a first electrode E1 and an additional electrode AE1, and form a gap 110g between the first electrode E1 and the additional electrode AE1. The first electrode E1 is covered by the edge protruding layer 111 and the passivation layer 112; a sidewall of the first electrode E1 may be substantially aligned with a sidewall of the edge protruding layer 111 and/or a sidewall of the passivation layer 112 in a direction perpendicular to the main surface of the piezoelectric layer. The additional electrode AE1 is spaced apart from the first electrode E1 by the gap 110g, and is exposed, without being covered by the edge protruding layer 111 and the passivation layer 112.

Figure 7:
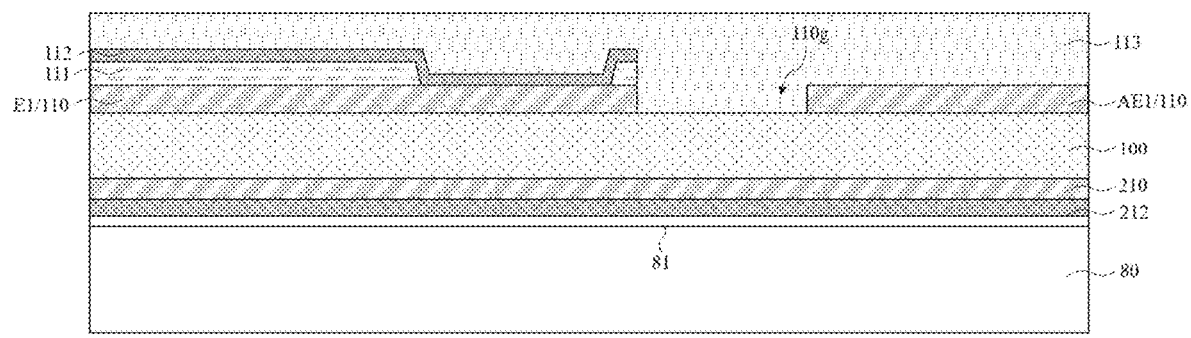

Referring to FIG. 6 and FIG. 7, a dielectric layer 113 is formed on a side of the first electrode layer 110 and the piezoelectric layer 100 away from the second electrode layer 210. The dielectric layer 113 covers surfaces of the first electrode layer 110 and the passivation layer 112 at a side away from the piezoelectric layer 100, and fills into the gap 110g of the first electrode layer 110 to cover sidewalls of the first electrode E1 and the additional electrode AE1 and sidewalls of the edge protruding layer 111 and the passivation layer 112, and a portion of the surface of the piezoelectric layer 100 at the side away from the second electrode layer 210. The dielectric layer 113 may include, for example, a suitable dielectric material such as silicon oxide, and may be formed by a deposition process such as CVD, a spin-coating method, or the like. In some embodiments, the dielectric layer 113 has a substantially flat surface. For example, a planarization process (e.g., a chemical mechanical polishing (CMP) process) may be performed on the dielectric material after the dielectric material is deposited, so that the dielectric layer 113 has a substantially flat surface.

Figure 8:
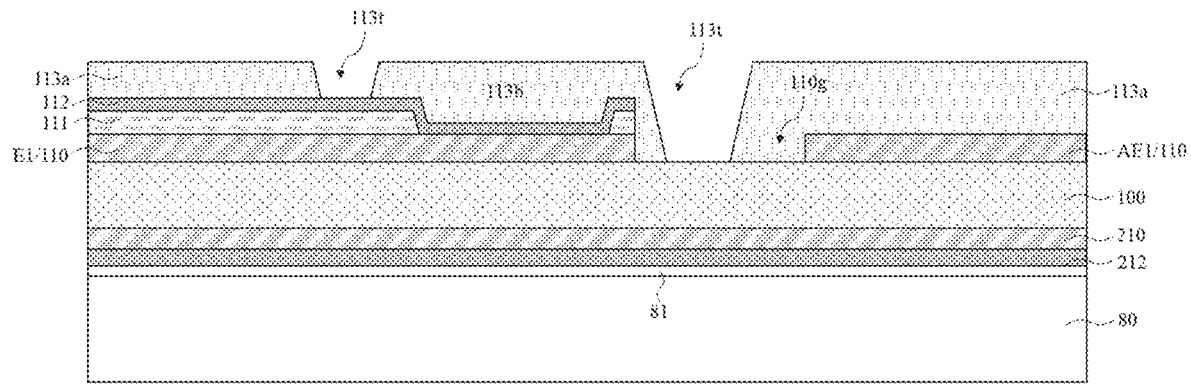

Referring to FIG. 7 and FIG. 8, a patterning process (for example, including a photolithography process and an etching process) is performed on the dielectric layer 113 to remove a portion of the dielectric layer 113 and form a trench 113t in the dielectric layer 113. In some embodiments, a portion of the dielectric layer 113 covering the passivation layer 112 and a portion of the dielectric layer 113 covering the piezoelectric layer 100 are removed; the portion of the dielectric layer 113 covering the passivation layer 112 may be overlapped with the edge protruding layer 111 and the first electrode E1 in the direction perpendicular to the main surface of the piezoelectric layer; the portion of the dielectric layer 113 covering the piezoelectric layer 100 includes a portion of the dielectric layer 113 located in the gap 100g between the first electrode E1 and the additional electrode AE1. In this way, a portion of the trench 113t exposes a portion of the surface of the passivation layer 112, and another portion of the trench 113t may expose a portion of the surface of the piezoelectric layer 100. For example, a portion of the trench 113t may be located in the gap 110g between the first electrode E1 and the additional electrode AE1, and expose a portion of the surface of the piezoelectric layer 100 at a side away from the second electrode layer.

In some embodiments, the trench 113t may be ring-shaped when viewed in a plan view. Herein, "ring-shaped" may include being in any type of ring shape, such as a circular ring shape, a square ring shape, a polygonal ring shape or an irregular ring shape. The trench 113t may have a closed ring-shaped structure, and divides the dielectric layer 113 into a supporting dielectric layer 113a and a sacrificial dielectric layer 113b that are spaced apart from each other. In other words, the sacrificial dielectric layer 113b is surrounded by the trench 113t and the supporting dielectric layer 113a in the direction parallel to the main surface of the piezoelectric layer, and is spaced apart from the supporting dielectric layer 113a by the trench 113t.

In some embodiments, the sacrificial dielectric layer 113b covers a portion of the surface of the passivation layer 112 at a side away from the piezoelectric layer, and covers sidewalls of the passivation layer 112, the edge protruding layer 111 and the first electrode E1. Orthographic projections of the opening of the edge protruding layer 111, a portion of the edge protruding layer 111 defining the opening, and portions of the first electrode and the passivation layer corresponding to the portion of the edge protruding layer 111 on the piezoelectric layer may be located within a range of an orthographic projection of the sacrificial dielectric layer 113b on the piezoelectric layer.

Figure 9:
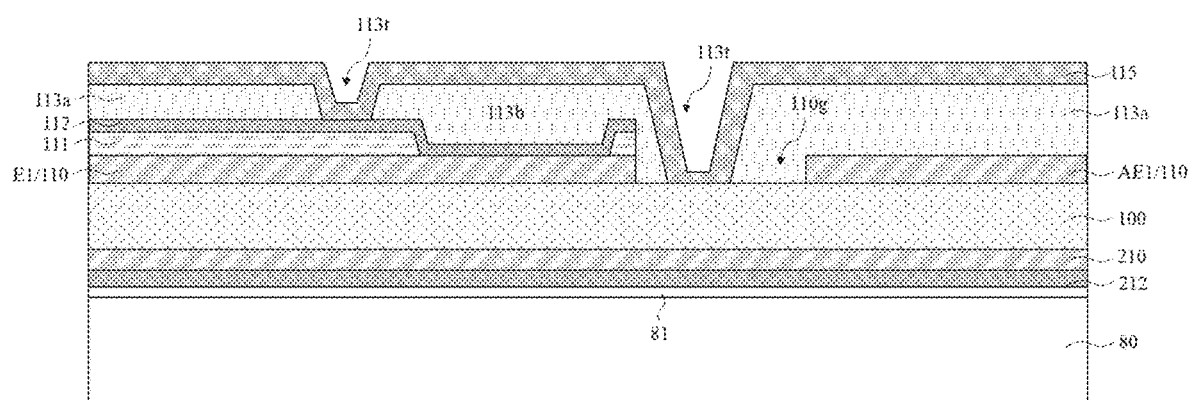

Referring to FIG. 9, a cavity boundary layer 115 is formed on a side of the dielectric layer 113 away from the piezoelectric layer and in the trench 113t of the dielectric layer 113. A material of the cavity boundary layer 115 is different from a material of the dielectric layer 113. In some embodiments, the material of the cavity boundary layer 115 may include a semiconductor material, a dielectric material, the like or a combination thereof. For example, the cavity boundary layer 115 may include amorphous silicon, polysilicon, silicon nitride, aluminum nitride, the like or combinations thereof, and may be formed by a suitable deposition process such as CVD and atomic layer deposition (ALD).

In some embodiments, the cavity boundary layer 115 continuously extends along a surface of the dielectric layer 113 at a side away from the piezoelectric layer and a surface of the trench 113t. For example, the cavity boundary layer 115 covers the surface of the trench 113t, and may at least partially fill the trench 113t. Specifically, the cavity boundary layer 115 covers a sidewall of the supporting dielectric layer 113a and a surface of the supporting dielectric layer 113a at a side away from the piezoelectric layer, a sidewall of the sacrificial dielectric layer 113b and a surface of the sacrificial dielectric layer 113b at a side away from the piezoelectric layer, a portion of the surface of the passivation layer 112 at a side away from the piezoelectric layer, and a portion of the surface of the piezoelectric layer 100 at a side away from the second electrode layer 210. The sacrificial dielectric layer 113b is located in a space enclosed by the cavity boundary layer 115, the piezoelectric layer 100 and the passivation layer 112.

Figure 10:
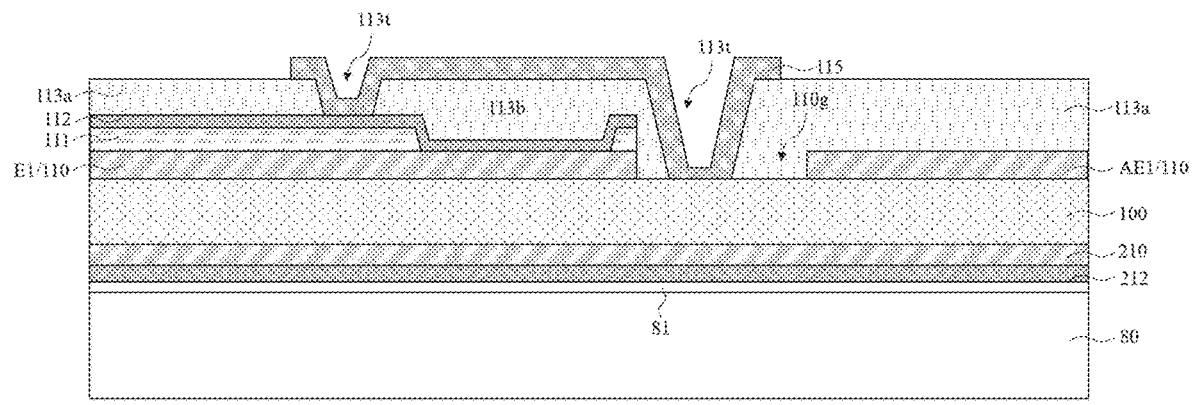

Referring to FIG. 9 and FIG. 10, in some embodiments, a portion of the cavity boundary layer 115 located on at least a portion of the surface of the supporting dielectric layer 113a at a side away from the piezoelectric layer may be removed by an etching process, so as to expose at least the portion of the surface of the supporting dielectric layer 113a at a side away from the piezoelectric layer. In some embodiments, after the etching process, the cavity boundary layer 115 covers at least a sidewall of the sacrificial dielectric layer 113b and a surface of the sacrificial dielectric layer 113b at a side away from the piezoelectric layer, or covers at least surfaces of the sacrificial dielectric layer 113b and the trench 113t.

Figure 11:
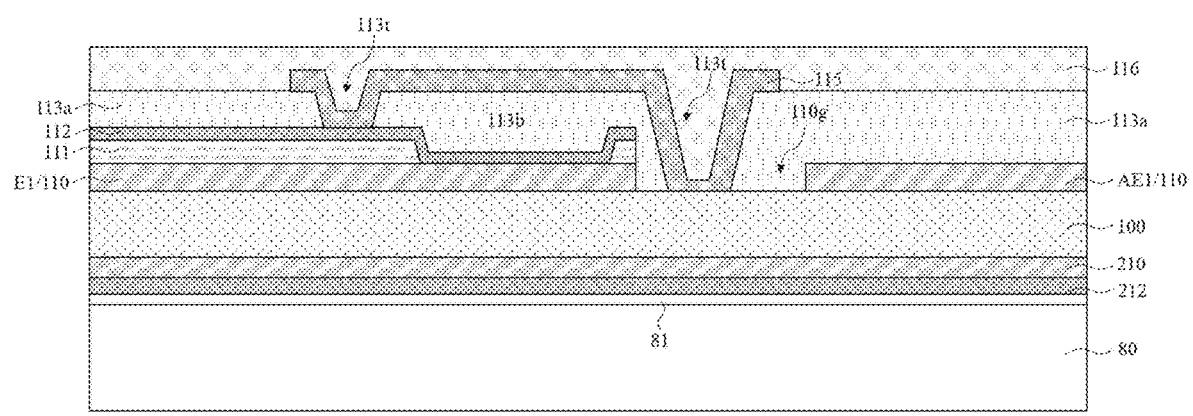

Referring to FIG. 11, a carrier bonding layer 116 is formed on a side of the dielectric layer 113 and the cavity boundary layer 115 away from the piezoelectric layer 100; the carrier bonding layer 116 covers a surface of the supporting dielectric layer 113a at a side away from the piezoelectric layer 100, as well as a sidewall of the cavity boundary layer 115 and a surface of the cavity boundary layer 115 at a side away from the piezoelectric layer. In some embodiments, the carrier bonding layer 116 substantially fills up the trench 113t, and the carrier bonding layer 116 may have a substantially flat surface at a side away from the piezoelectric layer to facilitate a subsequent bonding process. A material of the carrier bonding layer 116 may be different from that of the cavity boundary layer 115. For example, the carrier bonding layer 116 may include a dielectric material such as silicon oxide ($SiO_2$). The method of forming the carrier bonding layer 116 may include: depositing a bonding material layer and then performing a planarization process (for example, CMP) on the bonding material layer, so that the carrier bonding layer 116 has a flat surface.

Figure 12:
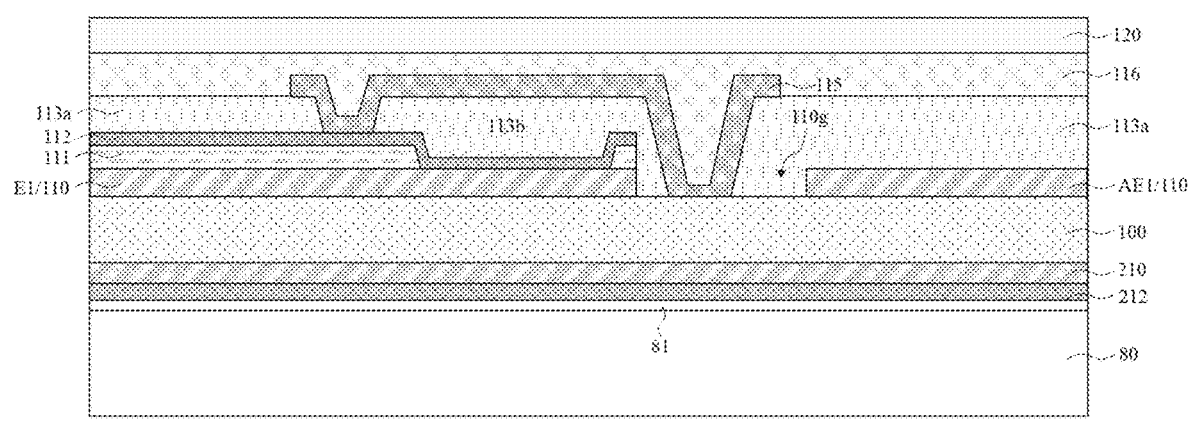

Referring to FIG. 12, a carrier substrate 120 is provided, and a bonding process is performed to bond the carrier substrate 120 and the carrier bonding layer 116 to each other. In some embodiments, the carrier substrate 120 may include a semiconductor material, a dielectric material, the like or a combination thereof. For example, the carrier substrate 120 may include silicon (Si), silicon oxide ($SiO_2$), polysilicon, silicon carbide, the like or a stacked layer including combinations thereof. In some embodiments, the carrier substrate 120 includes a semiconductor substrate (e.g., a silicon-containing substrate) and a dielectric material layer (e.g., silicon oxide) located on the semiconductor substrate, and may be bonded to the carrier bonding layer 116 through the dielectric material layer. In some embodiments, the carrier substrate 120 may be a semiconductor wafer, such as a silicon wafer.

Figure 13:
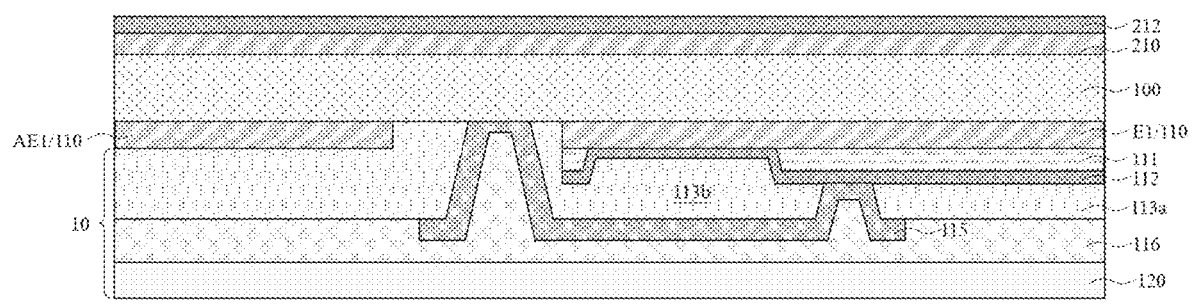
Figure 14:
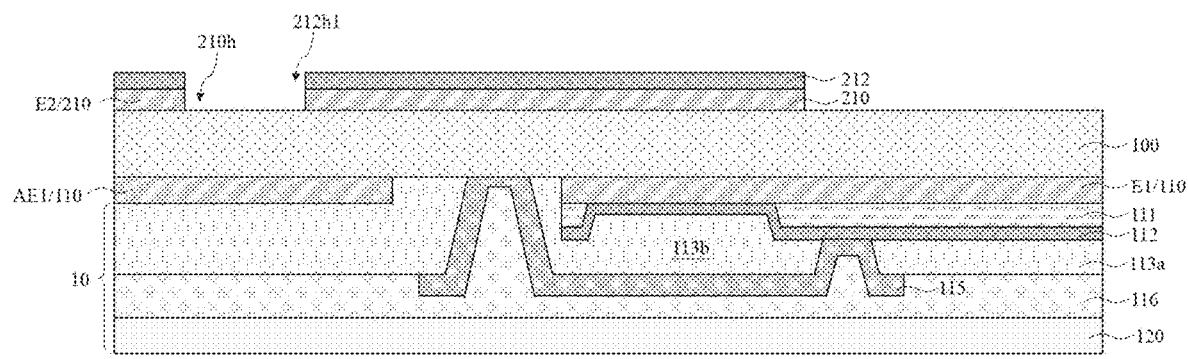

Referring to FIG. 12 and FIG. 13, the structure shown in FIG. 12 is turned over, and the substrate 80 and the dielectric layer 81 are removed, so as to expose a surface of the passivation layer 212 at a side away from the piezoelectric layer 100. Referring to FIG. 13 and FIG. 14, a patterning process (for example, including a photolithography process and an etching process) is performed on the passivation layer 212 and the second electrode layer 210 to remove a portion of the passivation layer 212 and a portion of the second electrode layer 210, so that a second electrode E2 is formed, and the passivation layer 212 correspondingly covers a surface of the second electrode E2 at a side away from the piezoelectric layer. In this step, a sidewall of the passivation layer 212 may be substantially aligned with a sidewall of the second electrode E2 in a direction perpendicular to the main surface of the piezoelectric layer.

In some embodiments, the patterning process includes: forming a passivation opening 212h1 in the passivation layer 212, and forming an electrode via hole 210h in the second electrode layer 210, wherein the passivation opening 212h1 and the electrode via hole 212h are in spatial communication with each other, and the electrode via hole 210h extends to pass through the second electrode E2 and exposes a sidewall of the second electrode E2 and a portion of the surface of the piezoelectric layer 100 away from the first electrode layer 110. The electrode via hole 210h and the passivation opening 212h1 are at least partially located directly above the additional electrode AE1, that is, orthographic projections of the electrode via hole 210h and the passivation opening 212h1 on the main surface of the piezoelectric layer 100 are at least partially overlapped with an orthographic projection of the additional electrode AE1 on the main surface of the piezoelectric layer.

Figure 15:
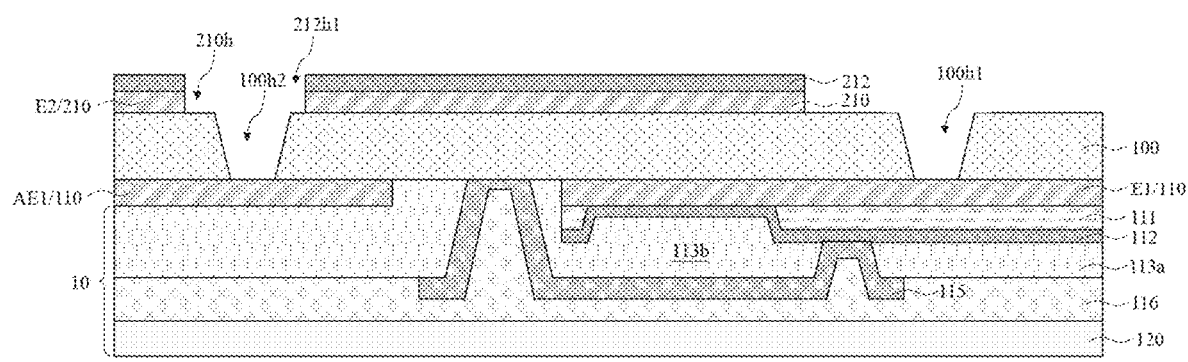

Referring to FIG. 14 and FIG. 15, an etching process is performed on the piezoelectric layer 100 to remove portions of the piezoelectric layer exposed by the second electrode layer 210 and the passivation layer 212, and to form a piezoelectric via hole 100h1 and an additional piezoelectric via hole 100h2 which extend through the piezoelectric layer 100, in the piezoelectric layer 100. For example, the piezoelectric via hole 100h1 exposes a portion of the surface of the first electrode E1 at a side away from the carrier substrate 120; the additional piezoelectric via hole 100h2 is in spatial communication with the electrode via hole 210h, and exposes a portion of the surface of the additional electrode AE1 at a side away from the carrier substrate 120. In some embodiments, the etching process further forms one or more release holes (not shown) in the piezoelectric layer 100, wherein the release hole extends through the piezoelectric layer 100 to exposes a portion of the surface of the sacrificial dielectric layer 113b at a side away from the carrier substrate 120. For example, the etching process removes a portion of the piezoelectric layer located directly above the sacrificial dielectric layer 113b, thereby forming the release hole. It should be noted that the release hole only exposes a portion of the surface of the sacrificial dielectric layer 113b, and does not expose the first electrode layer 110, the cavity boundary layer 115, and the supporting dielectric layer 113a, etc.

Figure 16:
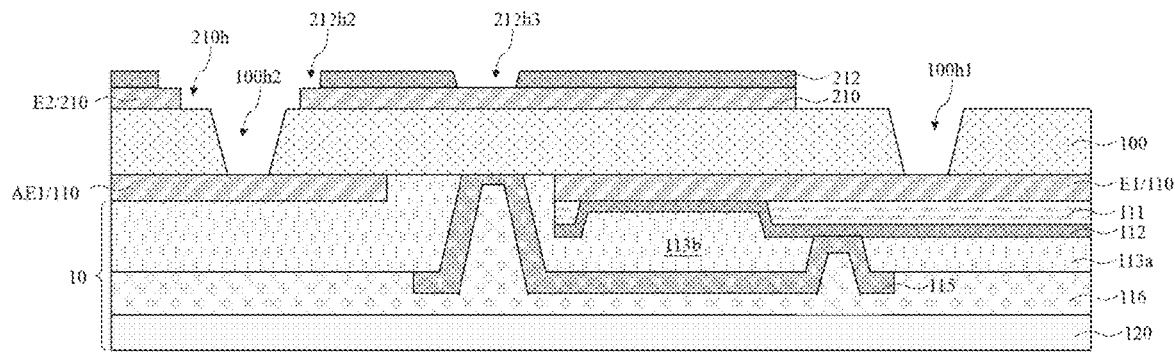

Referring to FIG. 15 and FIG. 16, in some embodiments, an etching process is further performed on the passivation layer 212 to remove a portion of the passivation layer 212 covering the second electrode E2, and form a passivation opening 212h2 and a passivation opening 212h3 in the passivation layer 212. For example, a portion of the passivation layer around the passivation opening 212h1 shown in FIG. 15 is removed, so that a size of the passivation opening 212h1 is further increased, thereby forming the passivation opening 212h2; the passivation opening 212h2 is in spatial communication with the electrode via hole 210h and the additional piezoelectric via hole 100h2, and exposes a portion of the surface of the second electrode E2 at a side away from the piezoelectric layer. A position of the passivation opening 212h3 is offset from a position of the electrode via hole 210h in a direction parallel to the main surface of the piezoelectric layer, that is, an orthographic projection of the passivation opening 212h3 on the piezoelectric layer is offset from an orthographic projection of the electrode via hole 210h on the piezoelectric layer. The passivation opening 212h3 extends through the passivation layer 212, and exposes a portion of the surface of the second electrode E2 at a side away from the piezoelectric layer 100.

Figure 17:
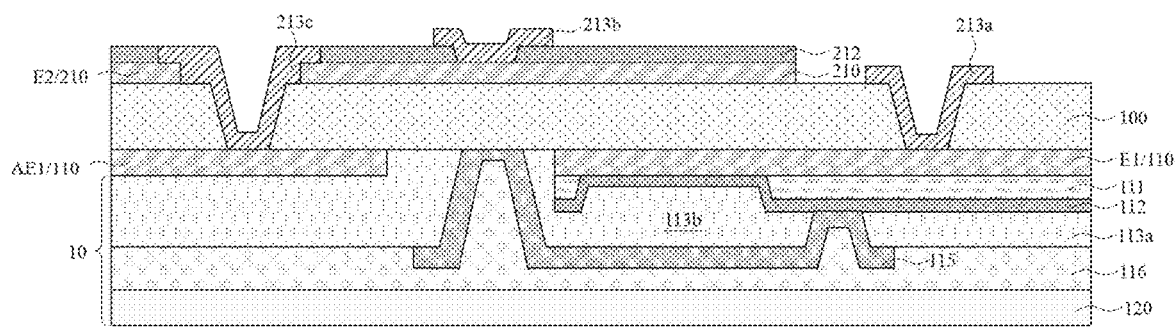

Referring to FIG. 16 and FIG. 17, one or more conductive pads are formed on a side of the piezoelectric layer 100 away from the carrier substrate 120; for example, a first conductive pad 213a, an interconnection pad 213c and a second conductive pad 213b may be formed. For example, a conductive material layer may be formed on a side of the piezoelectric layer 100, the second electrode layer 210 and the passivation layer 212 away from the carrier substrate 120 by deposition, and the conductive material layer is filled in each of the piezoelectric via holes, electrode via hole and passivation openings; then a patterning process including etching is performed on the conductive material layer, thereby forming the one or more conductive pads.

Figure 18:
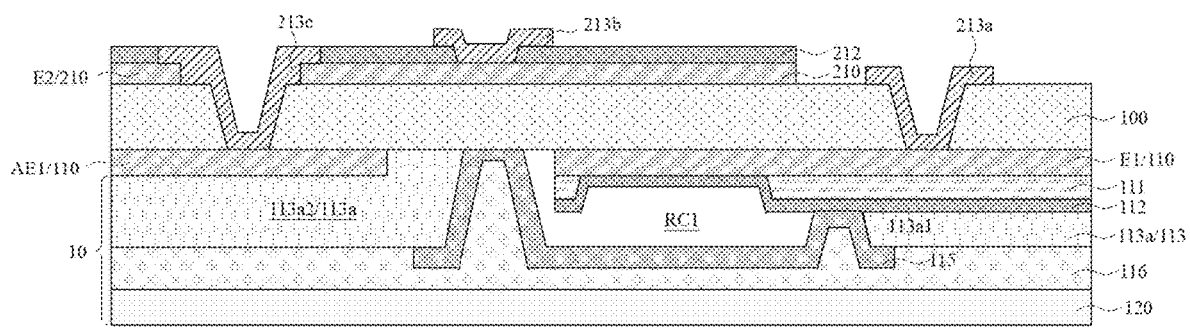

Referring to FIG. 17 and FIG. 18, the sacrificial dielectric layer 113b is removed to form a first cavity RC1. For example, the sacrificial dielectric layer 113b may be removed by an etching process, and the etching process may include: applying an etchant to a region where the sacrificial dielectric layer 113b is located through release hole(s) in the piezoelectric layer 100, thereby removing the sacrificial dielectric layer 113b and forming the first cavity RC1 at a position previously occupied by the sacrificial dielectric layer 113b. The etchant may include, for example, a buffer oxide etchant (BOE) or hydrofluoric acid (for example, diluted hydrofluoric acid (DHF) or the like. The buffer oxide etchant is a mixed solution of hydrofluoric acid (HF) and NH$_4$F. The etching process has a high etching selectivity of the sacrificial dielectric layer 113b to adjacent components such as the cavity boundary layer 115, and substantially does not remove the cavity boundary layer 115, the first electrode E1, the edge protruding layer 111 and the passivation layer 112, thereby defining the first cavity RC1 in a region surrounded by the cavity boundary layer 115 and the components above the cavity boundary layer 115. In addition, since the sacrificial dielectric layer 113b is spaced apart from the supporting dielectric layer 113a by the cavity boundary layer 115, and the cavity boundary layer 115 confines the etchant in a region where the sacrificial dielectric layer 113b is located, thus the supporting dielectric layer 113a is substantially not removed in the etching process.

Referring to FIG. 18, after the sacrificial dielectric layer 113b is removed, the dielectric layer 113 only includes the supporting dielectric layer 113a; the supporting dielectric layer 113a includes a first dielectric part 113a1 located between the carrier bonding layer 116 and the passivation layer 112, and a second dielectric part 113a2 located between the carrier bonding layer 116 and the additional electrode AE1 and between the carrier bonding layer 116 and the piezoelectric layer 100. The supporting dielectric layer 113a, the cavity boundary layer 115, the carrier bonding layer 116 and the carrier substrate 120 together constitute the carrier structure 10.

Figure 19:
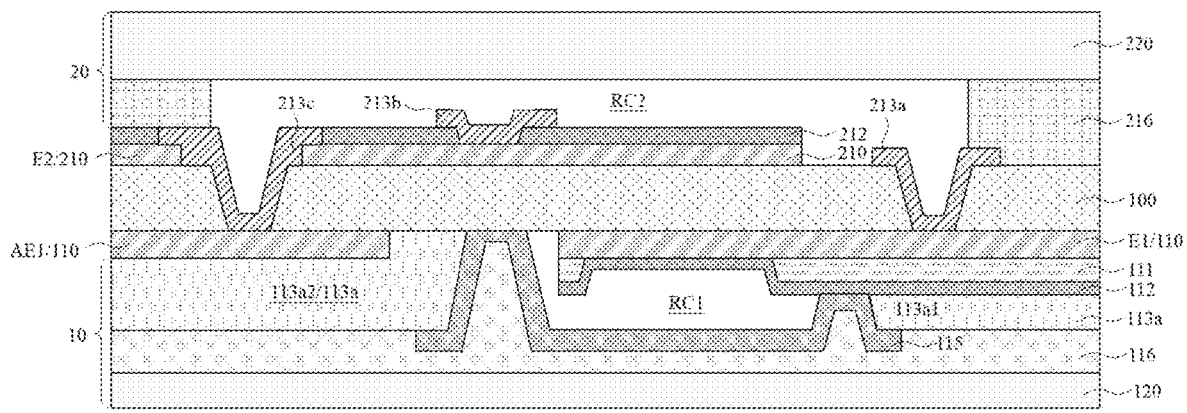

Referring to FIG. 18 and FIG. 19, a cover structure 20 is formed and bonded to a structure shown in FIG. 18, such that the cover structure 20 and the structure shown in FIG. 18 enclose to delimit a second cavity RC2. For example, the formation of the cover structure 20 may include providing a cover substrate 220 and forming a cover bonding layer 216 on the cover substrate 220. For example, a material of the cover substrate 220 may be as same as or different from that of the carrier substrate 120. For example, the material of the cover substrate 220 may be or include a semiconductor material, an insulating material, such as high-resistance silicon, glass, or the like. For example, the cover substrate 220 may be a wafer, such as a semiconductor wafer such as a silicon wafer. The cover bonding layer 216 may include an organic material, such as a dry film, a photoresist material or the like.

In some embodiments, forming the cover bonding layer 216 on the cover substrate 220 may include: depositing and forming a bonding material layer on the cover substrate 220, and then performing a patterning process on the bonding material layer to remove a portion of the bonding material layer and to form the cover bonding layer 216. In some embodiments, because the cover bonding layer 216 is formed of dry film or photoresist material, the patterning process for forming the cover bonding layer 216 can be realized by using a photolithography process including exposure and development, and the patterning process may not require an etching process. In some embodiments, the cover bonding layer 216 may be disposed on an edge portion of the cover substrate 220 and may be ring-shaped.

After the cover bonding layer 216 is formed on the cover substrate 220, a side of the cover substrate 220 provided with the cover bonding layer 216 is positioned to face the structure shown in FIG. 18, and a bonding process is then performed to bond the cover structure 20 to the structure shown in FIG. 18. In some embodiments, the process of bonding the cover bonding layer 216 to the underlying structure (that is, the structure shown in FIG. 18) is performed after the cover bonding layer 216 is patterned, a bonding surface of the underlying structure may have an uneven morphology, and a bonding interface between the cover bonding layer 216 and the underlying structure has a relatively small area, therefore, using a relatively soft organic material such as a dry film or photoresist or the like for the cover bonding layer 216 can facilitate the bonding process and allow the structure formed by the bonding process to have higher stability and reliability.

Still referring to FIG. 18 and FIG. 19, in some embodiments, before bonding the cover structure 20 to the second side of the piezoelectric layer 100, the wafer structure may further be tested through the test pads. For example, the first conductive pad 213a electrically connected to the first electrode E1 and the second conductive pad 213b electrically connected to the second electrode E2 can be used for the test of the wafer structure. The test may include a wafer acceptance test (WAT), but the present disclosure is not limited thereto. In some embodiments, the test may include a test of related performances (e.g., frequency, etc.) of the resonator, and related structural parameters (e.g., thickness, etc.) of the resonator may be adjusted based on test results, so that the subsequently formed resonator can satisfy the expected requirements. In the present disclosure, the wafer structure includes a wafer and various components formed on the wafer.

Figure 20:
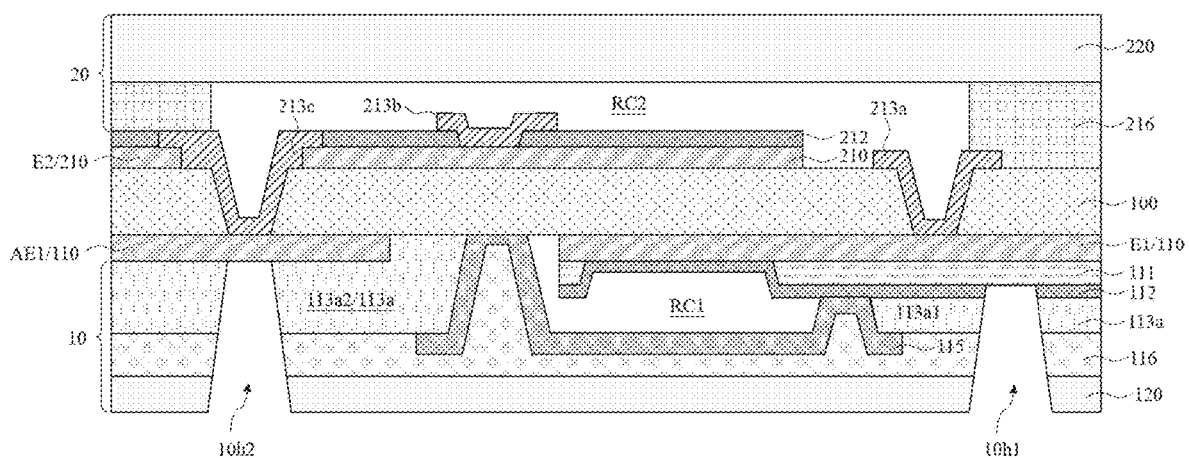

Referring to FIG. 19 and FIG. 20, an etching process is performed on the carrier structure 10 and the passivation layer 112 to form a first connection via hole 10h1 and a second connection via hole 10h2. For example, the etching process removes a portion of the carrier substrate 120, a portion of the carrier bonding layer 116, a portion of the first dielectric part 113a1 of the supporting dielectric layer 113a, and a portion of the passivation layer 112, thereby forming the first connection via hole 10h1 to expose a portion of the surface of the first electrode structure ES1 (e.g., the edge protruding layer 111) at a side away from the piezoelectric layer 100; the etching process removes a portion of the carrier substrate 120, a portion of the carrier bonding layer 116 and a portion of the second dielectric part 113a2 of the supporting dielectric layer 113a, thereby forming the second connection via hole 10h2 to expose a portion of the surface of the additional electrode AE1 at a side away from the piezoelectric layer 100.

Figure 21:
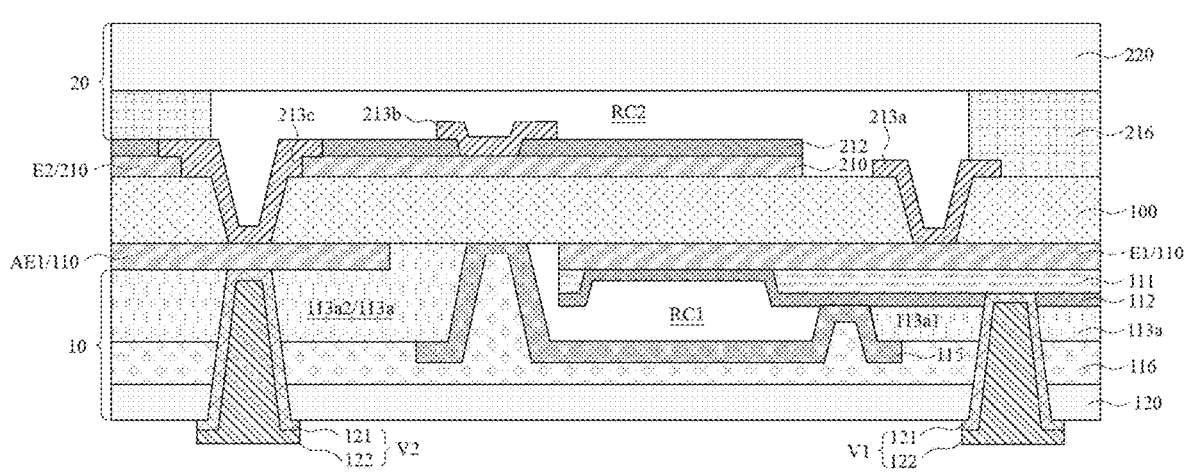

Referring to FIG. 20 and FIG. 21, a first conductive via V1 and a second conductive via V2 are formed. The first conductive via V1 and the second conductive via V2 at least fill into the first connection via hole 10h1 and the second connection via hole 10h2 to be connected to the first electrode E1 and the additional electrode AE1, respectively. In some embodiments, each of the first conductive via V1 and the second conductive via V2 includes a via part located in a via hole of the carrier structure and a protrusion part (or may be referred to as a pad part), the protrusion part is protruded, in the first direction D1, from a surface of the carrier substrate 120 at a side away from the piezoelectric layer, towards a direction away from the piezoelectric layer 100. A width of the protrusion part in a direction parallel to the main surface of the piezoelectric layer may be greater than a width of the via part in the said direction, and the protrusion part may cover a portion of the surface of the carrier substrate 120 at a side away from the piezoelectric layer.

Still referring to FIG. 20 and FIG. 21, in some embodiments, the first conductive via V1 and the second conductive via V2 may be formed by the following processes: a seed material layer is formed on a side of the carrier structure 10 away from the piezoelectric layer, wherein the seed material layer covers a surface of the carrier substrate 120 at a side away from the piezoelectric layer, fills in the first connection via hole and the second connection via hole and lines surfaces of the first connection via hole and the second connection via hole, and wherein the seed material layer may be a metal seed layer, for example, may include titanium, copper or a combination thereof, or the like; a mask layer (for example, a patterned photoresist layer) is performed on a side of the seed material layer away from the piezoelectric layer, wherein the mask layer has mask openings corresponding to positions where the first conductive via and the second conductive via are to be formed, for example, the mask openings may expose portions of the seed material layer located in the first connection via hole and the second connection via hole, and may further exposes some other portions of the seed material layer which are adjacent to the portions of the seed material layer and located on a side of the carrier substrate 120 away from the piezoelectric layer; thereafter, a conductive layer 122 is formed on the seed material layer exposed by the mask openings of the mask layer by a plating process (for example, an electroplating process), wherein the conductive layer 122 may include a metal material such as copper; the mask layer is then removed, and an etching process is performed on the seed material layer using the conductive layer 122 as an etching mask, so as to remove a portion of the seed material layer not covered by the conductive layer 122, and a seed layer 121 is remained, so that the seed layer 121 and the conductive layer 122 together constitute a corresponding conductive via.

Figure 22:
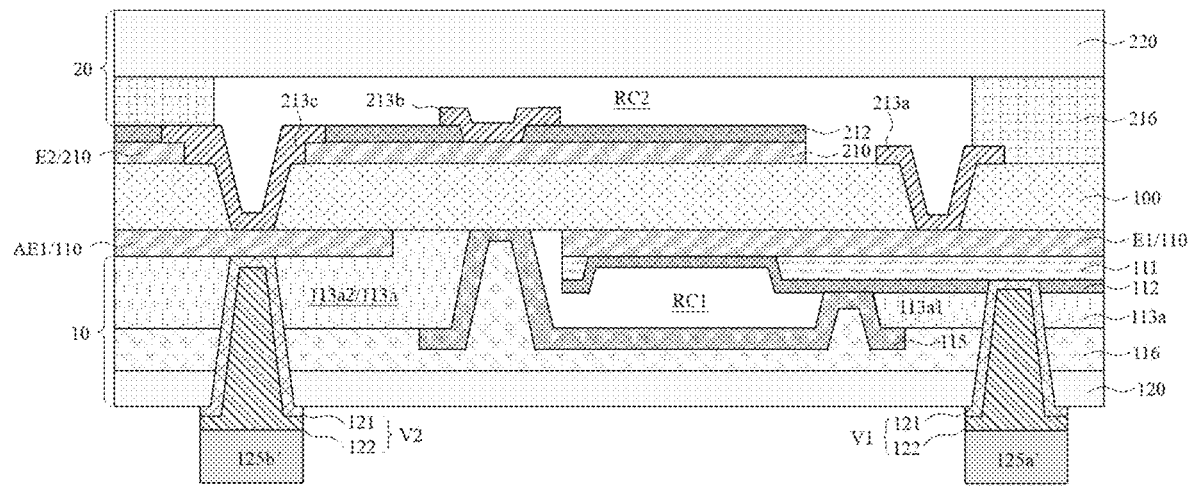
Figure 23:
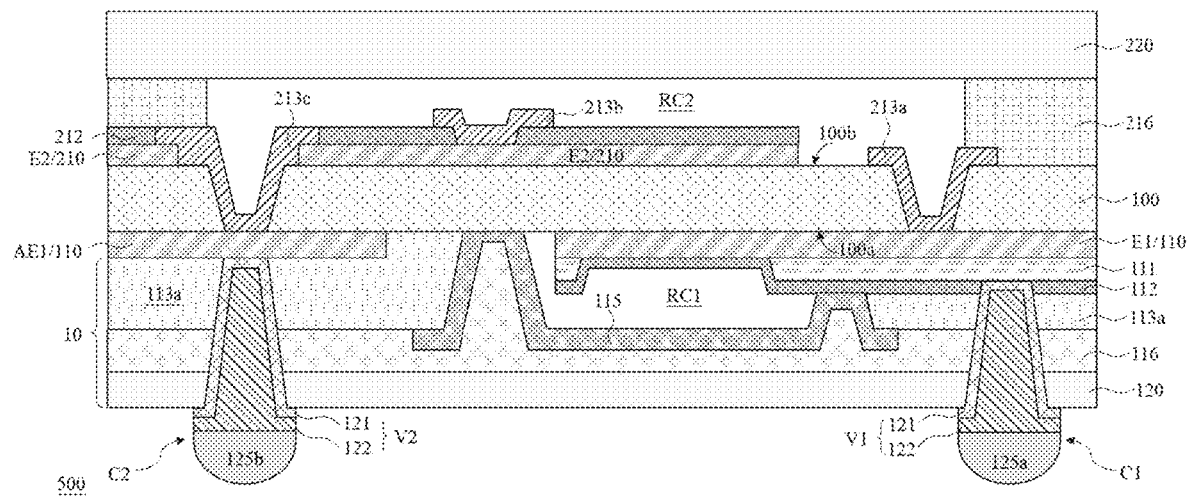

Referring to FIG. 22 and FIG. 23, a first conductive bump 125a and a second conductive bump 125b are respectively formed on a side of the first conductive via V1 and the second conductive via V2 away from the piezoelectric layer. The conductive bump may be or include a solder bump. In some embodiments, the conductive bump may be formed by forming a bump material on the conductive via and performing a reflow process on the bump material. For example, as shown in FIG. 22, a first bump material 125a' and a second bump material 125b' are respectively formed on a side of the first conductive via V1 and the second conductive via V2 away from the piezoelectric layer; the first bump material and the second bump material may be or include solder paste, and may be formed on the corresponding conductive vias by a printing process, for example; in this step, a cross-sectional shape of the bump material may be square or similar shapes. Thereafter, as shown in FIG. 22 and FIG. 23, a reflow process is performed on the first bump material 125a' and the second bump material 125b' to form the first conductive bump 125a and the second conductive bump 125b; after the reflow process, the conductive bump may have a spherical-shaped or similar-shaped surface; for example, the conductive bump may also be referred to as a solder ball.

Referring to FIG. 23, as such, the manufacturing process of the resonator 500 is thus completed. In some embodiments, the manufacturing process of the resonator 500 adopts a wafer-level packaging process, and a packaging structure as formed includes a plurality of dies, and each of the dies may include one or more resonators 500. It should be understood that, FIG. 2 to FIG. 23 merely illustrate cross-sectional views of structures in a region corresponding to a single resonator in various steps in the packaging process, and other resonators located in the same die or different dies in the overall packaging structure are simultaneously formed by similar or substantially the same steps and may have similar or substantially the same structures as the illustrated resonator. In some embodiments, after a plurality of conductive bumps are formed, a cutting process may be performed on the formed wafer-level packaging structure to separate the plurality of dies from each other, so that the plurality of dies are independent of each other and each include one or more resonators 500. For example, the die may include a filter including a plurality of resonators.

The embodiments of the present disclosure provide a filter including a plurality of resonators, the plurality of resonators may be connected to each other in a series and/or parallel manner. The filter also has the technical effects described above with respect to the resonator. In some embodiments, the resonators in the filter may each have a structure as same as or similar to the resonator 500, and may be connected to each other through conductive wires. For example, the process step of performing the patterning process on the first electrode layer 110 in FIG. 6, not only include forming first electrodes and additional electrodes of a plurality of resonators, but may also include forming conductive wires for connecting the first electrodes of the corresponding resonators; the process step of performing the patterning process on the second electrode layer 210 in FIG. 14, not only include forming second electrodes of a plurality of resonators, but may also include forming conductive wires for connecting the second electrodes of the corresponding resonators.

In some embodiments, for a plurality of resonators connected to each other (e.g., in series) in a filter, it may be unnecessary to provide conductive connectors and test pads in each of the resonators. For example, one of the plurality of resonators (e.g., a first resonator) may be selected to be provided with conductive connectors, and the first resonator may not be provided with test pads; and another one of the plurality of resonators (e.g., a second resonator) may be selected to be provided with test pads, and the second resonator may not be provided with conductive connectors as well as an additional pad and an additional electrode for electrical connection between a second conductive connector and a second electrode. Because the plurality of resonators are connected in series with each other, voltages can be applied to the corresponding electrodes of the plurality of resonators through the conductive connectors in the first resonator; and the filter including the plurality of resonators can be tested through the test pads of the second resonator.

Figure 24:
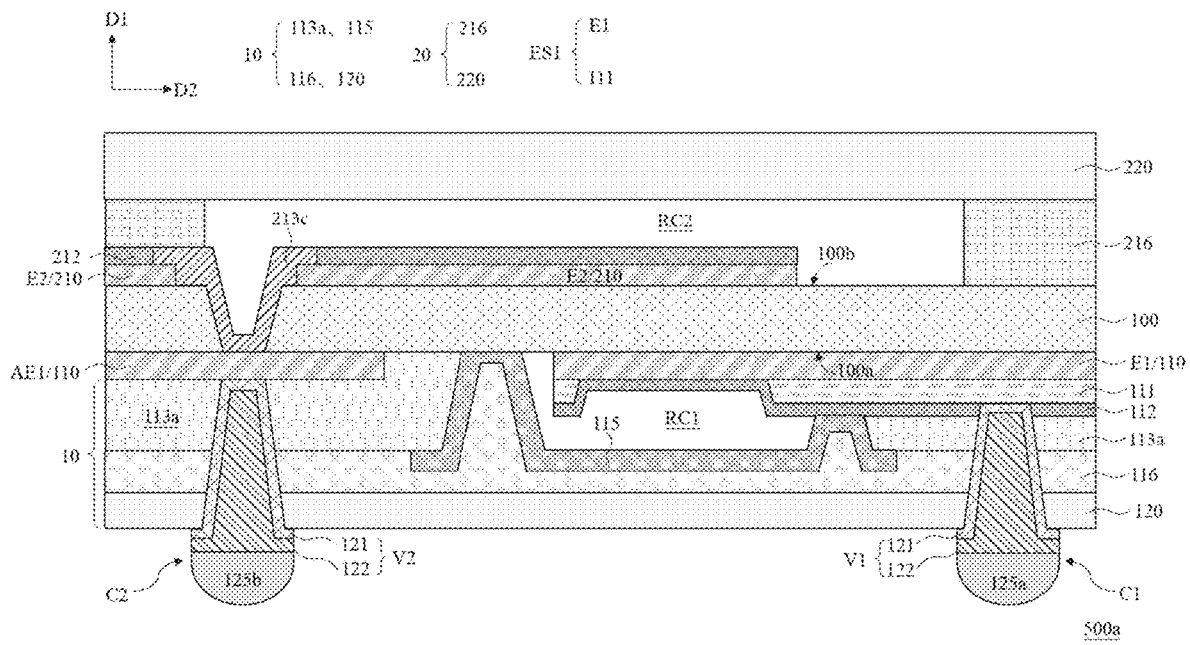
FIG. 24 illustrates a schematic cross-sectional view of a bulk acoustic wave resonator according to some other embodiments of the present disclosure.
Figure 25:
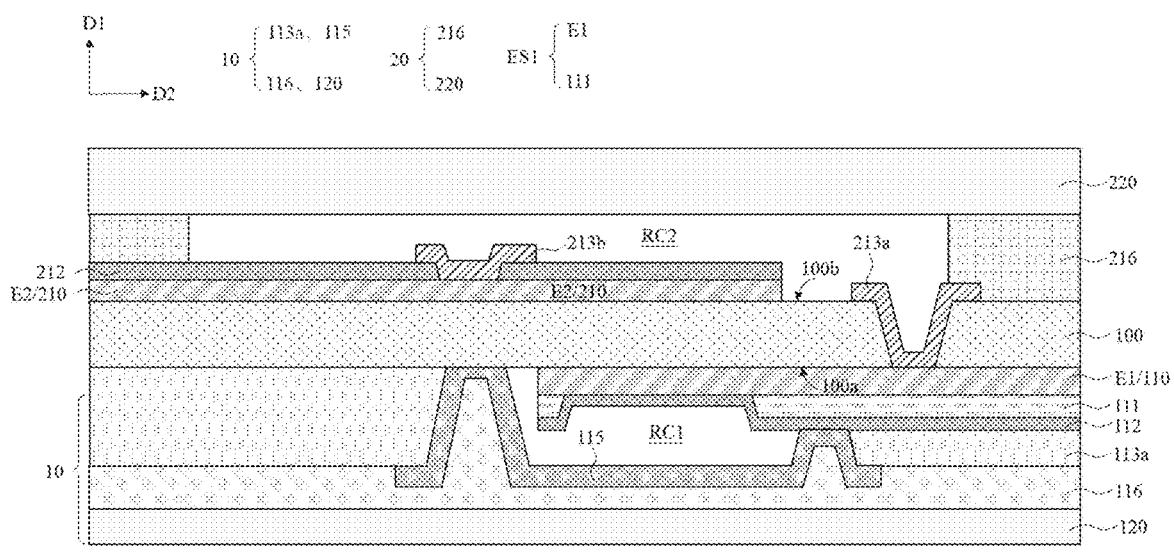
FIG. 25 illustrates a schematic cross-sectional view of a bulk acoustic wave resonator according to some further embodiments of the present disclosure.

FIG. 24 and FIG. 25 schematically illustrate a first resonator 500a and a second resonator 500b included in the filter. For example, the first resonator 500a and the second resonator 500b may be connected in series with each other, and a structure of the first resonator 500a is similar to that of the resonator 500 shown in FIG. 23, except that the first conductive pad and the second conductive pad are omitted in the first resonator 500a. A structure of the second resonator 500b is similar to that of the resonator 500 shown in FIG. 23, except that the first conductive connector and the second conductive connector, as well as the additional electrode and the interconnection pad connected to the second conductive connector are omitted in the second resonator 500b. In the filter, the corresponding electrodes in the first resonator 500a and the second resonator 500b may be connected to each other through conductive wires provided in the corresponding electrode layers.

It should be understood that, the connection modes and structures of the first resonator and the second resonator shown in FIGS. 24 and 25 are merely for illustration; in practical application, the specific structures of the respective resonators can be appropriately adjusted based on the structure of the resonator 500 according to the product requirements, such as the connection mode of the respective resonators in the filter, and structures including these adjustments are also included in the scope of protection of the present disclosure.

Figure 26:
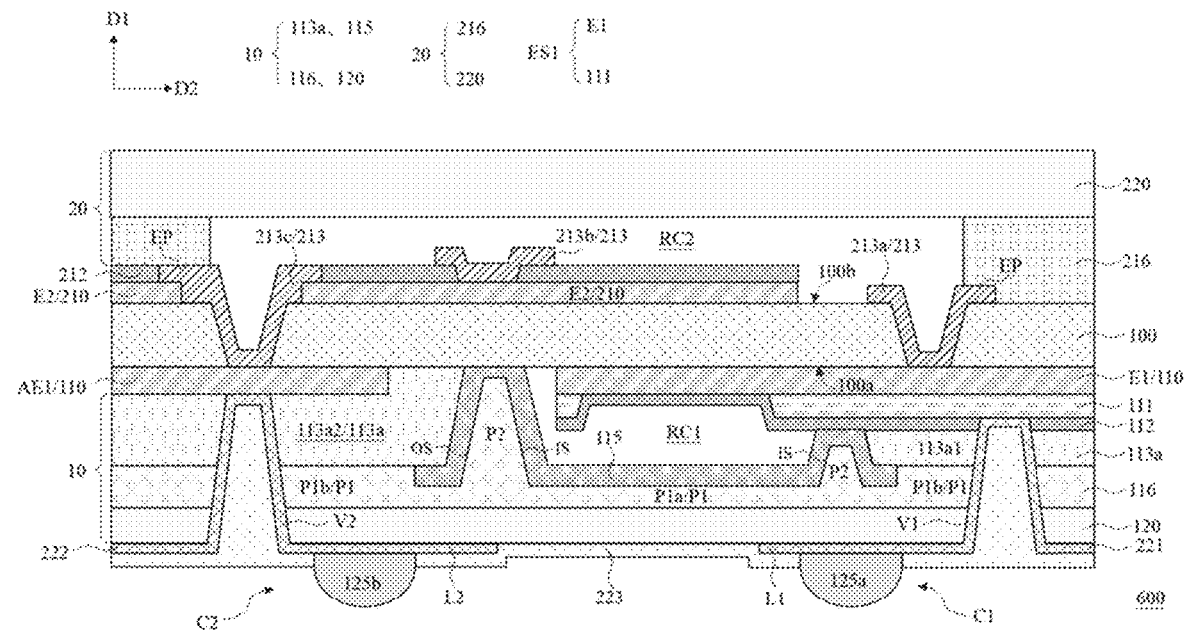
FIG. 26 is a cross-sectional view of a bulk acoustic wave (BAW) resonator, according to an embodiment of the present disclosure.

FIG. 26 is a schematic cross-sectional view of a bulk acoustic wave (BAW) resonator 600 in accordance with some embodiments of the present disclosure. The bulk acoustic wave resonator 600 is similar to the bulk acoustic wave resonator 500. The difference is that in the conductive connector of the bulk acoustic wave resonator 600, the conductive bumps are electrically connected to the corresponding electrodes through a redistribution layer. The differences between the bulk acoustic wave resonator 600 and the previous embodiment will be described in detail below.

Referring to FIG. 26, in some embodiments, the first conductive connector C1 includes a first redistribution layer 221 and a first conductive bump 125a, and the first conductive bump 125a is electrically connected to the first electrode E1 through the first redistribution layer 221. The second conductive connector C2 includes a second redistribution layer 222 and a second conductive bump 125b, and the second conductive bump 125b is electrically connected to an intermediate connection member including the additional electrode AE1 and the interconnection pad 213c through the second redistribution layer 222.

For example, the redistribution layer may include a conductive via portion located in a connection via hole of the carrier structure and a conductive line portion located on a side of the carrier structure away from the piezoelectric layer; the conductive via portion and the conductive line portion are connected to each other. For example, the first redistribution layer 221 includes a first conductive via V1 and a first conductive line L1 connected to each other; the second redistribution layer 222 includes a second conductive via V2 and a second conductive line L2 connected to each other. The first conductive via V1 and the second conductive via V2 are respectively located in the first connection via hole and the second connection via hole of the carrier structure, and the first conductive line L1 and the second conductive line L2 are located in the carrier structure 10 (for example, the carrier substrate 120) on the side away from the piezoelectric layer. The first conductive bump 125a is disposed on the first redistribution layer 221, for example, on a side of the first conductive line L1 away from the piezoelectric layer, and is electrically connected to the first electrode E1 through the first redistribution layer 221. The second conductive bump 125b is disposed on the second redistribution layer 222, for example, on a side of the second conductive line L2 away from the piezoelectric layer, and is electrically connected to the additional electrode AE1 through the second redistribution layer 222.

In some embodiments, a passivation layer 223 is also provided on a side of the redistribution layer away from the piezoelectric layer. The passivation layer 223 may have a first passivation opening and a second passivation opening. The first passivation opening exposes a portion of the surface of the first redistribution layer 221. The second passivation opening exposes a portion of the surface of the second redistribution layer 222. The first conductive bump 125a and the second conductive bump 125b pass through the first passivation opening and the second passivation opening, respectively, to be electrically connected to the first redistribution layer 221 and the second redistribution layer 222, respectively. That is, the first conductive bump 125a and the second conductive bump 125b extend through the passivation layer 223 to be electrically connected to the first redistribution layer 221 and the second redistribution layer 222, respectively. In some embodiments, the first conductive via V1 may not completely fill the first connection via hole of the carrier structure, the second conductive via V2 may not completely fill the second connection via hole of the carrier structure, and part of the passivation layer 223 may fill in the first connection via hole and the second connection via hole. For example, the first conductive via V1 and the second conductive via V2 may respectively extend along the surface of the first connection via hole and the second connection via hole of the carrier structure, and the passivation layer 223 has a first part and a second part filling the first connection via hole and the second connection via hole, respectively. The first part of the passivation layer 223 may be surrounded by the first conductive via V1 in a direction parallel to the main surface of the carrier structure, and the second part of the passivation layer 223 may be surrounded by the second conductive via V2 in the direction parallel to the main surface of the carrier structure.

In this embodiment, the conductive bumps of the conductive connector are electrically connected to the corresponding electrodes through the redistribution layer, so that the position setting of the conductive bumps can be more flexible.

Conventionally, during a wafer level packaging (WLP) process of a thin film bulk acoustic wave (BAW) resonator, dry film bonding is generally used for bonding a cap wafer to a bottom substrate. The material for dry film is typically polyimide, but it may also be benzocyclobutene (BCB) or epoxy resin. Since the resonator may use buffered oxide etchant (BOE) or Dilute Hydrofluoric Acid (DHF) as an etching and releasing solution, a pad metal layer may be used in the BAW structure. When the dry film bonding is used for bonding the cap wafer to the bottom substrate, and the bonding layer of BAW structure includes a dry film, the adhesion between the dry film and the pad metal layer may be poor. As a result, dry film delamination might occur in subsequent fabrication processes.

In order to solve the problem of the poor adhesion between the dry film bonding layer and the pad metal layer, according to some embodiments of the present disclosure, a same material bonding, such as gold-gold (Au—Au) bonding, is used for bonding the cap wafer to the bottom substrate.

In addition, conventionally, solder bumps for connecting the BAW resonator to an external device are formed on a top surface of the cap wafer. In such arrangement, the density of the solder bumps on the top surface of the cap wafer is high, which make it difficult to reduce the size of the BAW resonator. In order to solve this problem, according to some embodiments of the present disclosure, solder bumps are formed on a bottom surface of the bottom substrate, the bottom surface being opposite to a top surface facing the cap wafer. The solder bumps are electrically connected to the top electrode and/or the bottom electrode via through holes formed in the bottom substrate. As a result, a density of the solder bumps can be significantly reduced.

Figure 27:
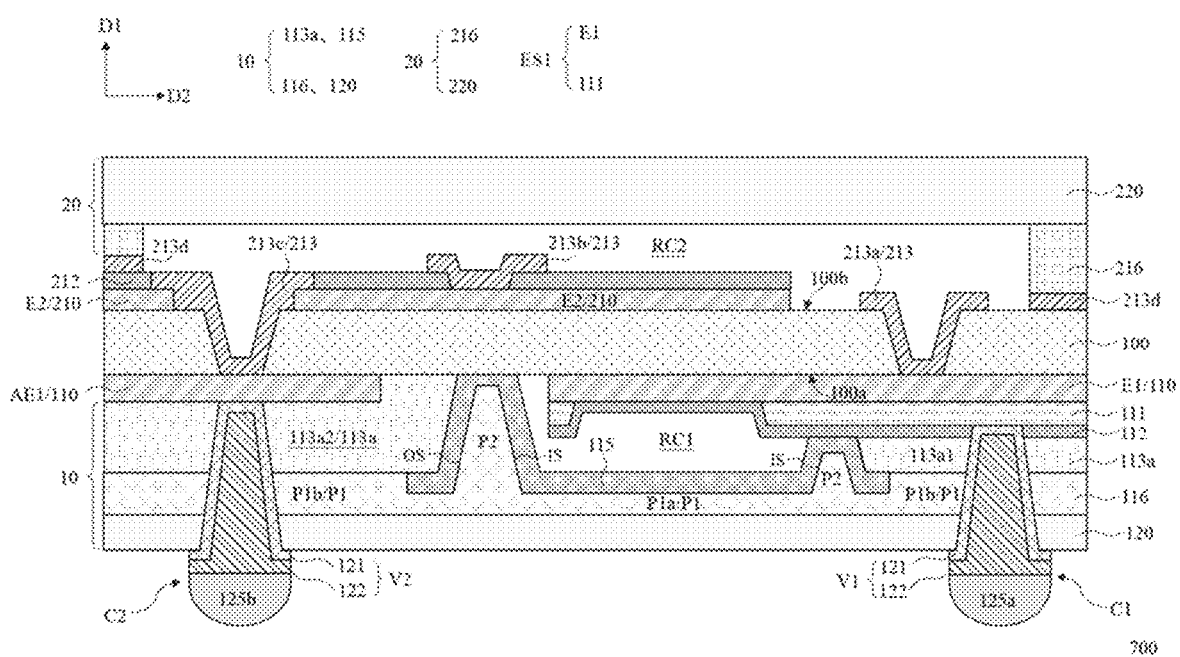
FIG. 27 is a cross-sectional view of a bulk acoustic wave (BAW) resonator, according to an embodiment of the present disclosure.

FIG. 27 illustrates a schematic cross-sectional view of a bulk acoustic wave resonator 700 in accordance with further embodiments of the present disclosure.

Referring to FIG. 27, in the bulk acoustic wave resonator 700, the pad layer further includes a bonding pad 213d. The bonding pad 213d is located between the cover bonding layer 216 and the piezoelectric layer 100 in the first direction D1. A projection of the bonding pad 213d on the piezoelectric layer 100 overlaps with a projection of the cover bonding layer 216. In some embodiments, the bonding pad 213d may be spaced apart and electrically isolated from other conductive pads in the pad layer, and the other conductive pads may not have an embedded portion covered by the cover bonding layer 216. For example, the first conductive pad 213a and the interconnection pad 213c may each be spaced apart from the bonding pad 213d. For example, the first conductive pad 213a, the second conductive pad 213b, the interconnection pad 213c and the bonding pad 213d may be formed from the same material layer through the same patterning process. In some embodiments, the bonding pad 213d of the pad layer separates the cover bonding layer 216 from the piezoelectric layer 100, and separates the cover bonding layer 216 from the passivation layer 212. For example, the dimensions (e.g., width, area, etc.) of the bonding pad 213d of the pad layer in a direction parallel to the major surface of the carrier structure may be greater than or equal to the size of the cover bonding layer 216 in a direction parallel to the major surface of the carrier structure. In some embodiments, the pad layer includes conductive materials such as metal, and the cover bonding layer 216 includes organic materials such as dry film.

In other embodiments, the pad layer and the cover bonding layer 216 may both include conductive materials such as metal, and the cover bonding layer 216 may be made of the same or different materials as the pad layer. For example, the pad layer and the cover bonding layer may include metals such as gold. In this example, the cover bonding layer 216 of the lid structure and the bonding pad 213d of the pad layer are bonded to each other via metal-to-metal bonding.

Figure 28:
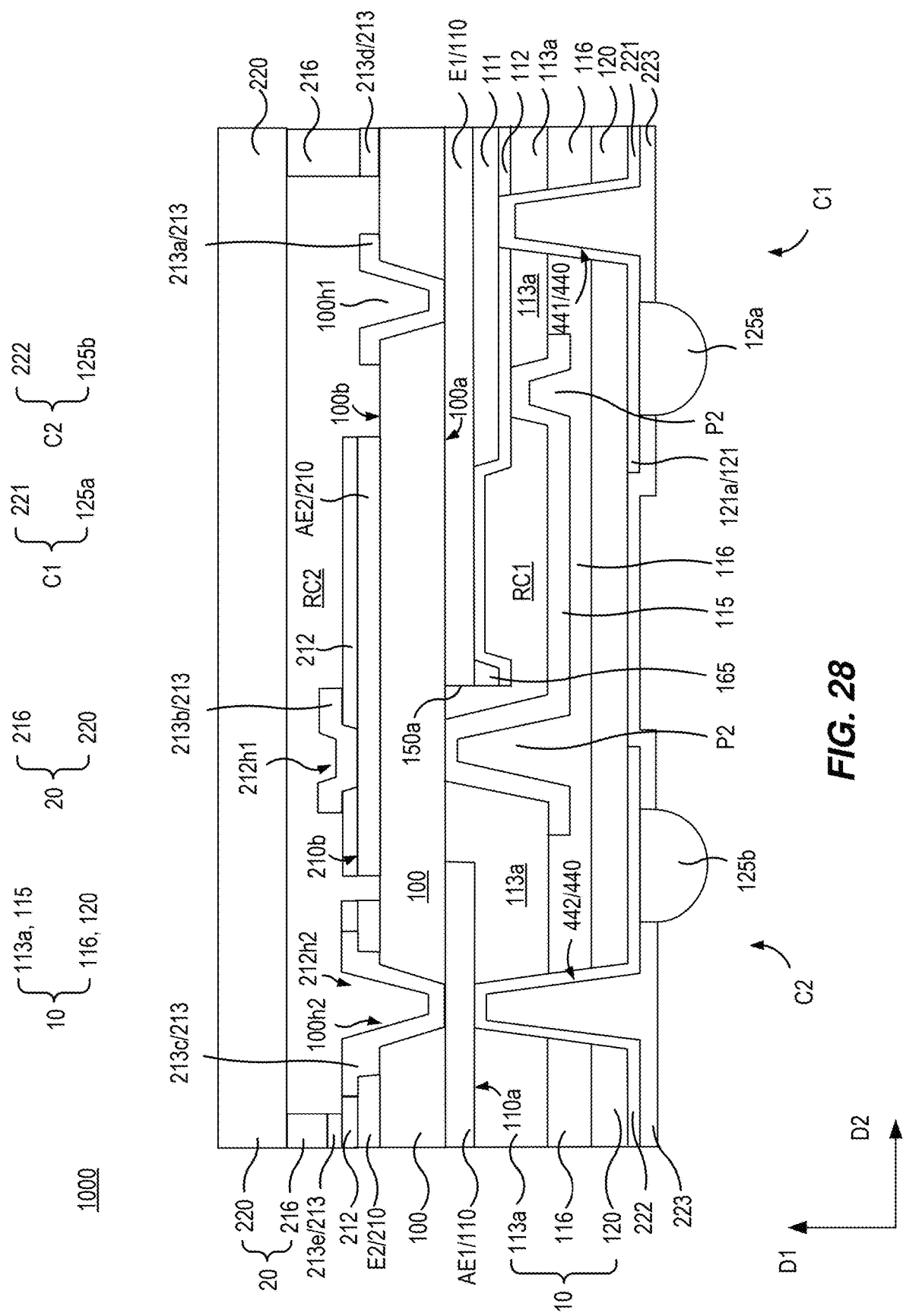
FIG. 28 is a cross-sectional view of a bulk acoustic wave (BAW) resonator, according to an embodiment of the present disclosure.

FIG. 28 is a cross-sectional view of a bulk acoustic wave (BAW) resonator 1000, according to an embodiment of the present disclosure.

As illustrated in FIG. 28, BAW resonator 1000 includes a piezoelectric layer 100, a first electrode layer 110, a second electrode layer 210, one or more conductive pads 213, a carrier structure 10, a cover structure 20, and a first conductive connector C1 and a second conductive connector C2. Piezoelectric layer 100 has a first side 100a and a second side 100b opposite to each other in a first direction D1. First electrode layer 110 is disposed on first side 100a of piezoelectric layer 100, and includes a first electrode E1 and an additional first electrode AE1 electrically isolated from each other. Second electrode layer 210 is disposed on second side 100b of piezoelectric layer 100, and includes a second electrode E2 and an additional second electrode AE2. The one or more conductive pads 213 are disposed on second side 100b of piezoelectric layer 100, and at least include an interconnection pad 213c. Interconnection pad 213c is electrically connected to second electrode E2 and extends through second electrode E2 and piezoelectric layer 100 to be electrically connected to additional first electrode AE1. Carrier structure 10 is disposed on first side 100a of piezoelectric layer 100 and a first side 110a of first electrode layer 110 away from second electrode layer 210. A first cavity RC1 is disposed between carrier structure 10 and piezoelectric layer 100. A portion of first electrode E1 is located in first cavity RC1. Cover structure 20 is disposed on second side 100b of piezoelectric layer 100 and includes a cover bonding layer 216 and a cover substrate 220. Cover bonding layer 216 is disposed between cover substrate 220 and piezoelectric layer 100 in first direction D1. A second cavity RC2 is disposed between cover structure 20 and piezoelectric layer 100, and a portion of second electrode layer 210 is located in second cavity RC2. First conductive connector C1 and second conductive connector C2 are disposed on first side 100a of piezoelectric layer 100 away from cover structure 200. First conductive connector C1 extends through carrier structure 10 to be electrically connected to first electrode E1. Second conductive connector C2 extends through the carrier structure 10 to be electrically connected to the additional first electrode AE1, and further electrically connected to second electrode E2 through additional first electrode AE1 and interconnection pad 213c.

The one or more conductive pads 213 further include bonding pads 213d and 213c. Cover substrate 220 is bonded with piezoelectric layer 100 via cover bonding layer 216 and bonding pads 213d and 213c.

Carrier structure 10 includes a supporting dielectric layer 113a, a cavity boundary layer 115, a carrier bonding layer 116, and a carrier substrate 120. Carrier substrate 120 may include silicon (Si), silicon carbon (SiC), aluminum oxide, quartz, glass (SiO$_2$), or sapphire (Al$_2$O$_3$).

Cover structure 20 includes cover bonding layer 216 and cover substrate 220. Cover substrate 220 may include silicon (Si).

Piezoelectric layer 100 may include a material with piezoelectric properties, such as aluminum nitride (AlN), zinc oxide (ZnO), lithium niobate (LiNbO3), lithium tantalate (LiTaO3), lead zirconate titanate (PZT), barium strontium titanate (BST), etc., or a stacked combination of two or more of those materials. When the material of piezoelectric layer 100 is aluminum nitride (AlN), the aluminum nitride may be doped with a certain proportion of rare earth elements, for example, scandium, erbium, lanthanum, etc.

First and second electrode layers 110 and 210 may include any suitable conductive material, including various metal materials with conductive properties such as molybdenum (Mo), aluminum (Al), copper (Cu), platinum (Pt), tantalum (Ta), tungsten (W), palladium (Pd), ruthenium (Ru), etc., or a stacked combination of two or more of those conductive metal materials.

An edge protruding layer 111 is disposed on at least a portion of first side 110a of first electrode E1 of first electrode layer 110. Edge protruding layer 111 is used to form a raised structure 165 along an edge of first electrode E1. Raised structure 165 protrudes towards a first cavity RC1. Edge protruding layer 111 may include a conductive material, which may be the same as the material of first electrode layer 110 or may be different from the material of first electrode layer 110. Additionally or alternatively, in an embodiment, an edge protruding layer may be disposed on at least a portion of a second side 210b of second electrode layer 210, to form a raised structure along an edge of second electrode layer 210. The raised structure formed on second electrode layer 210 protrudes from second electrode layer 210 in a direction away from first electrode layer 110.

A second passivation layer 212 is disposed above, and covers a top surface of, second electrode layer 210. A first passivation layer 112 is disposed below, and covers bottom surfaces of, first electrode layer 110 and edge protruding layer 111. Second passivation layer 212 may include aluminum nitride (AlN). First passivation layer 112 may include a material such as silicon nitride (SiN), aluminum nitride (AlN), silicon oxide (SiO2), silicon oxynitride (SiNO), etc., or a stacked combination of two or more of those materials.

Cover bonding layer 216 and the one or more conductive pads 213 may include a same material. In some embodiments, both of cover bonding layer 216 and the one or more conductive pads 213 may include gold (Au).

Within carrier structure 10, supporting dielectric layer 113a is disposed between carrier substrate 120 and piezoelectric layer 100, and carrier bonding layer 116 is disposed between carrier substrate 120 and supporting dielectric layer 113a. First cavity RC1 is formed in supporting dielectric layer 113a. Carrier bonding layer 116 includes a bonding protrusion P2 protruding towards piezoelectric layer 100 and surrounding first cavity RC1. Supporting dielectric layer 113a may include silicon oxide (SiO$_2$). Carrier bonding layer 116 may include silicon oxide, silicon nitride, etc., or a stacked combination of those materials.

Within carrier structure 10, cavity boundary layer 115 overlays at least bonding protrusion P2 of carrier bonding layer 116. Cavity boundary layer 115 may include non-conductive materials such as silicon (Si), silicon nitride (SiN), aluminum nitride (AlN), or a stacked combination of two or more of those materials. Cavity boundary layer 115 contacts at least one of piezoelectric layer 100, and a portion of first electrode E1 via edge protruding layer 111 and first passivation layer 112. An edge 150a of first electrode E1 is located inside first cavity RC1. In the embodiment illustrated in FIG. 28, cavity boundary layer 115 overlays bonding protrusion P2 and a portion of carrier bonding layer 116 surrounded by bonding protrusion P2, i.e., the bottom of first cavity RC1. In some alternative embodiments, cavity boundary layer 115 may overlay the entire carrier bonding layer 116.

In some embodiments, BAW resonator 1000 further includes at least one solder bump 125 disposed below a bottom surface of carrier substrate 120, and electrically connected to at least a portion of first electrode layer 110. The bottom surface of carrier substrate 120 is opposite to a top surface of carrier substrate 120 which faces piezoelectric layer 100.

In some embodiments, BAW resonator 1000 further includes at least one connection via hole 440 extending through carrier substrate 120 and exposing the at least one portion of first electrode layer 110, and an electrically conductive redistribution layer disposed below the bottom surface of carrier substrate 120 and in the at least one connection via hole 440. At least one portion of the redistribution layer is electrically connected to the exposed portion of first electrode layer 110.

In the embodiment illustrated in FIG. 28, first electrode layer 110 includes first electrode E1 and additional first electrode AE1 that are electrically insulated from each other. Edge protruding layer 111 is disposed on at least a portion of a bottom surface of first electrode E1. First passivation layer 112 is disposed below, and covers bottom surfaces of, first electrode E1 and edge protruding layer 111. The at least one connection via hole 440 includes a first connection via hole 441 and a second connection via hole 442. First connection via hole 441 extends through carrier substrate 120, carrier bonding layer 116, supporting dielectric layer 113$a$, and first passivation layer 112, and exposes a portion of the bottom surface of first electrode E1. Second connection via hole 442 extends through carrier substrate 120, carrier bonding layer 116, and supporting dielectric layer 113$a$, and exposes a portion of a bottom surface of additional first electrode AE1. The redistribution layer includes a first redistribution layer portion 221 disposed in first connection via hole 441, and contacting the exposed portion of first electrode E1, and a second redistribution layer portion 332 disposed in second connection via hole 442, and contacting the exposed portion of additional first electrode AE1. The at least one solder bump 125 includes a first solder bump 125$a$ disposed below, and electrically connected to first redistribution layer portion 221, and a second solder bump 125$b$ disposed below, and electrically connected to, second redistribution layer portion 332. Thus, first solder bump 125$a$ is electrically connected to first electrode E1, and second solder bump 125$b$ is electrical connection to additional first electrode AE1. First redistribution layer portion 221 and first solder bump 125$a$ together constitute first conductive connector C1. Second redistribution layer portion 332 and second solder bump 125$b$ together constitute second conductive connector C2.

Piezoelectric layer 100 includes a piezoelectric via hole 100$h1$ extending through piezoelectric layer 100 and exposing a portion of a top surface of first electrode E1, and an additional piezoelectric via hole 100$h2$ extending through piezoelectric layer 100 and exposing a portion of additional first electrode AE1.

The one or more conductive pads 213 include first to fifth conductive pads 213$a$, 213$b$, 213$c$, 213$d$, and 213$e$. Fourth conductive pad 213$d$ and fifth conductive pad 213$e$ are formed on the edge of BAW resonator 1000, and vertically overlap with cover bonding layer 216. Fourth conductive pad 213$d$ and fifth conductive pad 213$e$ are also referred to as bonding pads 213$d$ and 213$e$ for bonding piezoelectric layer 100 with cover structure 200 and cover bonding layer 216. First conductive pad 213$a$ is formed on piezoelectric layer 100 and in piezoelectric via hole 100$h1$, and contacts first electrode E1 via piezoelectric via hole 100$h1$. Second conductive pad 213$b$ is formed on second passivation layer 212 and in a first passivation opening 212$h1$ of second passivation layer 212, and contacts additional second electrode AE2 via first passivation opening 212$h1$. Third conductive pad 213$c$ is formed on second passivation layer 212 and in a second passivation opening 212$h2$ of second passivation layer 212 and additional piezoelectric via hole 100$h2$, and contacts second electrode E2 and additional first electrode AE1. Thus, additional first electrode AE1 and second electrode E2 are electrically connected via third conductive pad 213$c$ disposed in additional piezoelectric via hole 100$h2$. Thus, third conductive pad 213$c$ is also referred to as interconnection pad 213$c$ with electrically connects second electrode E2 and additional first electrode AE1.

Thus, in the configuration described above and illustrated in FIG. 28, first solder bump 125$a$ is electrically connected to first electrode E1, and second solder bump 125$b$ is electrically connected to second electrode E2 via additional first electrode AE1.

In some embodiments, BAW resonator 1000 further includes a bottom passivation layer 223 covering the redistribution layer and the bottom surface of carrier substrate 120, filling in the at least one connection via hole 440, and exposing first and second solder bump 125$a$ and 125$b$.

In some embodiments, BAW resonator 1000 further includes second cavity RC2 disposed above piezoelectric layer 100 and covered by cover substrate 220. Second cavity RC2 is surrounded by cover bonding layer 216.

Figure 29:
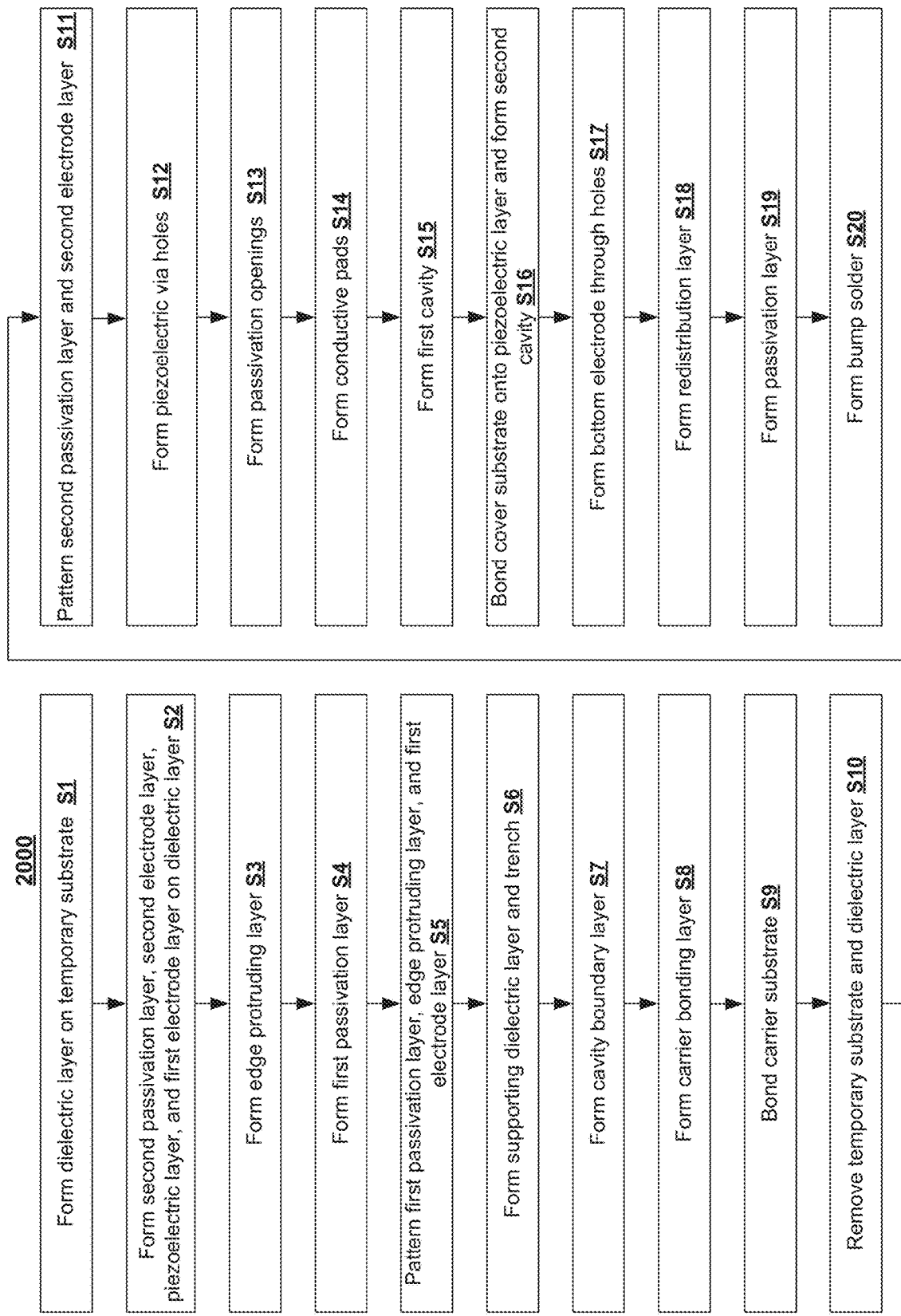
FIG. 29 is a flow chart of a process of fabricating a BAW resonator of FIG. 28, according to an embodiment of the present disclosure.
Figure 30A:
FIGS. 30A-30T are sectional views of structures formed in the process of FIG. 29, according to an embodiment of the present disclosure.

FIG. 29 is a flow chart of a process 2000 of fabricating BAW resonator 1000, according to an embodiment of the present disclosure. FIGS. 30A-30T are sectional views of structures formed in process 2000, according to an embodiment of the present disclosure.

As illustrated in FIGS. 29 and 30A, in step S1, a temporary substrate 80 is obtained, and a dielectric layer 81 is formed on temporary substrate 80. Temporary substrate 80 may include, for example, silicon (Si), silicon carbide (SiC), aluminum oxide, quartz, or glass, etc. Dielectric layer 81 may be a silicon oxide layer obtained by oxidizing a silicon substrate, or may be deposited on temporary substrate 80 through a chemical vapor deposition (CVD) process.

Figure 30B:
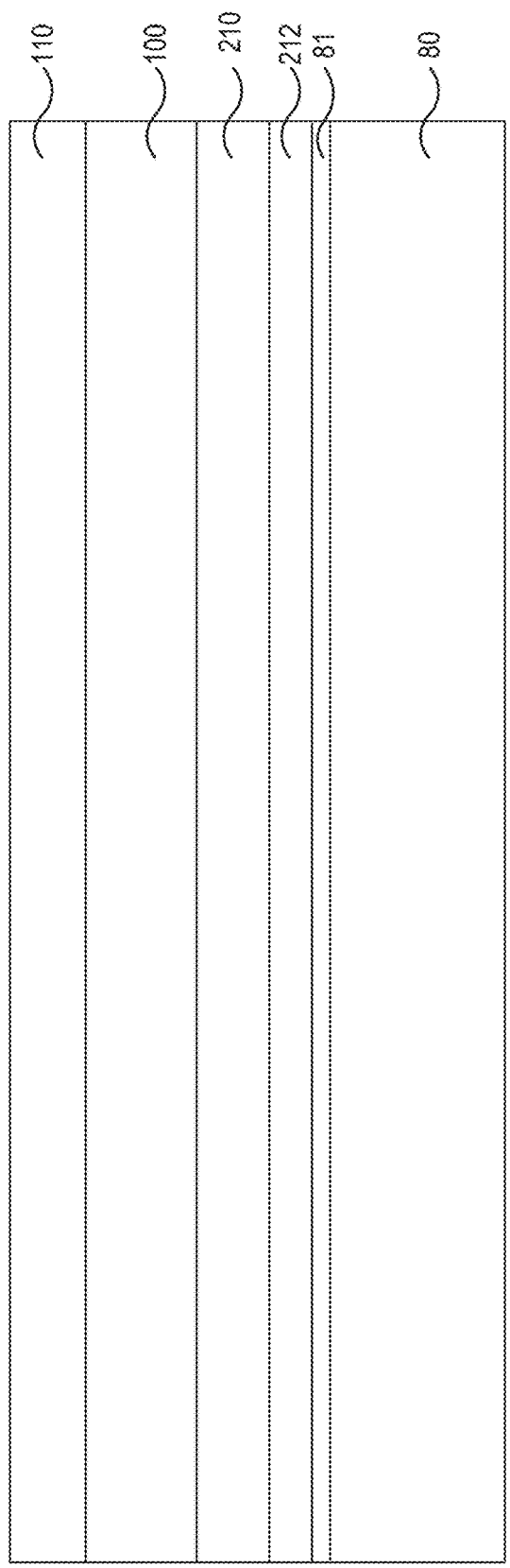

As illustrated in FIGS. 29 and 30B, in step S2, a second passivation layer 212, a second electrode layer 210, a piezoelectric layer 100, and a first electrode layer 110 are sequentially deposited on dielectric layer 81. Second passivation layer 212 may include aluminum nitride (AlN). First and second electrode layers 110 and 210 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, first and second electrode layers 110 and 210 include molybdenum (Mo). Piezoelectric layer 100 may include materials with piezoelectric properties or their stacked combination, such as aluminum nitride (AlN), zinc oxide (ZnO), lithium niobate (LiNbO3), lithium tantalate (LiTaO3), lead zirconate titanate (PZT), barium strontium titanate (BST), etc. When the material of piezoelectric layer 100 is aluminum nitride (AlN), the aluminum nitride itself may also be doped with a certain proportion of rare earth elements, such as scandium, erbium, lanthanum, etc.

Figure 30C:
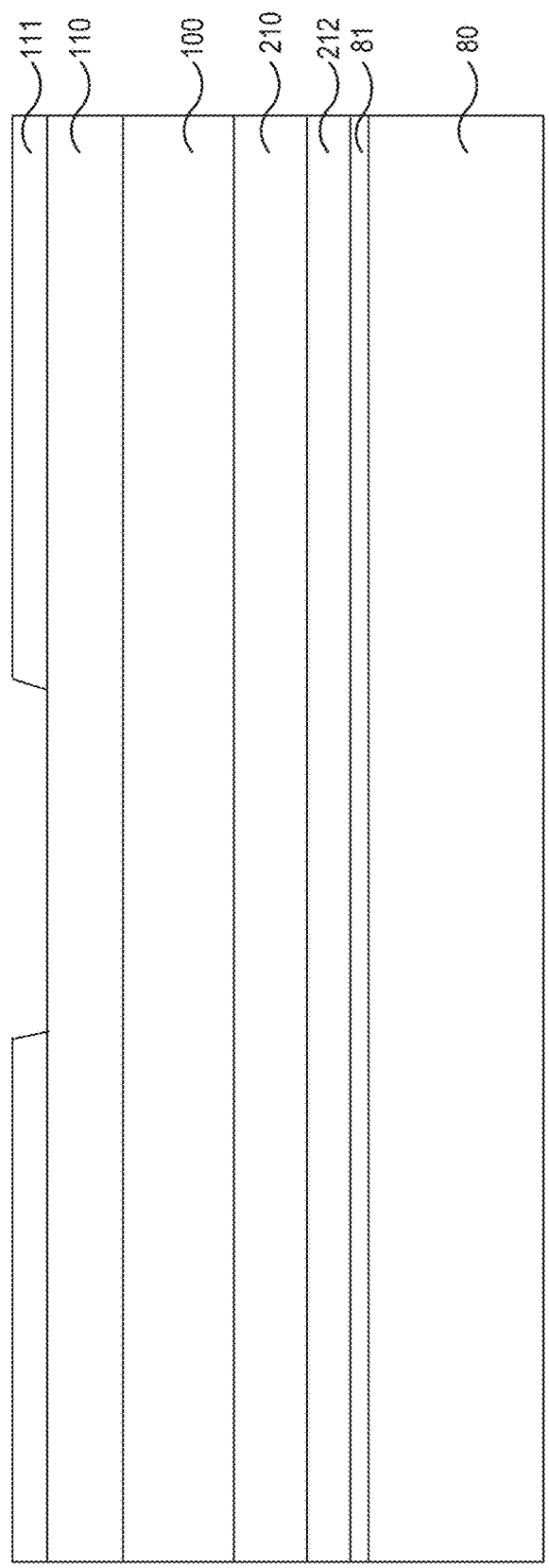

As illustrated in FIGS. 29 and 30C, in step S3, an edge protruding layer 111 is formed on first electrode layer 110, and then edge protruding layer 111 is patterned. Edge protruding layer 111 may include a conductive material, which may be the same as the material of first electrode layer 110 or may be different from the material of first electrode layer 110. The patterning of edge protruding layer 111 may be achieved either by using a lift-off process or by using a patterned etching method.

Figure 30D:
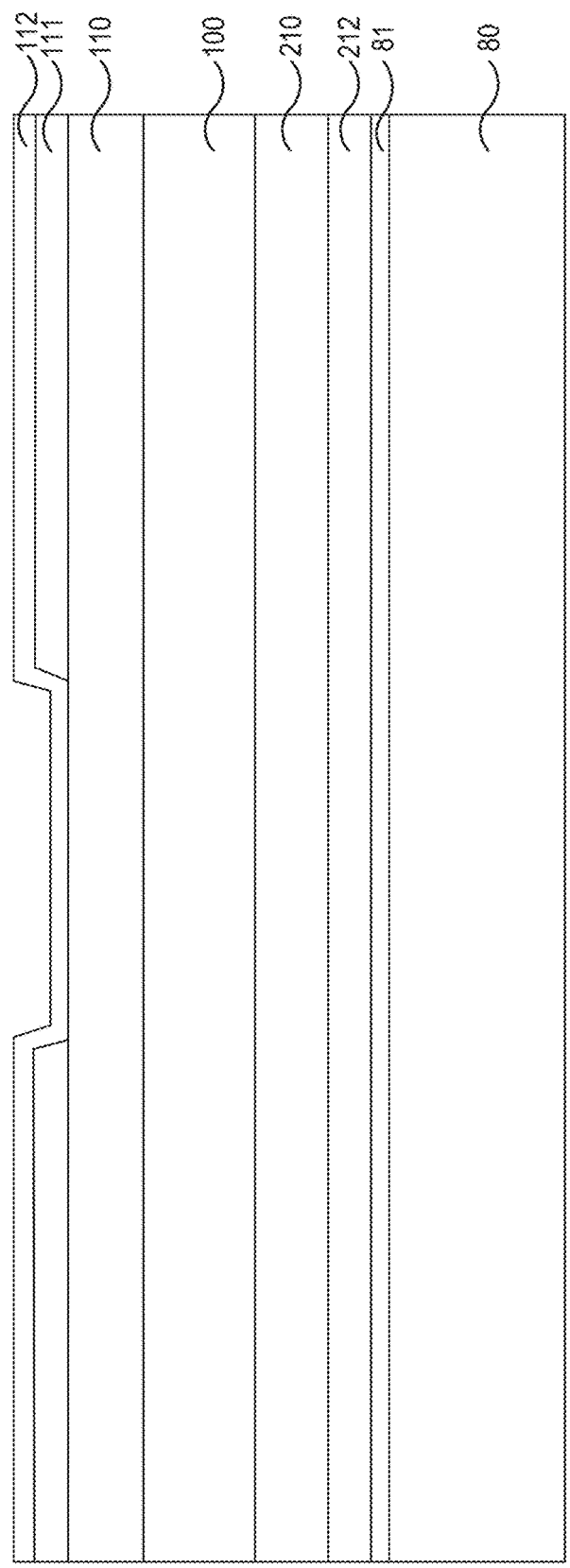

As illustrated in FIGS. 29 and 30D, in step S4, first passivation layer 112 is deposited on the surfaces of first electrode layer 110 and edge protruding layer 111. The material of first passivation layer 112 may be silicon nitride (SiN), aluminum nitride (AlN), Silicon oxide (SiO2), silicon oxynitride (SiNO), or other materials, or a stacked combination of two or more of those materials.

Figure 30E:
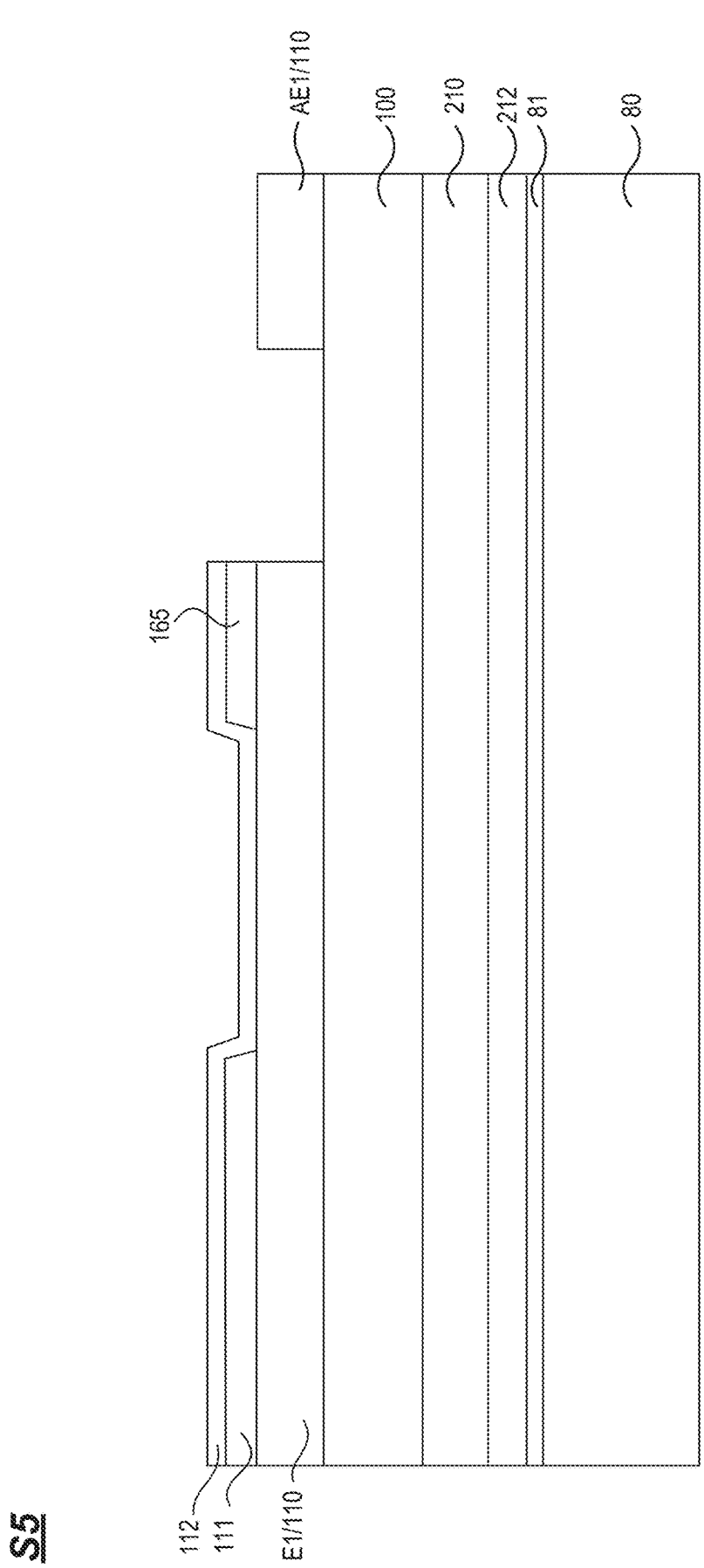

As illustrated in FIGS. 29 and 30E, in step S5, first passivation layer 112, edge protruding layer 111, and first electrode layer 110 are patterned to form patterned first passivation layer 112, patterned edge protruding layer 111, and patterned first electrode layer 110. Patterned first electrode layer 110 includes a first electrode E1 and an additional first electrode AE1 separated from each other. Patterned edge protruding layer 111 only covers first electrode E1, and includes a raised structure 165 at an edge of first electrode E1. Patterned first passivation layer 112 only covers patterned edge protruding layer 111. In other words, additional first electrode AE1 is not covered by edge protruding layer 111 or first passivation layer 112. The patterning of first passivation layer 112, edge protruding layer 111, and first electrode layer 110 may be achieved by etching, such as a plasma etching process, a wet chemical etching process, or a combination of the two.

Figure 30F:
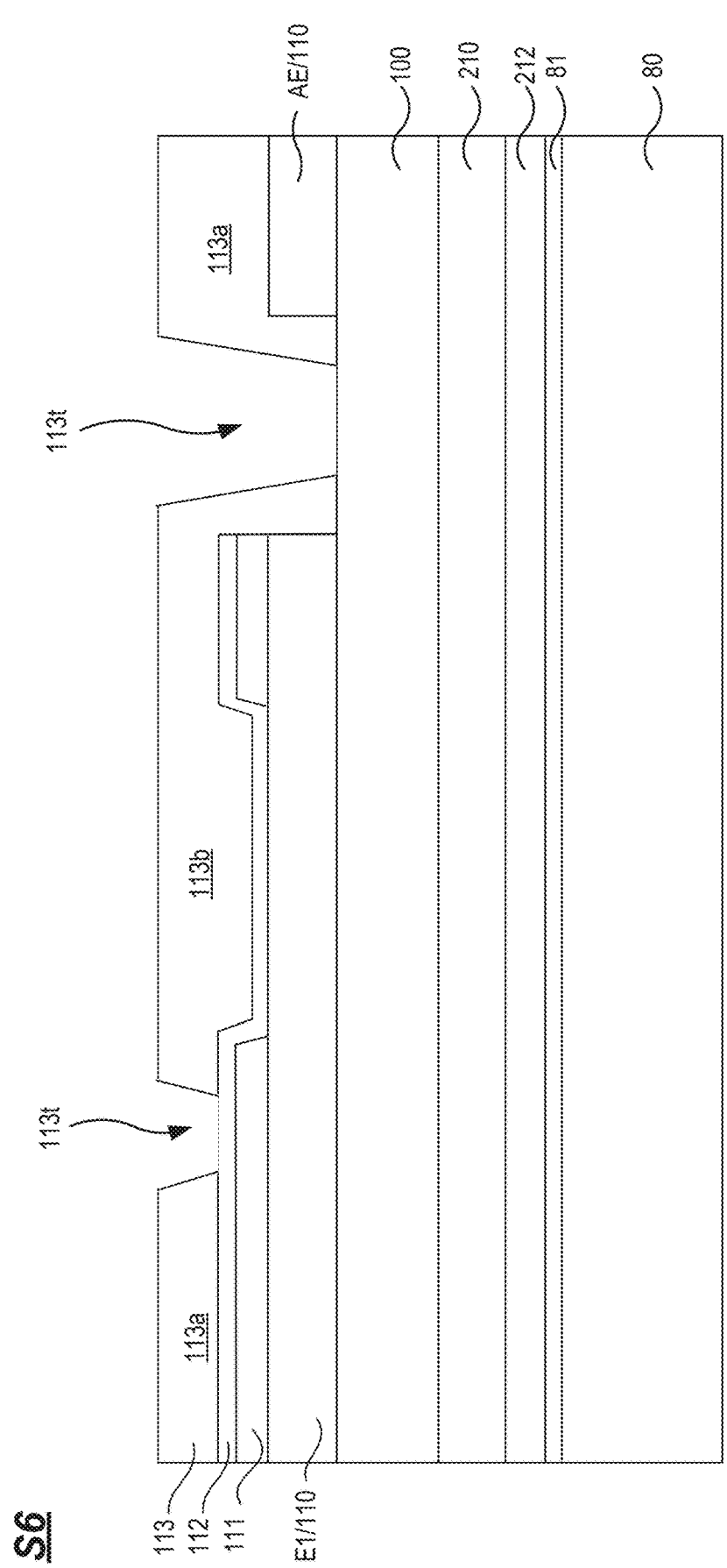

As illustrated in FIGS. 29 and 30F, in step S6, a dielectric layer 113 is deposited on the structure in FIG. 30E, and is patterned by etching to form trench 113t. The material of dielectric layer 113 may be silicon oxide. Trench 113t may have a closed ring-shaped structure, and divides dielectric layer 113 into a supporting dielectric layer 113a and a sacrificial dielectric layer 113b that are spaced apart from each other. Sacrificial dielectric layer 113b will be removed during a subsequent etching and releasing process, thereby forming first cavity RC1. Trench 113t is used to define the range of first cavity RC1. Trench 113t exposes a portion of first passivation layer 112 and a portion of piezoelectric layer 100.

Figure 30G:
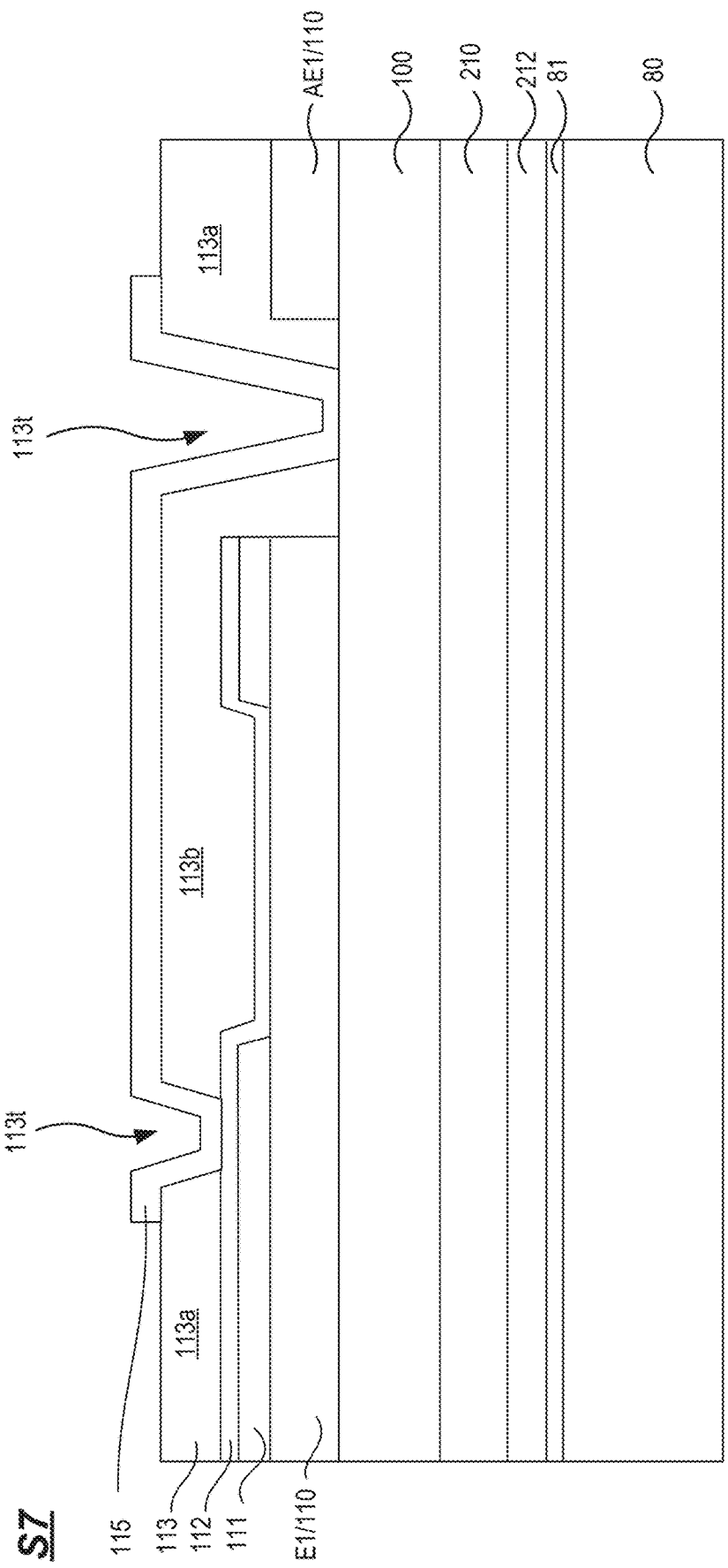

As illustrated in FIGS. 29 and 30G, in step S7, cavity boundary layer 115 is deposited. The material of cavity boundary layer 115 may be silicon (Si), silicon nitride (SiN), aluminum nitride (AlN), or other non-conductive materials, or a stacked combination of two or more of those materials. Cavity boundary layer 115 covers at least sidewalls and a bottom of trench 113t, and sacrificial dielectric layer 113b surrounded by trench 113t, thereby defining a stop boundary during the subsequent etching and releasing process for forming first cavity RC1. Alternatively, in some embodiments, cavity boundary layer 115 covers the entire dielectric layer 113.

Figure 30H:
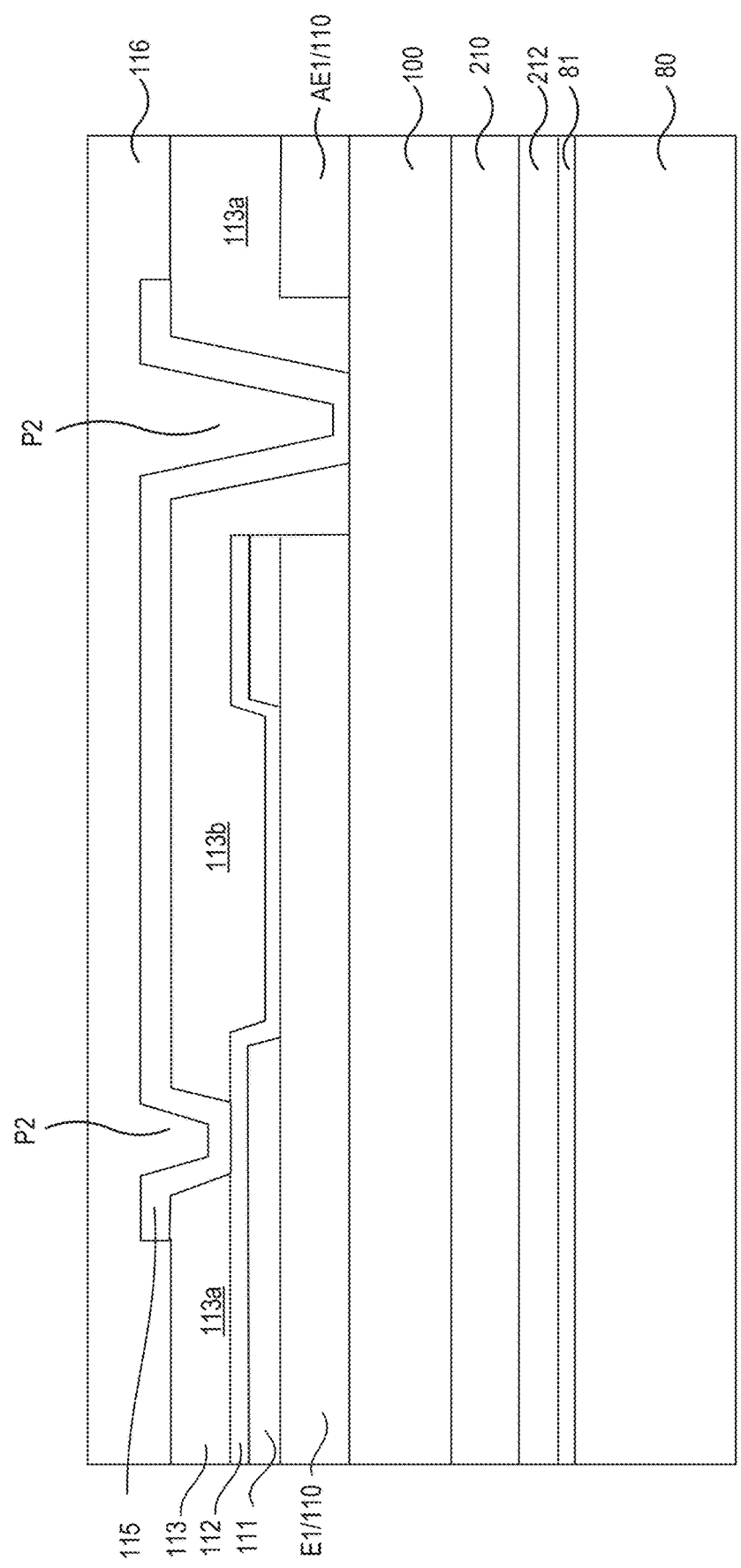

As illustrated in FIGS. 29 and 30H, in step S8, carrier bonding layer 116 is deposited on cavity boundary layer 115, and fills in trench 113t. Then, surface planarization and polishing are performed on carrier bonding layer 116. A portion of carrier bonding layer 116 that fills in trench 113t constitutes bonding protrusion P2 that surrounds sacrificial dielectric layer 113b. Carrier bonding layer 116 is used to bond carrier substrate 120 in a subsequent process. The material of carrier bonding layer 116 may be silicon oxide, silicon nitride, or other materials, or a stacked combination of two or more of these materials. In the present embodiment, silicon oxide is used for carrier bonding layer 116. The surface planarization and polishing may be achieved by a chemical mechanical polishing (CMP) process.

Figure 30I:
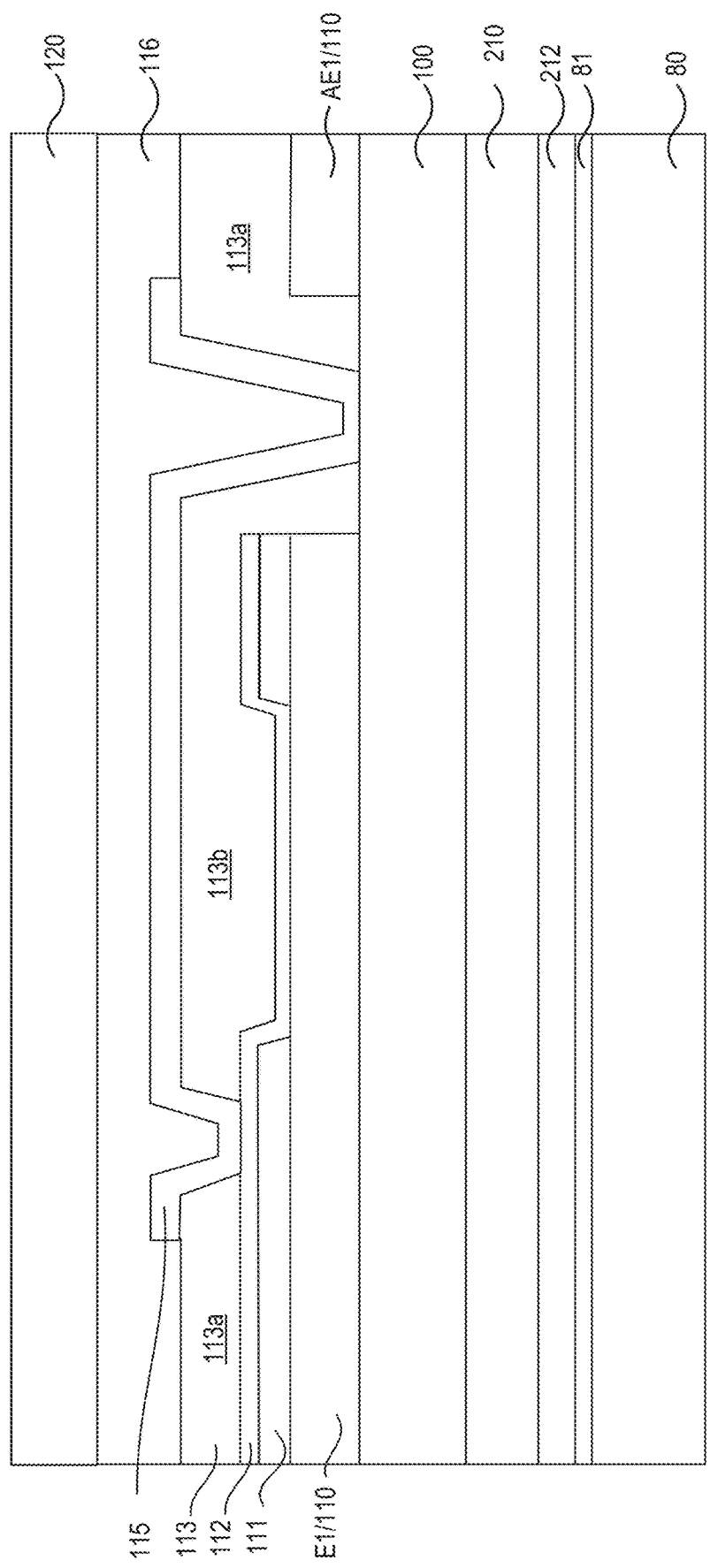

As illustrated in FIGS. 29 and 30I, in step S9, carrier substrate 120 is bonded to carrier bonding layer 116. Carrier substrate 120 may be a cap wafer that includes a material such as silicon (Si), carbon silicon (SiC), aluminum oxide, quartz, glass (SiO$_2$), or sapphire (Al$_2$O$_3$).

Figure 30J:
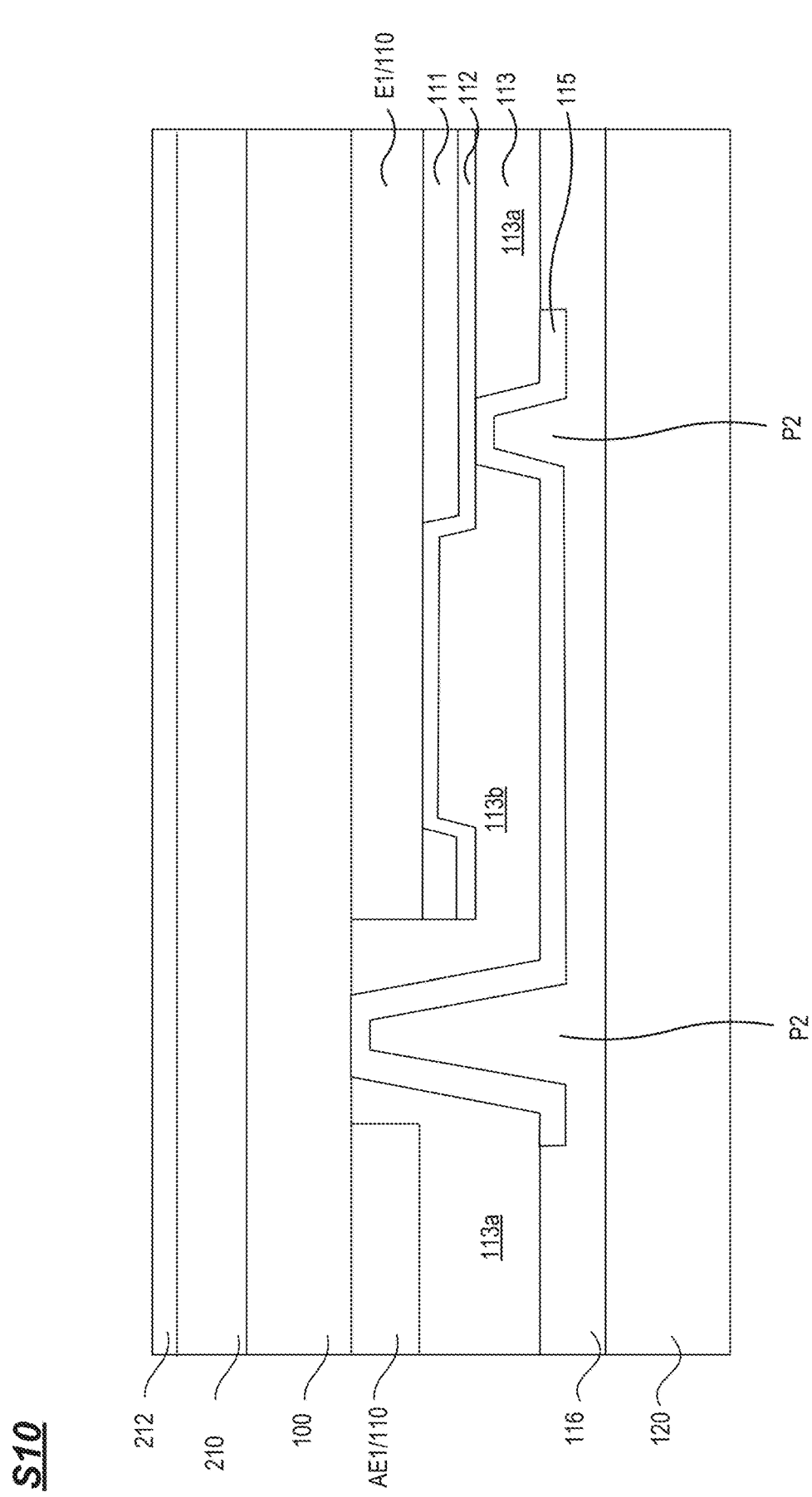

As illustrated in FIGS. 29 and 30J, in step S10, the structure illustrated in FIG. 30I is flipped over, and temporary substrate 80 and dielectric layer 81 are removed. The removing of temporary substrate 80 may be performed by a grinding process, a plasma dry etching process, a wet chemical etching process, or a combination thereof. In the present embodiment, temporary substrate 80 is made of silicon material, and is removed by a combination of grinding and wet chemical etching, or a combination of grinding and plasma dry etching. Dielectric layer 81 may be removed by plasma dry etching, wet chemical etching, or a combination of the two.

Figure 30K:
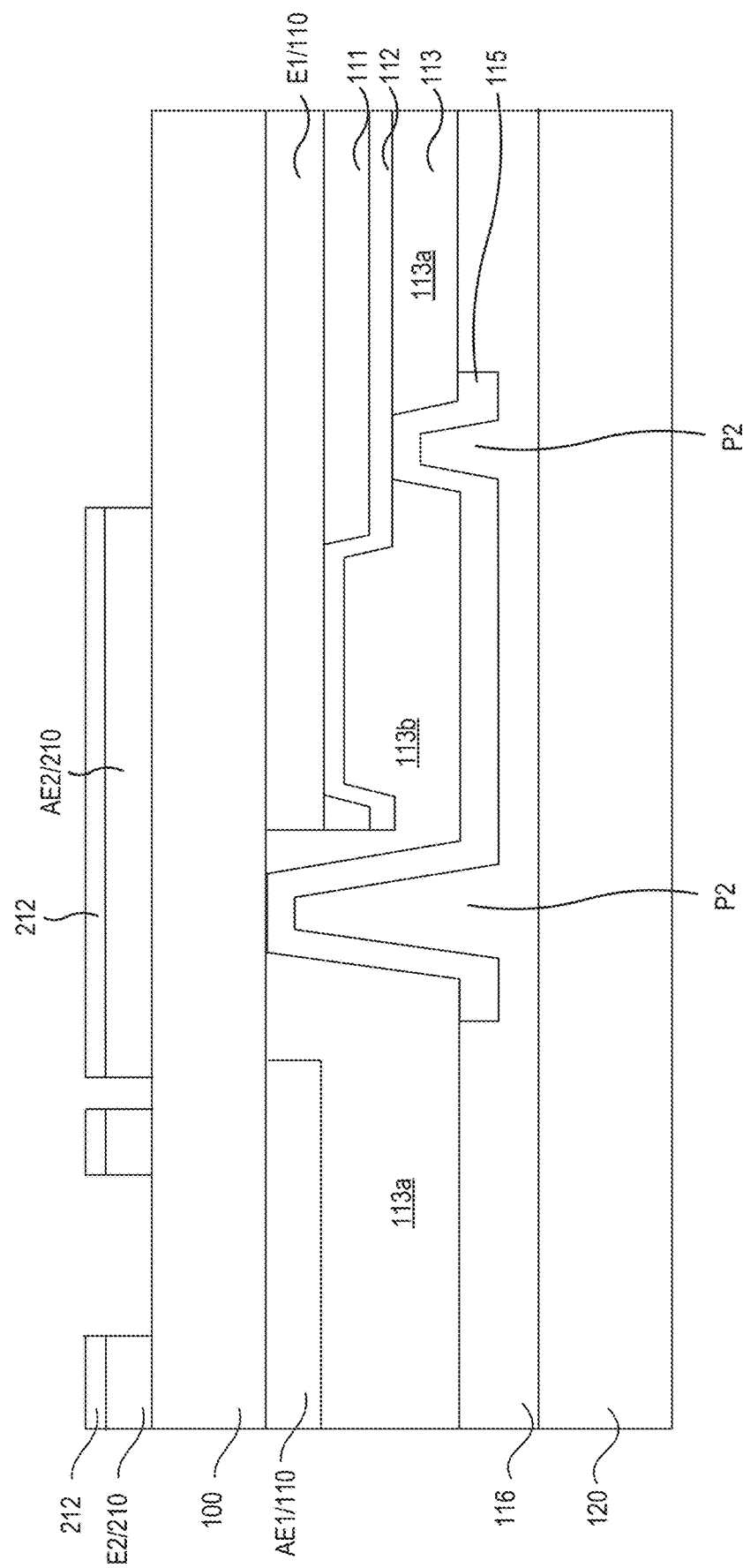

As illustrated in FIGS. 29 and 30K, in step S11, second passivation layer 212 and second electrode layer 210 are patterned by etching, to form patterned second passivation layer 212 and patterned second electrode layer 210. Patterned second electrode layer 210 includes second electrode E2 and additional second electrode AE2. The etching process may be a plasma etching process, a wet chemical etching process, or a combination of the two.

Figure 30L:
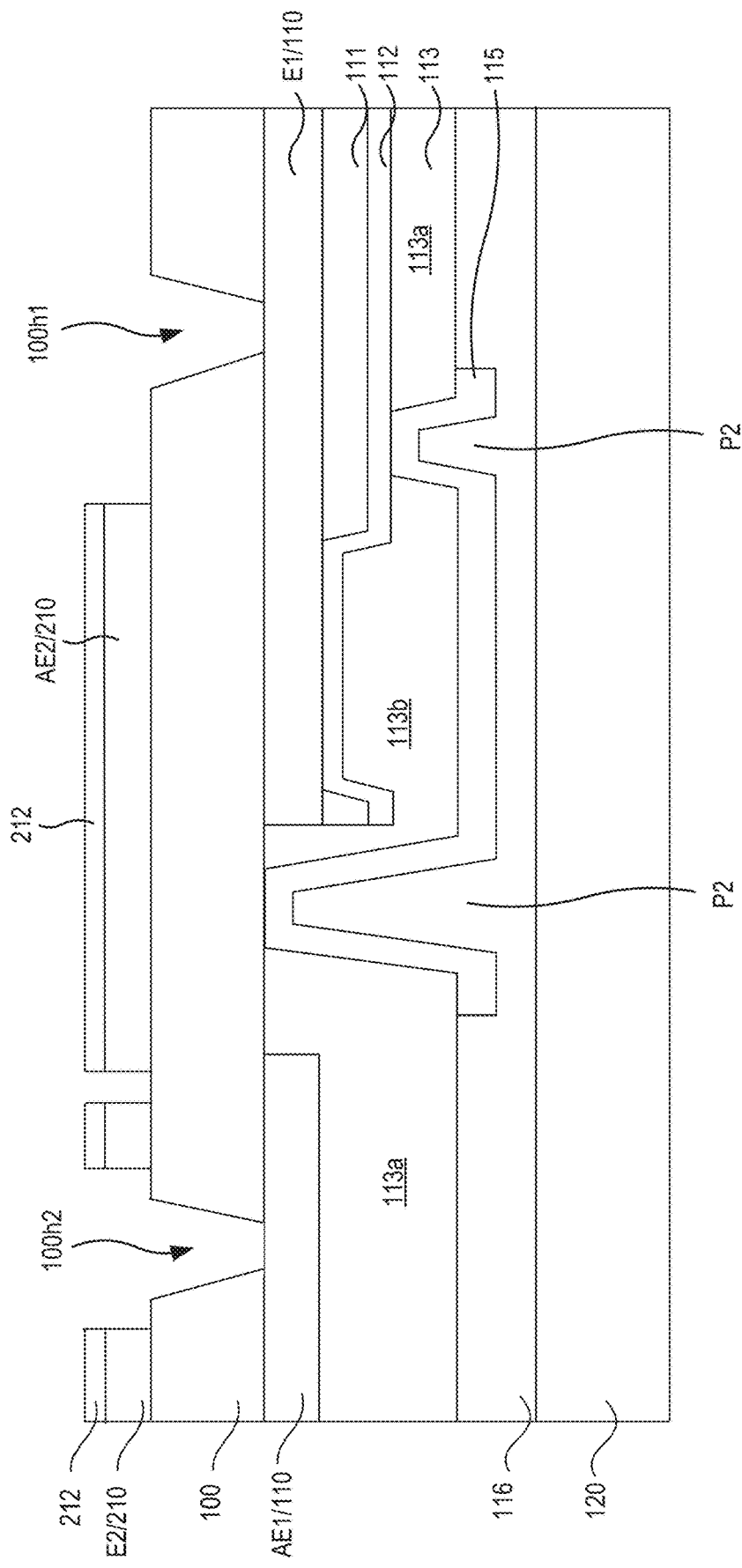

As illustrated in FIGS. 29 and 30L, in step S12, piezoelectric layer 100 is etched to form piezoelectric via hole 100h1 that exposes a portion of first electrode E1, and additional piezoelectric via hole 100h2 that exposes a portion of additional first electrode AE1.

Figure 30M:
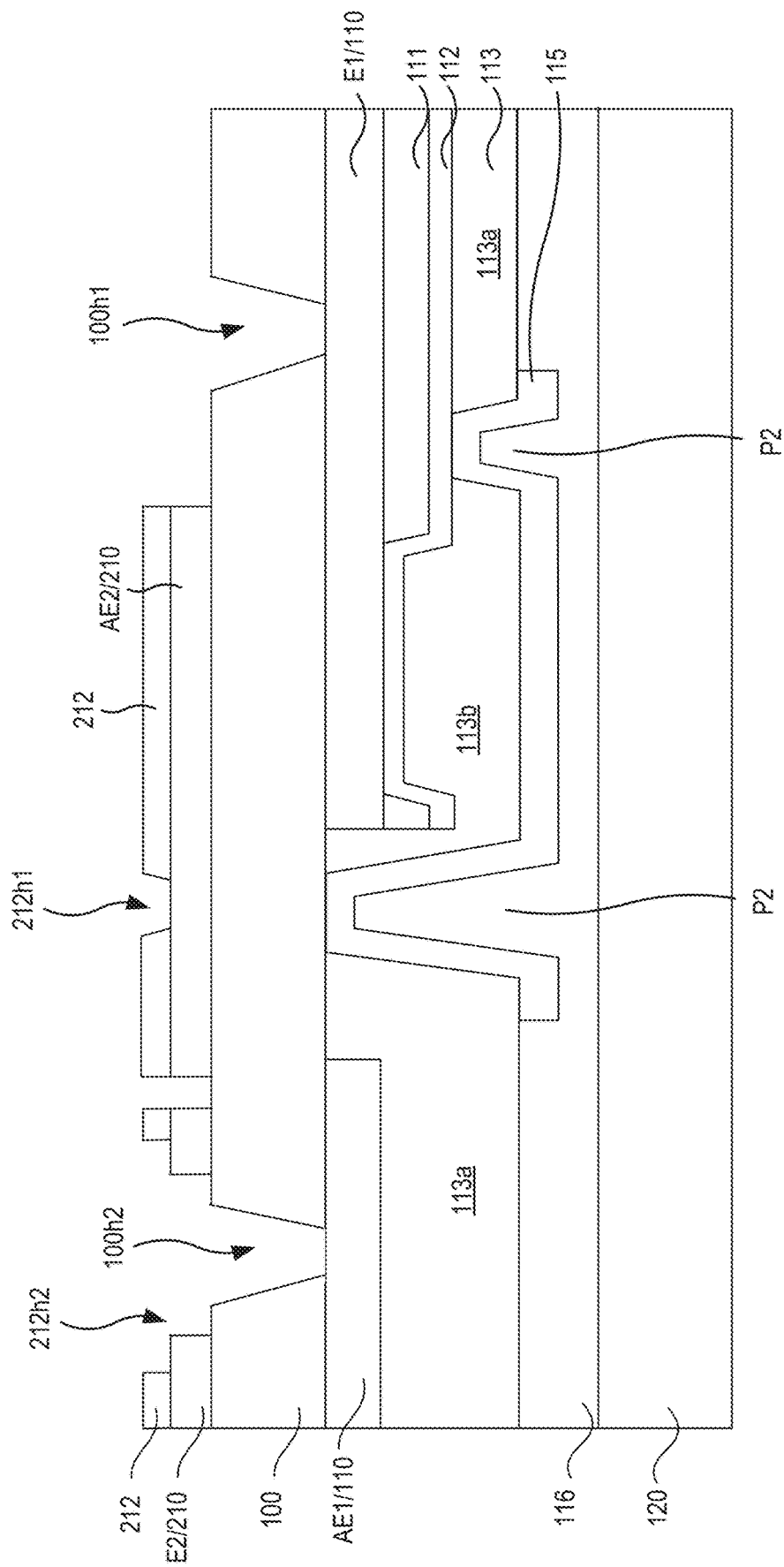

As illustrated in FIGS. 29 and 30M, in step S13, second passivation layer 212 is etched to form a first passivation opening 212h1 that exposes a portion of additional second electrode AE2, and a second passivation opening 212h2 that is connected to additional piezoelectric via hole 100h2 that exposes a portion of second electrode E2.

Figure 30N:
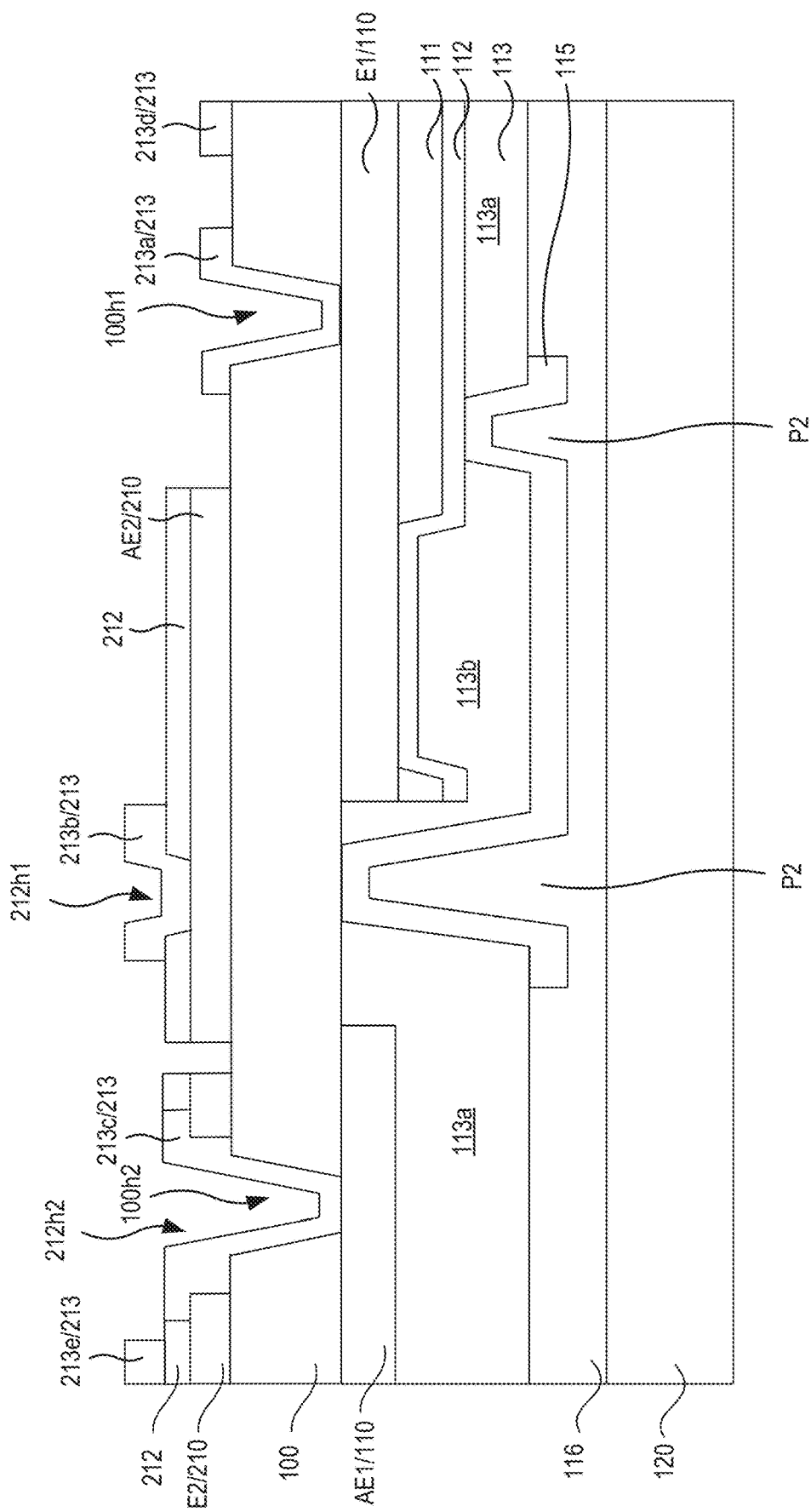

As illustrated in FIGS. 29 and 30N, in step S14, a conductive layer is formed on the structure illustrated in FIG. 30M by vapor deposition. Then, the conductive layer is patterned by, for example, lift-off, to form first to fifth conductive pads 213a, 213b, 213c, 213d, and 213e. Fourth conductive pad 213d and fifth conductive pad 213e are formed on the edge of the structure of FIG. 30M. First conductive pad 213a is formed on piezoelectric layer 100 and in piezoelectric via hole 100h1, and contacts first electrode E1 via piezoelectric via hole 100h1. Second conductive pad 213b is formed on second passivation layer 212 and in first passivation opening 212h1, and contacts additional second electrode AE2 via first passivation opening 212h1. Third conductive pad 213c is formed on second passivation layer 212 and in second passivation opening 212h2 and additional piezoelectric via hole 100h2, and contacts second electrode E2 and additional first electrode AE1. Therefore, second electrode E2 is electrically connected to additional first electrode AE1 via third conductive pad 213c. First to fifth conductive pads 213a, 213b, 213c, 213d, and 213e may include a metal material, such as gold (Au).

Figure 30O:
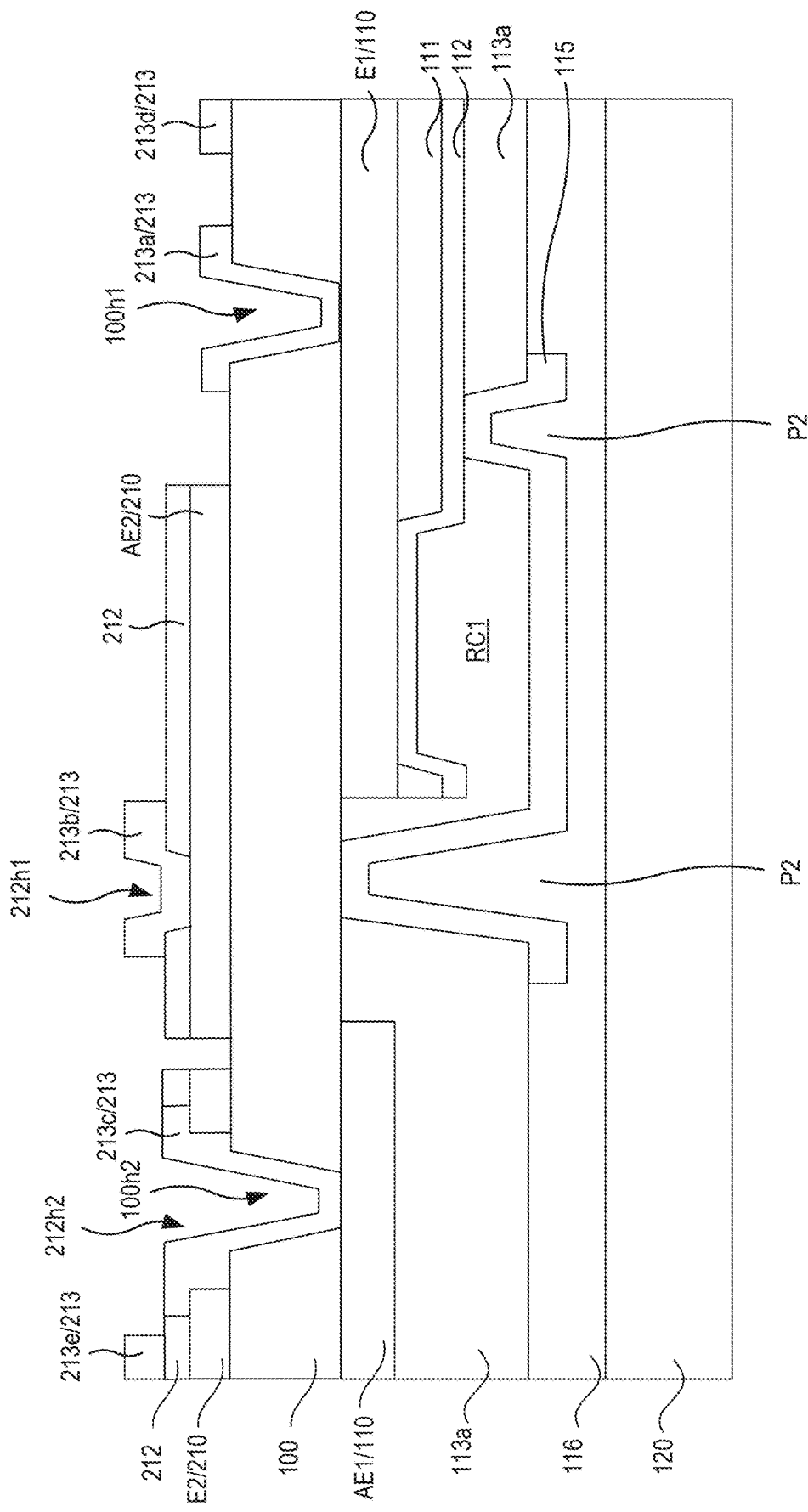

As illustrated in FIGS. 29 and 30O, in step S15, sacrificial dielectric layer 113b is etched and released via a releasing hole (not shown) formed in piezoelectric layer 100, to form first cavity RC1. In the present embodiment, dielectric layer 113 is made from silicon oxide, and the etching and releasing process of sacrificial dielectric layer 113b may be performed by using hydrofluoric acid solution wet etching, buffered oxide etchant (BOE) solution wet etching, or hydrofluoric acid vapor corrosion, or a combination of these processes. The etching of sacrificial dielectric layer 113b stops at cavity boundary layer 115.

Figure 30P:
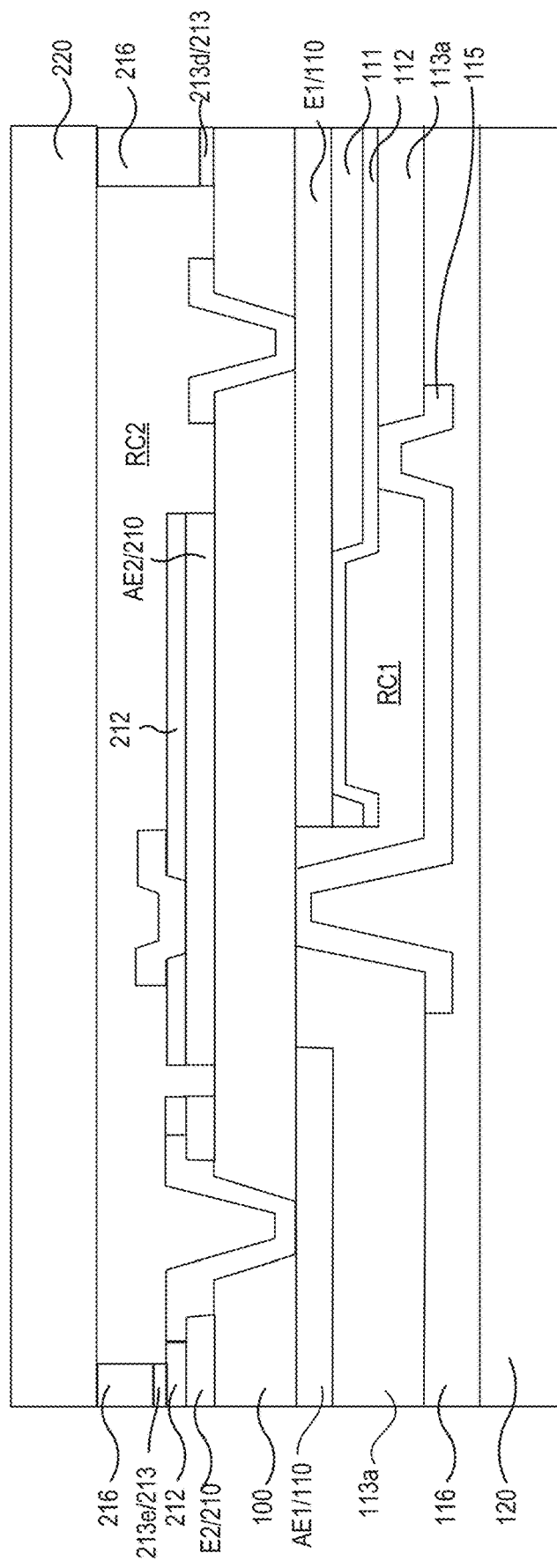

As illustrated in FIGS. 29 and 30P, in step S16, cover substrate 220 is obtained. Then, cover bonding layer 216 is formed on cover substrate 220, and is patterned to leave a space for second cavity RC2. Afterwards, cover substrate 220 formed with cover bonding layer 216 is bonded to the structure illustrated in FIG. 30O via cover bonding layer 216 and fourth and fifth conductive pads 213d and 213e formed on the edge of the structure. As a result, second cavity RC2 is formed above piezoelectric layer 100 and is covered by cover substrate 220. Second cavity RC2 is surrounded by cover bonding layer 216 and fourth and fifth conductive pad 213d and 213e.

Figure 30Q:
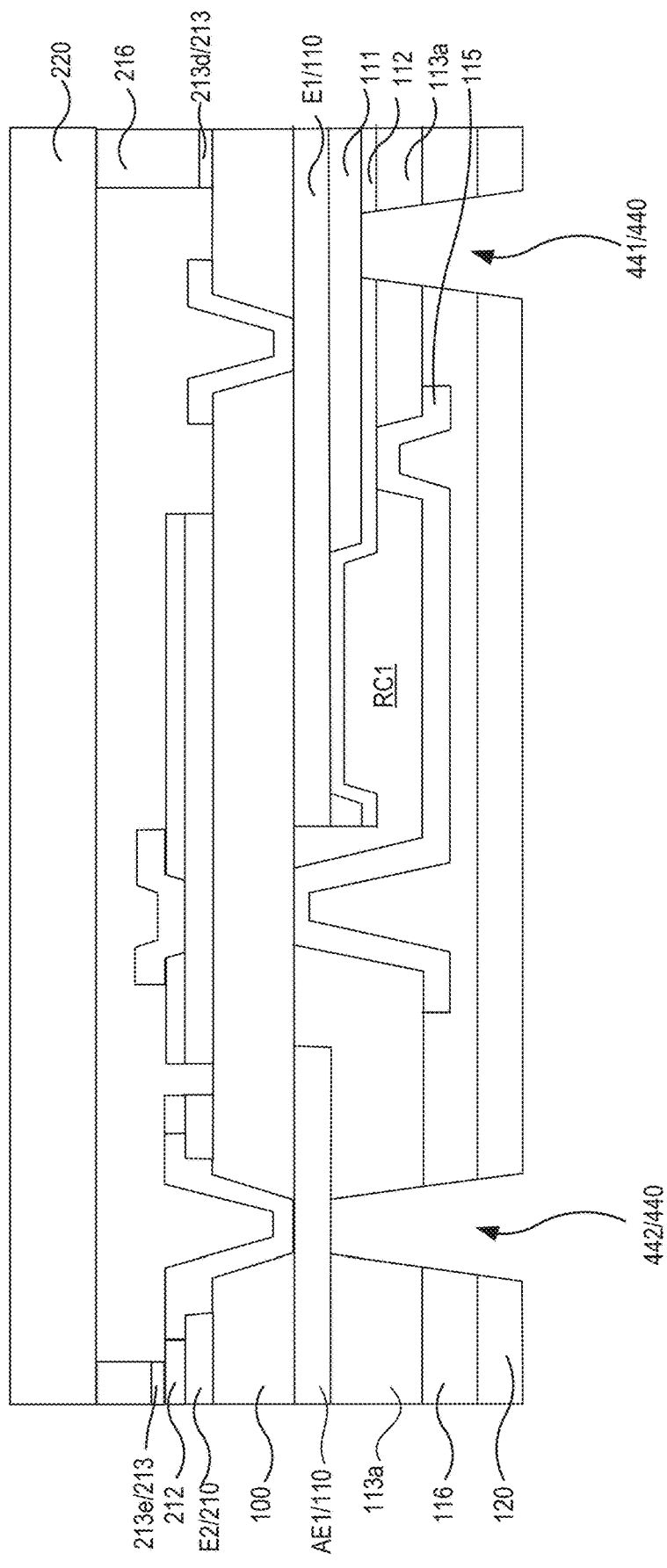

As illustrated in FIGS. 29 and 30Q, in step S17, carrier substrate 120, carrier bonding layer 116, supporting dielectric layer 113a, and first passivation layer 112 are etched to form first connection via hole 441 and second connection via hole 442. First connection via hole 441 extends through carrier substrate 120, carrier bonding layer 116, supporting dielectric layer 113a, and passivation layer 112, and exposes a portion of the bottom surface of first electrode E1. Second connection via hole 442 extends through carrier substrate 120, carrier bonding layer 116, and supporting dielectric layer 113a, and exposes a portion of a bottom surface of additional first electrode AE1.

Figure 30R:
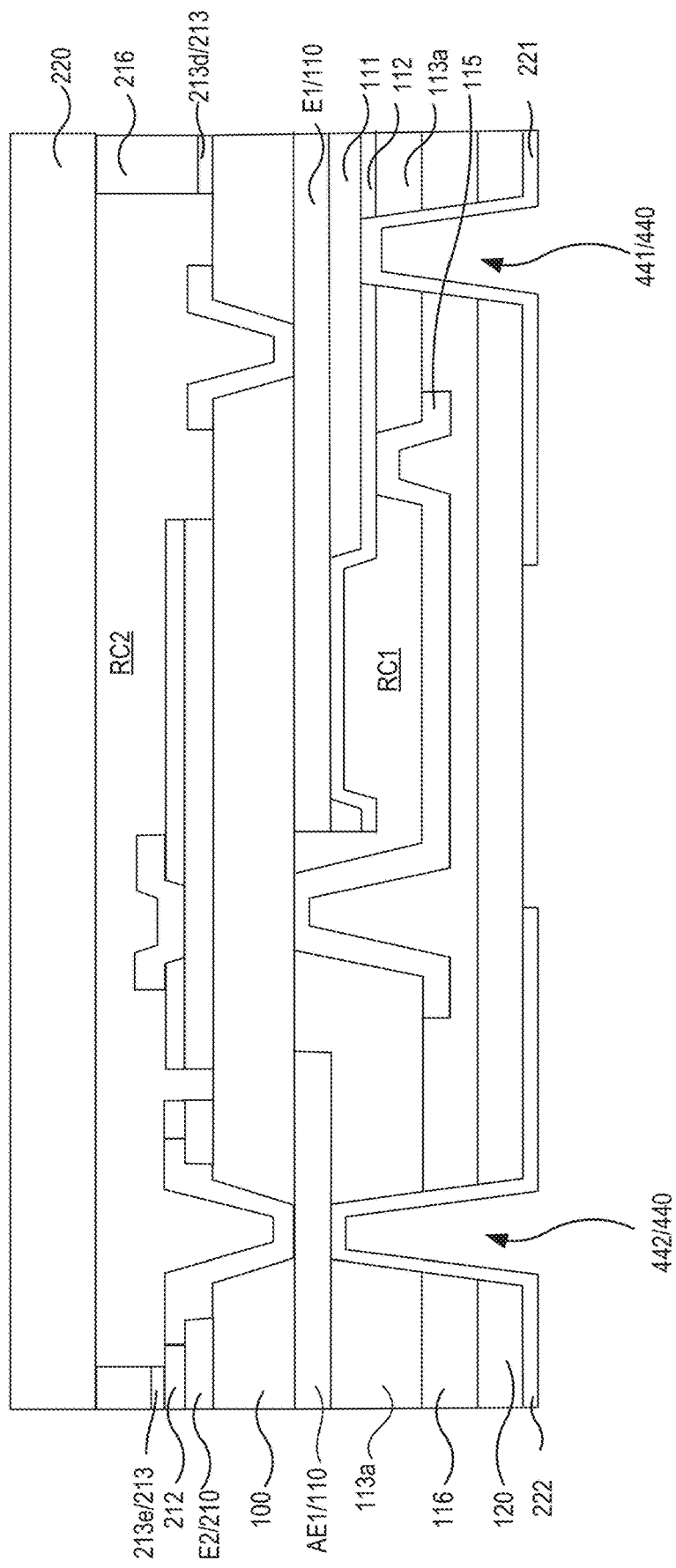

As illustrated in FIGS. 29 and 30R, in step S18, a redistribution layer is formed on the bottom surface of the structure of FIG. 30Q, and then the redistribution layer is patterned to form a first redistribution layer portion 221 in first connection via hole 441 and a second redistribution layer portion 332 in second connection via hole 442.

Figure 30S:
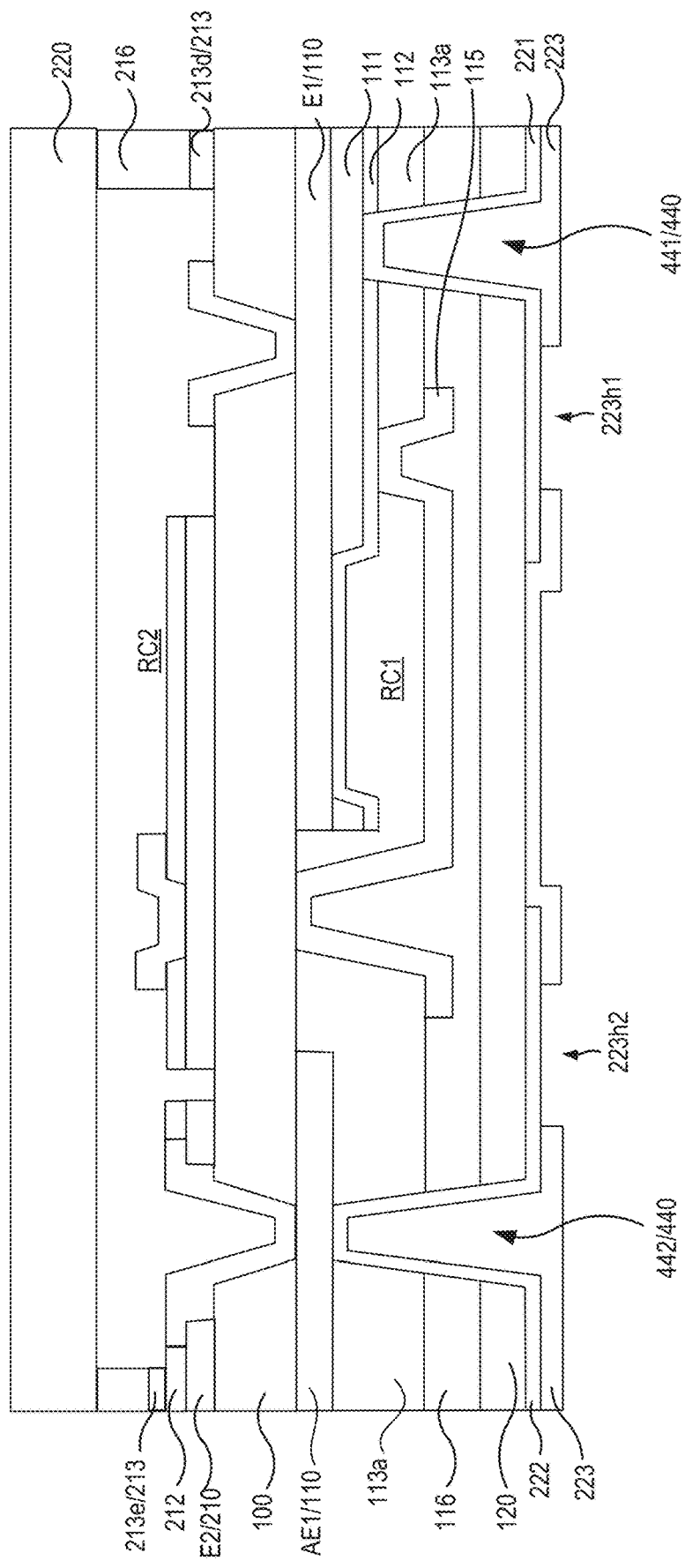
Figure 30T:
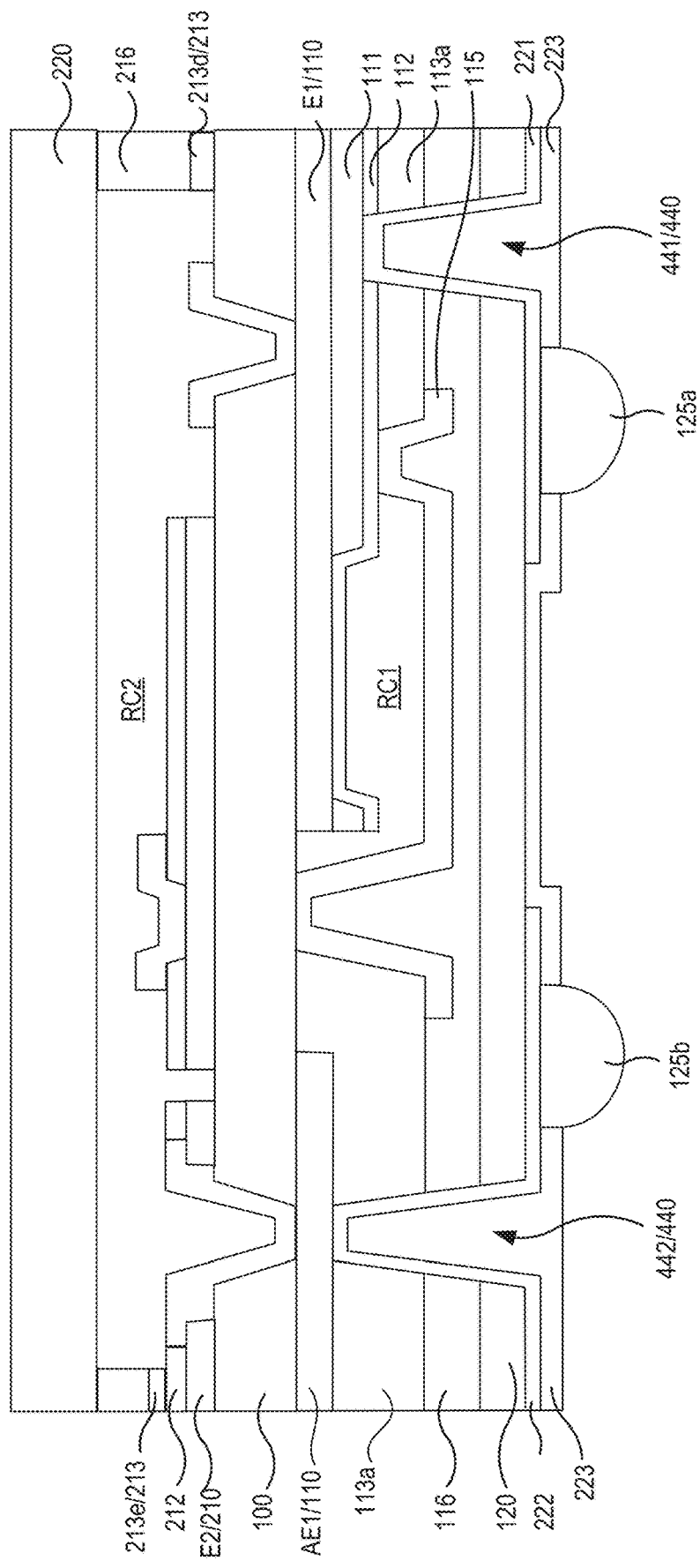

As illustrated in FIGS. 29 and 30S, in step S19, a bottom passivation layer 223 is formed on the bottom surface of the structure of FIG. 30R, and filling in first connection via hole 441 and second connection via hole 442. Bottom passivation layer 223 is then patterned to form a first bottom passivation opening 223h1 exposing a portion of first redistribution layer portion 221 and a second bottom passivation opening 223h2 exposing a portion of second redistribution layer portion 332. First bottom passivation opening 223h1 does not vertically align with first connection via hole 441. Second bottom passivation opening 223h2 does not vertically align with second connection via hole 442.

As illustrated in FIGS. 29 and 30T, in step S20, first solder bump 125a is formed in first bottom passivation opening 223h1, and second solder bump 125b is formed in second bottom passivation opening 223h2. As a result, BAW resonator 1000 illustrated in FIG. 28 is fabricated. First redistribution layer portion 221 and first solder bump 125a together constitute first conductive connector C1. Second redistribution layer portion 332 and second solder bump 125b together constitute second conductive connector C2.

In the embodiments of the present disclosure, through disposing the conductive connectors and the cover structure of the resonator on different sides of the piezoelectric layer, problems such as delamination, bump fracture, etc., caused by the cover bonding layer can be avoided or reduced, and hence the device reliability of the resonator and the filter can be improved. In addition, the first and second conductive pads located on the second side of the piezoelectric layer are only used as test pads, so it is unnecessary to consider their influence on the resistance, and the thickness of these conductive pads can be disposed to be relatively small, thereby reducing the cost. On the other hand, as compared with the resonator in which the conductive bumps are electrically connected to the corresponding electrodes by redistribution layer(s), in the embodiments of the disclosure, the conductive bumps are directly electrically connected to the corresponding electrodes through the conductive vias, thus the manufacturing process of the resonator in the embodiments of the present disclosure can reduce the number of the masks, thereby simplifying the process and saving the cost.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

The invention claimed is:

1. A bulk acoustic wave resonator, comprising:
a piezoelectric layer, having a first side and a second side opposite to each other in a first direction;
a first electrode layer, disposed on the first side of the piezoelectric layer and comprising a first electrode and an additional electrode electrically isolated from each other;
a second electrode layer, disposed on the second side of the piezoelectric layer and comprising a second electrode;
one or more conductive pads, disposed on the second side of the piezoelectric layer and at least comprising an interconnection pad, wherein the interconnection pad is electrically connected to the second electrode and extends through the second electrode and the piezoelectric layer to be electrically connected to the additional electrode;
a carrier structure, disposed on the first side of the piezoelectric layer and a first side of the first electrode layer away from the second electrode layer, wherein a first cavity is disposed between the carrier structure and the piezoelectric layer, and a portion of the first electrode is located in the first cavity;
a cover structure, disposed on the second side of the piezoelectric layer and comprising a cover bonding layer and a cover substrate, wherein the cover bonding layer is disposed between the cover substrate and the piezoelectric layer in the first direction, wherein a second cavity is disposed between the cover structure and the piezoelectric layer, and a portion of the second electrode layer is located in the second cavity; and
a first conductive connector and a second conductive connector, disposed on the first side of the piezoelectric layer away from the cover structure, wherein the first conductive connector extends through the carrier structure to be electrically connected to the first electrode, wherein the second conductive connector extends through the carrier structure to be electrically connected to the additional electrode, and further electrically connected to the second electrode through the additional electrode and the interconnection pad.

2. The bulk acoustic wave resonator of claim 1, wherein
the one or more conductive pads include a bonding pad, and
the cover substrate is bonded with the piezoelectric layer by the bonding pad and the cover bonding layer.

3. The bulk acoustic wave resonator of claim 2, wherein the cover bonding layer and the one or more conductive pads include a same material.

4. The bulk acoustic wave resonator of claim 3, wherein the cover bonding layer and the one or more conductive pads include gold (Au).

5. The bulk acoustic wave resonator of claim 2, wherein
the cover bonding layer includes organic materials, and
the one or more conductive pads include conductive materials.

6. The bulk acoustic wave resonator of claim 5, wherein
the cover bonding layer includes dry film, and
the one or more conductive pads include metal.

7. The bulk acoustic wave resonator of claim 1, wherein the cover substrate includes silicon (Si).

8. The bulk acoustic wave resonator of claim 1, wherein the carrier structure comprises:
a carrier substrate;
a supporting dielectric layer disposed between the carrier substrate and the piezoelectric layer; and
a carrier bonding layer disposed between the carrier substrate and the supporting dielectric layer.

9. The bulk acoustic wave resonator of claim 8, wherein the first cavity is formed in the supporting dielectric layer.

10. The bulk acoustic wave resonator of claim 9, wherein
the carrier bonding layer comprises a bonding protrusion protruding towards the piezoelectric layer and surrounding the first cavity, and
the bulk acoustic wave resonator further comprises a cavity boundary layer overlying at least the bonding protrusion.

11. The bulk acoustic wave resonator of claim 10, wherein the cavity boundary layer overlays the bonding protrusion and a portion of the carrier bonding layer surrounded by the bonding protrusion.

12. The bulk acoustic wave resonator of claim 10, wherein the cavity boundary layer overlays the entire carrier bonding layer.

13. The bulk acoustic wave resonator of claim 10, wherein the cavity boundary layer contacts at least one of the piezoelectric layer or the first electrode.

14. The bulk acoustic wave resonator of claim 9, wherein an edge of the first electrode is located inside the first cavity.

15. The bulk acoustic wave resonator of claim 1, wherein
the first conductive connector includes a first conductive bump disposed below a bottom surface of the carrier structure, and electrically connected to, the first electrode, and
the second conductive connector includes a second conductive bump disposed below the bottom surface of the carrier structure, and electrically connected to, the second electrode.

16. The bulk acoustic wave resonator of claim 15, further comprising:
a first connection via hole extending through the carrier structure, and exposing a portion of the first electrode; and
a second connection via hole extending through the carrier structure, and exposing the additional electrode.

17. The bulk acoustic wave resonator of claim 16, wherein
the first conductive connector includes a first redistribution layer portion disposed below the bottom surface of the carrier structure and within the first connection via hole and contacting the exposed portion of the first electrode, and
the first conductive connector includes a second redistribution layer portion disposed below the bottom surface of the carrier structure and within the second connection via hole and contacting the exposed portion of the additional electrode.

18. The bulk acoustic wave resonator of claim 17, wherein
the first conductive bump is electrically connected to the first redistribution layer portion, and
the second conductive bump is electrically connected to the second redistribution layer portion.

19. The bulk acoustic wave resonator of claim 15, wherein
the piezoelectric layer includes an additional piezoelectric via hole exposing a portion of the additional electrode, and
the interconnection pad is disposed in the additional piezoelectric via hole and electrically connecting the second electrode and the additional electrode.

20. The bulk acoustic wave resonator of claim 2, wherein the second cavity is surrounded by the cover bonding layer and the bonding pad.

* * * * *